United States Patent
Naito et al.

(10) Patent No.: US 11,950,480 B2
(45) Date of Patent: *Apr. 2, 2024

(54) COLOR CORRECTION FILTER FOR WHITE ORGANIC ELECTROLUMINESCENT LIGHT SOURCE, AND ORGANIC ELECTROLUMINESCENT DISPLAY DEVICE

(71) Applicant: FUJIFILM Corporation, Tokyo (JP)

(72) Inventors: Yu Naito, Kanagawa (JP); Nobutaka Fukagawa, Kanagawa (JP); Daisuke Sasaki, Kanagawa (JP); Hiroki Kuwahara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 819 days.

This patent is subject to a terminal disclaimer.

(21) Appl. No.: 17/025,079

(22) Filed: Sep. 18, 2020

(65) Prior Publication Data

US 2021/0005673 A1    Jan. 7, 2021

Related U.S. Application Data

(63) Continuation of application No. PCT/JP2019/013360, filed on Mar. 27, 2019.

(30) Foreign Application Priority Data

Mar. 29, 2018 (JP) .................. 2018-064746

(51) Int. Cl.
| | |
|---|---|
| H10K 59/38 | (2023.01) |
| G02B 5/22 | (2006.01) |
| H05B 33/20 | (2006.01) |
| H10K 50/11 | (2023.01) |
| H10K 101/40 | (2023.01) |

(52) U.S. Cl.
CPC ............... *H10K 59/38* (2023.02); *G02B 5/22* (2013.01); *H05B 33/20* (2013.01); *H10K 50/11* (2023.02); *H10K 2101/40* (2023.02)

(58) Field of Classification Search
CPC .... H10K 59/38; H10K 50/11; H10K 2101/40; G02B 5/22; H05B 33/20
See application file for complete search history.

(56) References Cited

U.S. PATENT DOCUMENTS

| | | |
|---|---|---|
| 2006/0121392 A1 | 6/2006 | Nakatsugawa |
| 2012/0197026 A1 | 8/2012 | Maeda et al. |
| 2014/0061505 A1 | 3/2014 | Steppel et al. |
| 2016/0146986 A1 | 5/2016 | Muro et al. |
| 2020/0217993 A1 | 7/2020 | Fukagawa et al. |

FOREIGN PATENT DOCUMENTS

| | | | |
|---|---|---|---|
| CN | 1790069 A | | 6/2006 |
| CN | 104395788 A | | 3/2015 |
| CN | 111108418 A | | 5/2020 |
| JP | 2003-029376 A | | 1/2003 |
| JP | 2008-298820 A | | 12/2008 |
| JP | 2008298820 A | * | 12/2008 |
| JP | 2009-053491 A | | 3/2009 |
| JP | 2011-144280 A | | 7/2011 |
| JP | 2014-130763 A | | 7/2014 |
| JP | 2016-075738 A | | 5/2016 |
| JP | 2016075738 A | * | 5/2016 |
| KR | 10-2016-0025607 A | | 3/2016 |
| TW | 201710714 A | | 3/2017 |
| WO | 2017/014272 A1 | | 1/2017 |
| WO | 2018/190211 A1 | | 10/2018 |
| WO | 2019/066043 A1 | | 4/2019 |

OTHER PUBLICATIONS

Office Action, issued by the Korean Intellectual Property Office dated Mar. 8, 2022, in connection with Korean Patent Application No. 10-2020-7027138.
Office Action, issued by the State Intellectual Property Office dated Oct. 19, 2021, in connection with Chinese Patent Application No. 201980022037.5.
Office Action, issued by the Japanese Patent Office dated Nov. 17, 2020, in connection with Japanese Patent Application No. 2020-509252.
International Search Report issued in connection with International Patent Application No. PCT/JP2019/013360 dated Jun. 18, 2019.
Written Opinion of the International Searching Authority issued in connection with International Patent Application No. PCT/JP2019/013360 dated Jun. 18, 2019.
International Preliminary Report on Patentability issued in connection with International Patent Application No. PCT/JP2019/013360 dated Sep. 29, 2020.
Office Action, issued by the State Intellectual Property Office dated May 26, 2022, in connection with Chinese Patent Application No. 201980022037.5.
Office Action, issued by the Japanese Patent Office dated Feb. 2, 2021, in connection with Japanese Patent Application No. 2020-509252.

* cited by examiner

*Primary Examiner* — Nicholas J Tobergte
(74) *Attorney, Agent, or Firm* — Edwards Neils LLC; Jean C. Edwards, Esq.

(57) ABSTRACT

There are provided a color correction filter for a white organic electroluminescent light source including a resin and 0.1 part by mass or more of a coloring agent having an absorption maximum wavelength in a range of 560 to 620 nm or 460 to 520 nm with respect to 100 parts by mass of the resin, and having a moisture content of 0.5% by mass or less, and an organic EL display device having this filter.

5 Claims, No Drawings

COLOR CORRECTION FILTER FOR WHITE ORGANIC ELECTROLUMINESCENT LIGHT SOURCE, AND ORGANIC ELECTROLUMINESCENT DISPLAY DEVICE

CROSS-REFERENCE TO RELATED APPLICATIONS

This application is a Continuation of PCT International Application No. PCT/JP2019/013360 filed on Mar. 27, 2019, which was published under PCT Article 21(2) in Japanese, and which claims priority under 35 U.S.C. § 119 (a) to Japanese Patent Application No. 2018-064746 filed in Japan on Mar. 29, 2018. The above applications are hereby expressly incorporated by reference, in their entirety, into the present application.

BACKGROUND OF THE INVENTION

1. Field of the Invention

The present invention relates to a color correction filter for a white organic electroluminescent light source, and an organic electroluminescent display device.

2. Description of the Related Art

Organic electroluminescent (organic EL) display devices are being used as space-saving image display devices having small power consumption in a broadening range of uses. An organic EL display device that requires high quality images, such as a television, is required to realize high resolution, high color reproducibility, excellent contrast, and the like.

As a method of forming a color image of an organic EL display device, there are known a three-color separation method of red (R), green (G), and blue (B), a color conversion method, and a color filter method.

The RGB three-color separation method is a method in which light emitting layers that emit each of three primary colors of RGB are independently arranged.

In addition, in the color conversion method, blue light emitted from the blue light emitting layer is converted into red by the red fluorescent material and converted into green by the green fluorescent material to obtain the three primary colors of RGB.

In addition, in the color filter method, a white light emitting layer is used, and white light from the light emitting layer passes through a color filter to obtain RGB three primary colors. For example, a layer doped with a plurality of types of fluorescent materials can be used as a white light emitting layer. Such a white light emitting layer is called a white organic EL light source.

The white light from the white organic EL light source includes light of a wavelength unnecessary for color image formation (for example, light showing an orange color near 590 nm), which causes a decrease in color reproducibility of the organic EL display device.

As a technique for dealing with this problem, JP2014-130763A discloses an invention of a color correction filter including at least one tetraazaporphyrin compound having a specific structure. According to the invention described in JP2014-130763A, the color reproducibility of an organic EL display device is improved by combining the color correction filter with the white organic EL light source.

SUMMARY OF THE INVENTION

As described above, the color correction filter combined with the white organic EL light source is required to specifically block light of an unnecessary wavelength from the white organic EL light source to realize high color reproducibility. In addition, in the practical application of the color correction filter, light resistance to endure continuous exposure is also an important factor.

Therefore, an object of the present invention is to provide a color correction filter for a white organic EL light source capable of further improving the color reproducibility of an organic EL display device using a white organic EL light source and having excellent light resistance, and an organic EL display device having this filter.

The present inventors have conducted extensive investigations in view of the above problems. As a result, it has been found that in a case where the moisture content is controlled using a highly hydrophobic resin as a base and a film containing a coloring agent exhibiting a specific absorption maximum wavelength therein is used as a color correction filter for a white organic EL light source, the color reproducibility of the obtained organic EL display device can be further improved, and this color correction filter exhibits sufficient light resistance. The present invention has been further investigated based on these findings and has been completed.

The above object of the present invention has been achieved by the following aspects.

[1] A color correction filter for a white organic electroluminescent light source, the color correction filter comprising:

a resin; and 0.1 parts by mass or more of a coloring agent having an absorption maximum wavelength in a range of 560 to 620 nm or 460 to 520 nm with respect to 100 parts by mass of the resin, in which the tilter has a moisture content of 0.5% by mass or less.

[2] The color correction filter for a white organic electroluminescent light source according to [1], in which the coloring agent is a squaraine-based coloring agent represented by Formula (1), Formula (1)

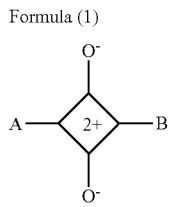

in Formula (1), A and B each independently represent an aryl group which may have a substituent, a heterocyclic group which may have a substituent, or —CH=G, and G represents a heterocyclic group which may have a substituent.

[3] The color correction filter for a white organic electroluminescent light source according to [1] or [2], in which the color correction filter for a white organic electroluminescent light source contains an electron donating type quencher, and an energy level of a HOMO of the coloring agent and an energy level of a HOMO of the electron donating type quencher satisfy Relational Expression [A-1] below, $$E_{Hq} - E_{Hd} \leq 0.40 \text{ eV}, \qquad \text{Relational Expression [A-1]:}$$

where $E_{Hd}$ and $E_{Hq}$ respectively represent the following values, $E_{Hd}$: energy level of HOMO of coloring agent, and $E_{Hq}$: energy level of HOMO of electron donating type quencher.

[4] The color correction filter for a white organic electroluminescent light source according to [1] or [2], in which the color correction filter for a white organic electroluminescent light source contains an electron accepting type quencher, and an energy level of a LUMO of the coloring agent and an energy level of a LUMO of the electron accepting type quencher satisfy Relational Expression [B-1] below, $$E_{Ld} - E_{Lq} \leq 0 \text{ eV}, \qquad \text{Relational Expression [B-1]:}$$

where $E_{Ld}$ and $E_{Lq}$ respectively represent the following values, $E_{Ld}$: energy level of LUMO of coloring agent, and $E_{Lq}$: energy level of LUMO of electron accepting type quencher.

[5] The color correction filter for a white organic electroluminescent light source according to any one of [1] to [4], in which the resin satisfies Relational Expression [C] below, $$0.80 \leq fd \leq 0.95 \qquad \text{Relational Expression [C]:}$$

where the fd value is defined by Relational Expression I below, $$fd = \delta d/(\delta d + \delta p + \delta h), \qquad \text{Relational Expression I:}$$

in Relational Expression I, δd, δp, and δh respectively indicate a term corresponding to a London dispersion force, a term corresponding to a dipole-dipole force, and a term corresponding to a hydrogen bonding force with respect to a solubility parameter St calculated by a Hoy method.

[6] The color correction filter for a white organic electroluminescent light source according to any one of [1] to [5], in which the resin contains a polystyrene resin.

[7] The color correction filter for a white organic electroluminescent light source according to any one of [1] to [5], in which the resin contains a cyclic polyolefin resin.

[8] An organic electroluminescent display device comprising: the color correction filter for a white organic electroluminescent light source according to any one of [1] to [7].

In the specification, the numerical range represented by "to" means a range including the numerical values described before and after "to" as the lower limit value and the upper limit value.

In the specification, in a case where there are a plurality of substituents, linking groups, repeating structures, and the like (hereinafter, referred to as substituents and the like) represented by specific references, or in a case where a plurality of substituents, and the like are defined at the same time, unless otherwise specified, the respective substituents and the like may be the same or different from each other. The same applies to the definition of the number of substituents and the like. In addition, in a case where a plurality of substituents and the like are close to each other (particularly in a case where the substituents and the like are adjacent to each other), unless otherwise specified, the substituents and the like may be linked to each other to form a ring. In addition, rings, for example, alicycles, aromatic rings, and heterocycles may be further condensed together and thus form a fused ring.

The color correction filter for a white organic EL light source according to the aspect of the present invention can further improve the color reproducibility of an organic EL display device and attain excellent light resistance. The organic EL display device according to the aspect of the present invention can continuously exhibit excellent color reproducibility.

DESCRIPTION OF THE PREFERRED EMBODIMENTS

Preferred embodiments of the present invention will be described below.

[Color Correction Filter for White Organic EL Light Source]

A color correction filter for a white organic EL light source according to an embodiment of the present invention (hereinafter, also simply referred to as a "filter according to an embodiment of the present invention") is a filter for effectively blocking light of an unnecessary wavelength (light in a wavelength range other than RGB described later) from a white organic EL light source. The filter according to the embodiment of the present invention contains a specific amount of a coloring agent having an absorption maximum wavelength in a range of 560 to 620 nm or 460 to 520 nm in combination with a specific amount of a resin. In addition, the moisture content of the filter according to the embodiment of the present invention is 0.5% by mass or less, and highly hydrophobic physical properties are exhibited.

<Coloring Agent>

The coloring agent contained in the filter according to the embodiment of the present invention is a coloring agent having a main absorption wavelength range at a wavelength of 460 to 520 nm (hereinafter, referred to as dye A) or a coloring agent having a main absorption wavelength range at a wavelength of 560 to 620 nm (hereinafter, referred to as dye B). In the present invention, the term "or" is used as a meaning including "and".

Although the details will be described later, the filter according to the embodiment of the present invention may contain dyes other than the dye A and the dye B.

The dye A is not particularly limited as long as the dye has a main absorption wavelength range in a wavelength of 460 to 520 nm, and various dyes can be used. There are a lot of dyes that exhibit fluorescence.

In the present invention, an expression "having a main absorption wavelength range at a wavelength XX to YY nm" means that in the visible light absorption spectrum (in a wavelength range of 380 to 750 nm), a wavelength at which the absorption maximum wavelength appears is present in a wavelength range of XX to YY nm. Therefore, in a case in which this wavelength is present in the above-mentioned wavelength range, the entire absorption range including this wavelength may be in the above-mentioned wavelength range or may also extend up to the outside of the above-mentioned wavelength range. In addition, in a case where there are a plurality of absorption maximum wavelengths, an absorption maximum wavelength at which absorbance that is not highest appears may be present outside the wavelength range of XX to YY nm. Meanwhile, in a case where there are a plurality of wavelengths at which the absorption maximum wavelength appears, one of the wavelengths may be present in the above-mentioned wavelength range.

Specific examples of the dye A include, for example, individual dyes such as pyrrole methine (PM)-based dyes, rhodamine (RH)-based dyes, boron dipyrromethene (BODIPY)-based dyes, and squarine (SQ)-based dyes.

For example, it is also possible to preferably use a commercially available product such as FDB-007 (trade name, merocyanine-based dye, manufactured by Yamada Chemical Co., Ltd.) as the dye A.

The dye B is not particularly limited as long as the dye has a main absorption wavelength range at a wavelength of 560 to 620 nm, and various dyes can be used. As the dye B, there are a lot of dyes that exhibit weaker fluorescence than the dye A or exhibit no fluorescence.

Specific examples of the dye B include, for example, individual dyes such as tetraaza porphyrin (TAP)-based dyes, squarine-based dyes, and cyanine (CY)-based dyes. In addition, it is also possible to preferably use a commercially available product such as PD-311S (trade name, tetraaza porphyrin-based dye, manufactured by Yamada Chemical Co., Ltd.) or FDG-006 (trade name, tetraaza porphyrin-based dye, manufactured by Yamada Chemical Co., Ltd.) as the dye B.

Among these, as the dye A and the dye B, squarine-based coloring agents are preferable, and squarine-based coloring agents represented by Formula (1) are more preferable.

In the present invention, in the coloring agents represented by each of the following formulae, a cation is present in a delocalized manner, and a plurality of tautomer structures are present. Therefore, in the present invention, in a case where at least one tautomer structure of a certain coloring agent matches with each of the formulae, the certain coloring agent is considered as the coloring agents represented by each of the formulae. Therefore, a coloring agent represented by a specific Formula can also be said to be a coloring agent having at least one tautomer structure that can be represented by the specific Formula. In the present invention, a coloring agent represented by a Formula may have any tautomer structure as long as at least one tautomer structure of the coloring agent matches with the formula.

Formula (1)

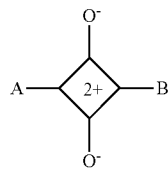

In Formula (1), A and B each independently represent an aryl group which may have a substituent, a heterocyclic group which may have a substituent, or —CH=G. G represents a heterocyclic group which may have a substituent.

The aryl group that can be employed as A or B is not particularly limited and may be a group consisting of a single ring or a group consisting of a fused ring. The number of carbon atoms in the aryl group is preferably 6 to 30, more preferably 6 to 20, and still more preferably 6 to 12. Examples of the aryl group include individual groups consisting of a benzene ring or a naphthalene ring, and groups consisting of a benzene ring are more preferable.

A heterocyclic group that can be employed as A or B is not particularly limited, and examples thereof include groups consisting of an aliphatic heterocycle or an aromatic heterocycle. Groups consisting of an aromatic heterocycle are preferable. Examples of a heteroaryl group that is an aromatic heterocyclic group include heteroaryl groups that can be employed as a substituent X described below. The aromatic heterocyclic group that can be employed as A or B is preferably a group of a 5-membered ring or a 6-membered ring and more preferably a group of a nitrogen-containing 5-membered ring. Specific examples thereof preferably include a pyrrole ring, a furan ring, a thiophene ring, an imidazole ring, a pyrazole ring, a thiazole ring, an oxazole ring, a triazole ring, an indole ring, an indolenine ring, an indoline ring, a pyridine ring, a pyrimidine ring, a quinoline ring, a benzothiazole ring, a benzooxazole ring, and a pyrazolotriazole ring. Among these, groups formed of a pyrrole ring, a pyrazole ring, a thiazole ring, a pyridine ring, a pyrimidine ring, or a pyrazolotriazole ring are preferable. The pyrazolotriazole ring consists of a fused ring of a pyrazole ring and a triazole ring and may be a fused ring obtained by fusing at least one pyrazole ring and at least one triazole ring. Examples thereof include fused rings in Formulae (4) and (5) described below.

G in —CH=G that can be employed as A or B represents a heterocyclic group which may have a substituent, and examples thereof suitably include examples listed as A and B. Among these, groups consisting of a benzoxazole ring, a benzothiazole ring, an indoline ring, or the like are preferable.

Each of A, B, and G may have the substituent X, and, in a case where A, B, or G has the substituent X, adjacent substituents may be bonded to each other to further form a ring structure. In addition, a plurality of substituents may be present.

Examples of the substituent X include substituents that can be employed as $R^1$ in Formula (2) described below, and preferable specific examples thereof include a halogen atom, a cyano group, a nitro group, an alkyl group, an alkenyl group, an alkynyl group, an aryl group, a heteroaryl group, an aralkyl group, —$OR^{10}$, —$COR^{11}$, —$COOR^{12}$, —$OCOR_{13}$, —$NR^{14}R^{15}$, —$NHCOR^{16}$, —$CONR^{17}R^{18}$, —$NHCONR^{19}R^{20}$, —$NHCOOR^{21}$, —$SR^{22}$, —$SO_2R^{21}$, —$SO_3R^{24}$, —$NHSO_2R^{25}$, $SO_2NR^{26}R^{27}$, and —$OR^{28}$.

$R^{10}$ to $R^{28}$ each independently represent a hydrogen atom, an aliphatic group, an aromatic group, or a heterocyclic group. The aliphatic group and the aromatic group that can be employed as $R^{10}$ to $R^{28}$ are not particularly limited and can be appropriately selected from the corresponding groups among the substituents that can be employed as $R^1$ in Formula (2) described below. Among these, the aliphatic group is preferably an alkyl group or an alkenyl group, and the aromatic group is preferably an aryl group. The heterocyclic group that can be employed as $R^{10}$ to $R^{28}$ may be aliphatic or aromatic, and can be appropriately selected from heteroaryl groups or heterocyclic groups that can be employed as $R^1$ in Formula (2) described below.

Meanwhile, in a case where $R^{12}$ of —$COOR^{12}$ is a hydrogen atom (that is, a carboxyl group), the hydrogen atom may be dissociated (that is, a carbonate group) or may be in a salt state. In addition, in a case where $R^{24}$ of —$SO_3R^{24}$ is a hydrogen atom (that is, a sulfo group), the hydrogen atom may be dissociated (that is, a sulfonate group) or may be in a salt state.

As the halogen atom, a fluorine atom, a chlorine atom, a bromine atom, and an iodine atom are exemplified.

The number of carbon atoms in the alkyl group is preferably 1 to 20, more preferably 1 to 15, and still more preferably 1 to 8. The number of carbon atoms in the alkenyl group is preferably 2 to 20, more preferably 2 to 12, and still more preferably 2 to 8. The number of carbon atoms in the alkynyl group is preferably 2 to 40, more preferably 2 to 30, and still more preferably 2 to 25. The alkyl group, the alkenyl group, and the alkynyl group each may be any of linear, branched, or cyclic and are preferably linear or branched.

The aryl group includes a group of a single ring or a fused ring. The number of carbon atoms in the aryl group is preferably 6 to 30, more preferably 6 to 20, and still more preferably 6 to 12.

An alkyl portion in the aralkyl group is the same as that in the alkyl group. An aryl portion in the aralkyl group is the same as that in the aryl group. The number of carbon atoms in the aralkyl group is preferably 7 to 40, more preferably 7 to 30, and still more preferably 7 to 25.

The heteroaryl group includes a group consisting of a single ring or a fused ring, a group consisting of a single ring or a fused ring having two to eight rings is preferable, and a group consisting of a single ring or a fused ring having two to four rings is more preferable. The number of hetero atoms constituting the ring of the heteroaryl group is preferably 1 to 3. Examples of the hetero atom constituting the ring of the heteroaryl group include a nitrogen atom, an oxygen atom, and a sulfur atom. The heteroaryl group is preferably a group having a 5-membered ring or a 6-membered ring. The number of carbon atoms constituting the ring in the heteroaryl group is preferably 3 to 30, more preferably 3 to 18, and still more preferably 3 to 12. Examples of the heteroaryl group include individual groups consisting of a pyridine ring, a piperidine ring, a furan ring, a furfuran ring, a thiophene ring, a pyrrole ring, a quinolone ring, a morpholine ring, an indole ring, an imidazole ring, a pyrazole ring, a carbazole ring, a phenothiazine ring, a phenoxazine ring, an indoline ring, a thiazole ring, a pyrazine ring, a thiadiazine ring, a benzoquinoline ring, and a thiadiazole ring.

The alkyl group, the alkenyl group, the alkynyl group, the aralkyl group, the aryl group, and the heteroaryl group exemplified as the examples of the substituent X may respectively further have a substituent and may be unsubstituted. The substituent that the above-mentioned groups may further have is not particularly limited, and is preferably a substituent selected from an alkyl group, an aryl group, an amino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, an alkylthio group, an arylthiol group, an aromatic heterocyclic thio group, a sulfonyl group, a hydroxy group, a mercapto group, a halogen atom, a cyano group, a sulfo group, and a carboxyl group, and more preferably a substituent selected from an alkyl group, an aryl group, an alkoxy group, an aryloxy group, an aromatic heterocyclic oxy group, an acyl group, an alkoxycarbonyl group, an aryloxycarbonyl group, an acyloxy group, an alkylthio group, an arylthiol group, an aromatic heterocyclic thio group, a sulfonyl group, a hydroxy group, a mercapto group, a halogen atom, a cyano group, a sulfo group, and a carboxyl group. Preferable embodiments of these groups can be appropriately selected from the substituents that can be employed as $R^1$ in Formula (2) described below.

A preferable embodiment of the coloring agent represented by Formula (1) includes a coloring agent represented by Formula (2).

Formula (2)

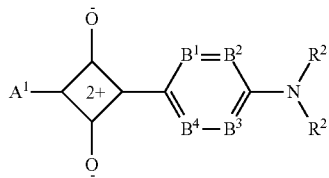

In Formula (2), $A^1$ is the same as A in Formula (1). Among these, a heterocyclic group which is a nitrogen-containing 5-membered ring is preferable.

In Formula (2). $R^1$ and $R^2$ each independently represent a hydrogen atom or a substituent. $R^1$ and $R^2$ may be the same as or different from each other, and may be bonded together to form a ring.

The substituents that can be employed as $R^1$ and $R^2$ are not particularly limited, and examples thereof include alkyl groups (a methyl group, an ethyl group, a propyl group, an isopropyl group, a butyl group, a t-butyl group, an isobutyl group, a pentyl group, a hexyl group, an octyl group, a dodecyl group, a trifluoromethyl group, and the like), cycloalkyl groups (a cyclopentyl group, a cyclohexyl group, and the like), alkenyl groups (a vinyl group, an allyl group, and the like), alkynyl group (an ethynyl group, a propargyl group, and the like), aryl groups (a phenyl group, a naphthyl group, and the like), heteroaryl groups (a fury group, a thienyl group, a pyridyl group, a pyridazyl group, a pyrimidyl group, a pyrazyl group, a triazyl group, an imidazolyl group, a pyrazolyl group, a thiazolyl group, a benzoimidazolyl group, a benzoxazolyl group, a quinazolyl group, a phthalazyl group, and the like), heterocyclic groups (also referred to as heterocyclic groups, for example, a pyrrolidyl group, an imidazolidyl group, a morpholyl group, an oxazolidyl cloud, and the like), alkoxy groups (a methoxy group, an ethoxy group, a propyloxy group, and the like), cycloalkoxy groups (a cyclopentyloxy group, a cyclohexyloxy group, and the like), aryloxy groups (a phenoxy group, a naphthyloxy group, and the like), heteroaryloxy groups (an aromatic heterocyclic oxy group), alkylthio groups (a methylthio group, an ethylthio group, a propylthio group, and the like), cycloalkylthio groups (a cyclopentylthio group, a cyclohexylthio group, and the like), arylthio groups (a phenythio group, a naphthylthio group, and the like), heteroarylthio groups (an aromatic heterocyclic thio group), alkoxycarbonyl groups (a methyloxycarbonyl group, an ethyloxycarbonyl group, a butyloxycarbonyl group, an octyloxycarbonyl group, and the like), aryloxycarbonyl groups (a phenyloxycarbonyl group, a naphthyloxycarbonyl group, and the like), phosphoryl groups (a dimethoxyphosphonyl group and a diphenylphosphoryl group), sulfamoyl groups (an aminosulfonyl group, a methylaminosulfonyl group, a dimethylaminosulfonyl group, a butylaminosulfonyl group, a cyclohexylaminosulfonyl group, an octylaminosulfonyl group, a phenylaminosulfonyl group, a 2-pyridylaminosulfonyl group, and the like), acyl groups (an acetyl group, an ethylcarbonyl group, a propylcarpanyl group, a cyclohexylcarbonyl group, an octylcarbonyl group, a 2-ethylhexylcarbonyl group, a phenylcarbonyl group, a naphthylcarbonyl group, a pyridylcarbonyl group, and the like), acyloxy groups (an acetyloxy group, an ethylcarbonyloxy group, a butylcarbonyloxy group, an octylcarbonyloxy group, a phenylcarbonyloxy group, and the like), amide groups (a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, a naphthylcarbonylamino group, and the like), sulfonylamide groups (a methylsulfonylamino group, an octylsulfonylamino group, a 2-ethylhexylsulfonylamino group, a trifluoromethylsulfonylamino group, and the like), carbamoyl groups (an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, a 2-pyridylaminocarbonyl group, and the like), ureido groups (a methylureido group, an ethylureido group, a pentylureido group, a cyclohexylureido group, an octylureido group, a dodecylureido group, a phenylureido group, a naphthylureido group, a 2-pyridylaminoureido group, and the like), alkylsulfonyl groups (a methylsulfonyl group, an ethylsulfonyl group, a butylsulfonyl group, a cyclohexylsulfonyl group, a 2-ethylhexylsulfonyl group, and the like), arylsulfonyl groups (a phenylsulfonyl group, a naphthylsulfonyl group, a 2-pyridylsulfonyl group, and the like), amino groups (an amino group, an ethylamino group, a dimethylamino group, a butylamino group, a dibutylamino group, a cyclopentylamino group, a 2-ethylhexylamino group, a dodecylamino group, an anilino group, a naphthylamino group, a 2-pyridylamino group, and the like), alkylsulfonyloxy groups (methanesulfonyloxy), a cyano group, a nitro group, halogen atoms (a fluorine atom, a chlorine atom, a bromine atom, and the like), and a hydroxy group.

Among these, an alkyl group, an alkenyl group, an aryl group, or a heteroaryl group is preferable, an alkyl group, an aryl group, or a heteroaryl group is more preferable, and an alkyl group is further preferable.

The substituent that can be employed as $R^1$ and $R^2$ may further have a substituent. As the substituent that the substituent that can be employed as $R^1$ and $R^2$ may further have, the above-mentioned substituents that can be employed as $R^1$ and $R^2$ are exemplified. In addition, $R^1$ and $R^2$ may be bonded to each other or bond with a substituent that $B^2$ or $B^3$ has to form a ring. As the ring that is formed at this time, a heterocycle or a heteroaryl ring is preferable, and the size of the ring being formed is not particularly limited, but a 5-membered ring or a 6-membered ring is preferable.

In Formula (2). $B^1$, $B^2$, B3, and $B^4$ each independently represent a carbon atom or a nitrogen atom. The ring including $B^1$, $B^2$, $B^3$, and $B^4$ is an aromatic ring. At least two or more of $B^1$ to $B^4$ are preferably carbon atoms, and more preferably all of $B^1$ to $B^4$ are carbon atoms.

The carbon atom that can be employed as $B^1$ to $B^4$ has a hydrogen atom or a substituent. Among carbon atoms that can be employed as $B^1$ to $B^4$, the number of carbon atoms having a substituent is not particularly limited, but is preferably zero, one, or two and more preferably one. Particularly, it is preferable that $B^1$ and $B^4$ are carbon atoms and at least one has a substituent.

The substituent that the carbon atom that can be employed as $B^1$ to B4 has is not particularly limited, and examples thereof include the above-mentioned substituents that can be employed as $R^1$ and $R^2$. Among these, an alkyl group, an alkoxy group, an alkoxycarbonyl group, an aryl group, an acyl group, an amide group, a sulfonylamide group, a carbamoyl group, an alkylsulfonyl group, an arylsulfonyl group, an amino group, a cyano group, a nitro group, a halogen atom, or a hydroxy group is preferable, and an alkyl group, an alkoxy group, an alkoxycarbonyl group, an aryl group, an acyl group, an amide group, a sulfonylamide group, a carbamoyl group, an amino group, a cyano group, a nitro group, a halogen atom, or a hydroxy group is more preferable.

As the substituent that the carbon atom that can be employed as $B^1$ and $B^4$ has, an alkyl group, an alkoxy group, a hydroxy group, an amide group, a sulfonylamide group, or a carbamoyl group is still more preferable, an alkyl group, an alkoxy group, a hydroxy group, an amide group, or a sulfonylamide group is particularly preferable, and a hydroxy group, an amide group, or a sulfonylamide group is most preferable.

As the substituent that the carbon atom that can be employed as $B^2$ and $B^3$ has, an alkyl group, an alkoxy group, an alkoxycarbonyl group, an acyl group, an amino group, a cyano group, a nitro group, or a halogen atom is still more preferable, and it is particularly preferable that the substituent in any one of $B^2$ and B3 is an electron-withdrawing group (for example, an alkoxycarbonyl group, an acyl group, a cyano group, a nitro group, or a halogen atom).

The coloring agent represented by Formula (2) is preferably a coloring agent represented by any of Formulae (3), (4), and (5).

Formula (3)

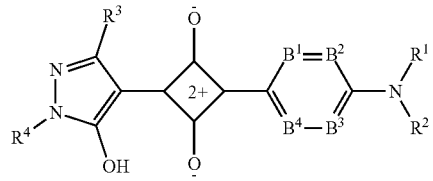

In Formula (3), $R^1$ and $R^2$ each independently represent a hydrogen atom or a substituent and have the same meanings as $R^1$ and $R^2$ in Formula (2), and the preferable ranges are also the same.

In Formula (3), $B^1$ to $B^4$ each independently represent a carbon atom or a nitrogen atom, and have the same meanings as $B^1$ to $B^4$ in Formula (2), and the preferable ranges are also the same.

In Formula (3), $R^3$ and $R^4$ each independently represent a hydrogen atom or a substituent. The substituent that can be employed as $R^3$ and $R^4$ is not particularly limited, and the same substituents as the substituents that can be employed as $R^1$ and $R^2$ can be exemplified.

As the substituents that can be employed as $R^3$, an alkyl group, an alkoxy group, an amino group, an amide group, a sulfonylamide group, a cyano group, a nitro group, an aryl group, a heteroaryl group, a heterocyclic group, an alkoxycarbonyl group, a carbamoyl group, or a halogen atom is preferable, an alkyl group, an aryl group, or an amino group is more preferable, and an alkyl group is still more preferable.

As the substituent that can be employed as $R^4$, an alkyl group, an aryl group, a heteroaryl group, a heterocyclic group, an alkoxy group, an alkoxycarbonyl group, an acyl group, an acyloxy group, an amide group, a carbamoyl group, an amino group, or a cyano group is preferable, an alkyl group, an alkoxycarbonyl group, an acyl group, a carbamoyl group, or an aryl group is more preferable, and an alkyl group is still more preferable.

The alkyl group that can be employed as $R^3$ and $R^4$ may be any of linear, branched, or cyclic and is preferably linear or branched. The number of carbon atoms in the alkyl group is preferably 1 to 12 and more preferably 1 to 8. As examples of the alkyl group, a methyl group, an ethyl group, an n-propyl group, an isopropyl group, a t-butyl group, a 2-ethylhexyl group, and a cyclohexyl group are preferable, and a methyl group and a t-butyl group are more preferable.

Formula (4)

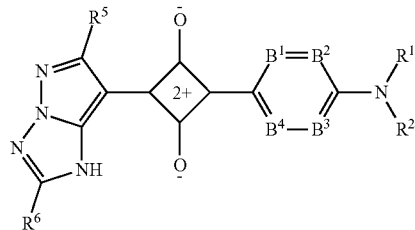

In Formula (4), $R^1$ and $R^2$ each independently represent a hydrogen atom or a substituent, and have the same meanings as $R^1$ and $R^2$ in Formula (2), and the preferable ranges are also the same.

In Formula (4), $B^1$ to $B^4$ each independently represent a carbon atom or a nitrogen atom, and have the same meanings as $B^1$ to $B^4$ in Formula (2), and the preferable ranges are also the same.

In Formula (4), $R^5$ and $R^6$ each independently represent a hydrogen atom or a substituent. The substituent that can be employed as $R^5$ and $R^6$ is not particularly limited, and the same substituents as the substituents that can be employed as $R^1$ and $R^2$ can be exemplified.

The substituent that can be employed as $R^5$ is preferably an alkyl group, an alkoxy group, an aryloxy group, an amino group, a cyano group, an aryl group, a heteroaryl group, a heterocyclic group, an acyl group, an acyloxy group, an amide group, a sulfonylamide group, an ureido group, or a carbamoyl group, more preferably an alkyl group, an alkoxy group, an acyl group, an amide group, or an amino group, and still more preferably an alkyl group.

The alkyl group that can be employed as $R^5$ has the same meaning as the alkyl group that can be employed as $R^3$ in Formula (3), and the preferable range is also the same.

In Formula (4), the substituent that can be employed as $R^6$ is preferably an alkyl group, an alkenyl group, an aryl group, a heteroaryl group, a heterocyclic group, an alkoxy group, a cycloalkoxy group, an aryloxy group, an alkoxycarbonyl group, an acyl group, an acyloxy group, an amide group, a sulfonylamide group, an alkylsulfonyl group, an arylsulfonyl group, a carbamoyl group, an amino group, a cyano group, a nitro group, or a halogen atom, more preferably an alkyl group, an aryl group, a heteroaryl group, or a heterocyclic group, and still more preferably an alkyl group or an aryl group.

The alkyl group that can be employed as $R^6$ has the same meaning as the alkyl group that can be employed as $R^4$ in Formula (3), and the preferable range is also the same.

The aryl group that can be employed as $R^6$ is preferably an aryl group having 6 to 12 carbon atoms, and more preferably a phenyl group. This aryl group may have a substituent, as such a substituent, groups selected from the following substituent group A are exemplified, and, particularly, an alkyl group, a sulfonyl group, an amino group, an acylamino group, a sulfonylamino group, and the like, which have 1 to 10 carbon atoms, are preferable. These substituents may further have a substituent. Specifically, the substituent is preferably an alkylsulfonylamino group.

—Substituent Group A—

A halogen atom, an alkyl group, an alkenyl group, an alkynyl group, an aryl group, a heterocyclic group, a cyano group, a hydroxy group, a nitro group, a carboxyl group, an alkoxy group, an aminooxy group, an aryloxy group, a silyloxy group, a heterocyclic oxy group, an acyloxy group, a carbamoyloxy group, an amino group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group, and the like.

Formula (5)

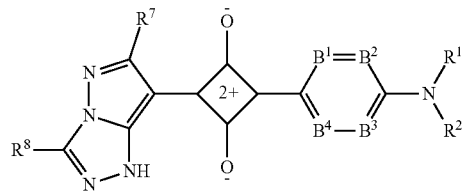

In Formula (5). $R^1$ and $R^2$ each independently represent a hydrogen atom or a substituent, have the same meanings as $R^1$ and $R^2$ in Formula (2), and the preferable ranges are also the same.

In Formula (5), $B^1$ to $B^4$ each independently represent a carbon atom or a nitrogen atom, have the same meanings as $B^1$ to $B^4$ in Formula (2), and the preferable ranges are also the same.

In Formula (5), $R^7$ and $R^8$ each independently represent a hydrogen atom or a substituent. The substituent that can be employed as $R^7$ and $R^8$ is not particularly limited, and the same substituents as the substituents that can be employed as $R^1$ and $R^2$ can be exemplified.

However, a preferable range, a more preferable range, and a still more preferable group of the substituent that can be employed as R are the same as those of the substituent that can be employed as $R^5$ in Formula (4). The alkyl group that can be employed as $R^5$ has the same meaning as the alkyl group that can be employed as $R^3$, and the preferable range is also the same.

In Formula (5), a preferable range, a more preferable range, and a still more preferable group of the substituent that can be employed as Rx are the same as the substituent that can be employed as $R^6$ in Formula (4). The preferable ranges of the alkyl group and the aryl group that can be employed as $R^8$ have the same meaning as the alkyl group and the aryl group that can be employed as $R^6$ in Formula (4), and the preferable ranges are also the same.

In the present invention, in a case where a squarine-based dye is used as the dye A, any squarine-based dye may be used without particular limitations as long as the squarine-based dye is the squarine coloring agent represented by any of Formulae (1) to (5). Examples thereof include compounds described in, for example, JP2006-160618A, WO2004/005981A, WO2004/007447A, Dyes and Pigment, 2001, 49, pp. 161 to 179, WO2008/090757A, WO2005/121098A, and JP2008-275726A.

Hereinafter, specific examples of the coloring agents represented by any of Formulae (1) to (5) will be shown. However, the present invention is not limited thereto.

In the following specific examples, Me represents methyl, Et represents ethyl, and Ph represents phenyl, respectively.

A-1
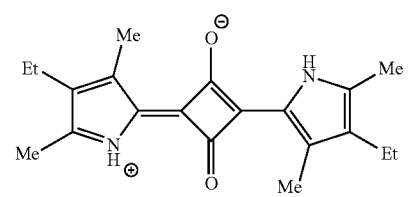

A-2
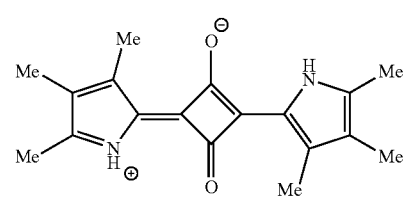

A-3
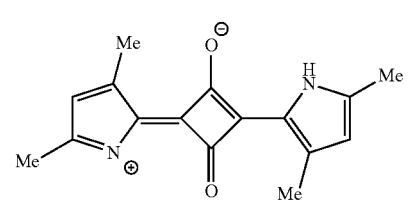

A-4
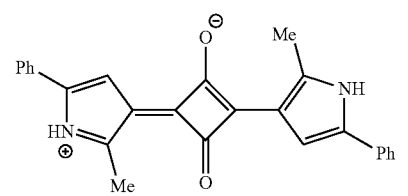

A-5
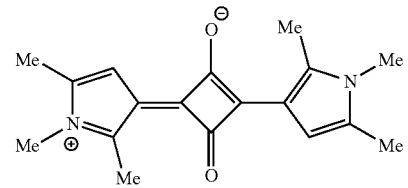

A-6
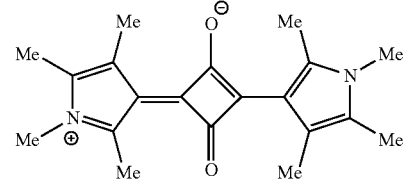

A-7
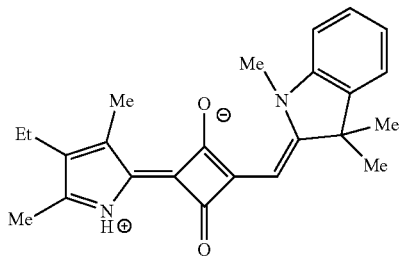

A-8
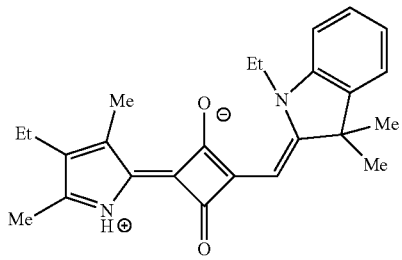

A-9
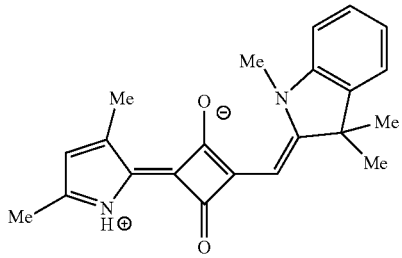

A-10
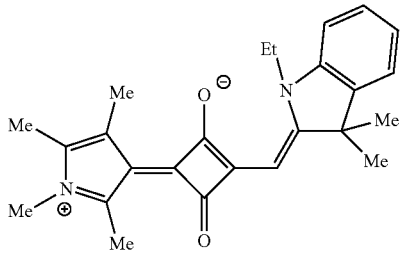

A-11
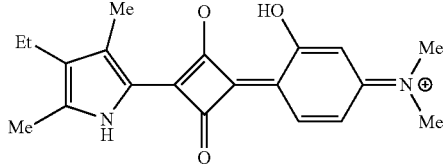

A-12
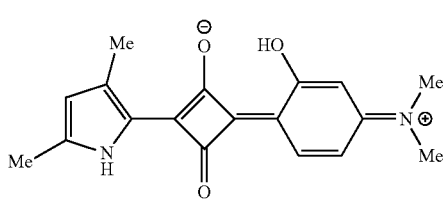

-continued

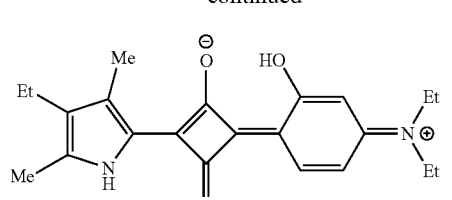
A-13

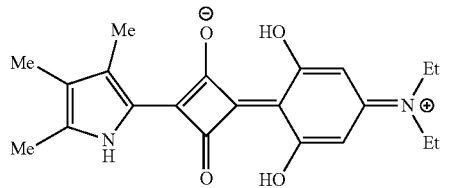
A-14

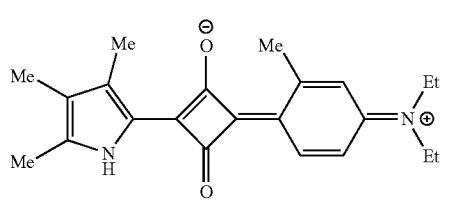
A-15

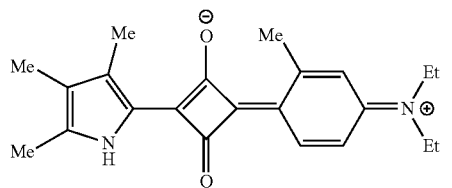
A-16

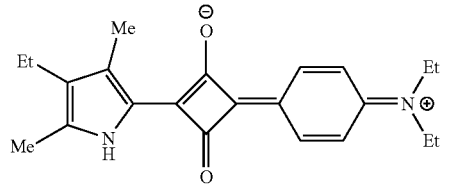
A-17

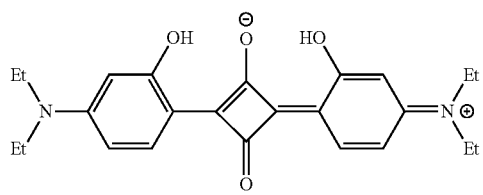
A-18

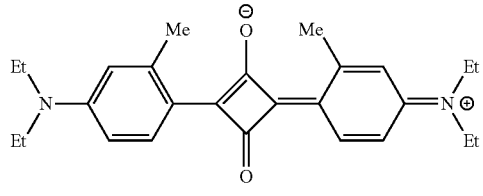
A-19

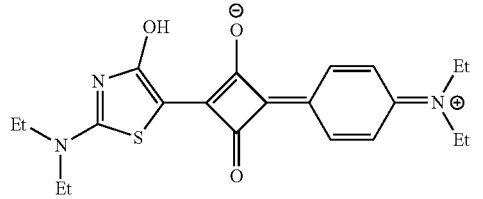
A-20

In addition to the above-mentioned specific examples, specific examples of the coloring agents represented by any of Formulae (3) to (5) will be shown. Substituents B in the following tables represent the following structures. In the following structures and the following table, Me represents methyl, Et represents ethyl, i-Pr represents i-propyl, Bu represents n-butyl, t-Bu represents t-butyl, and Ph represents phenyl, respectively. In the following structures, * indicates a bonding site with a 4-membered carbon ring in each formula.

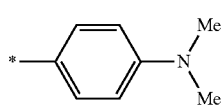
B-1

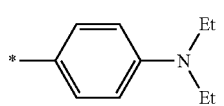
B-2

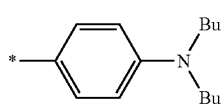
B-3

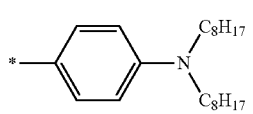
B-4

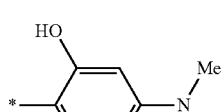
B-5

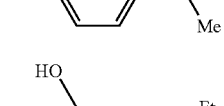
B-6

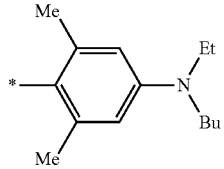
B-7

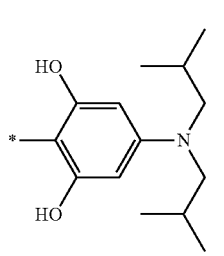
B-8

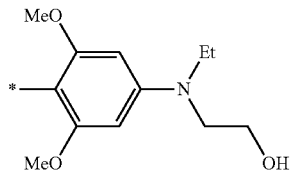
B-9

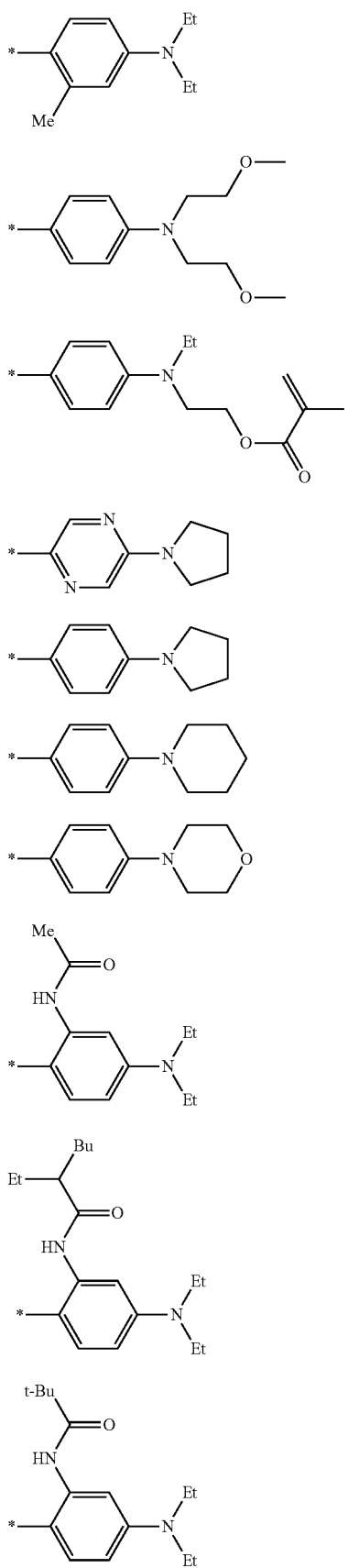
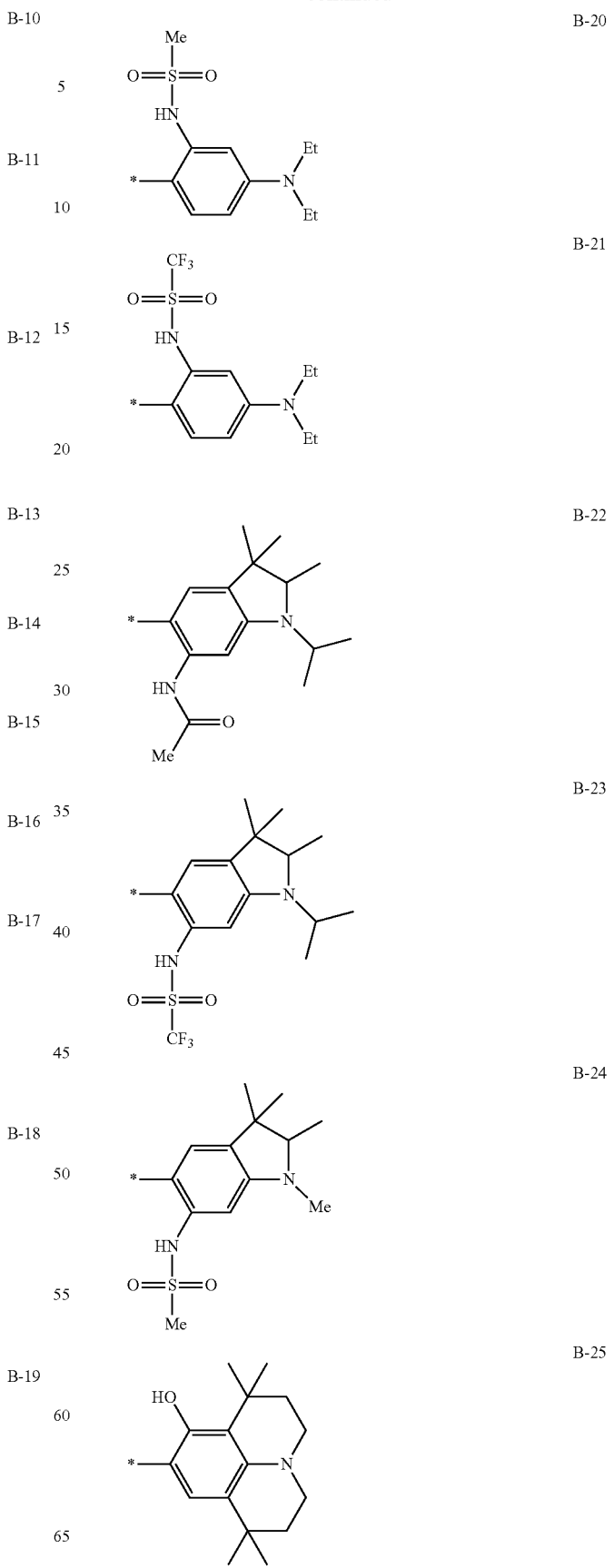

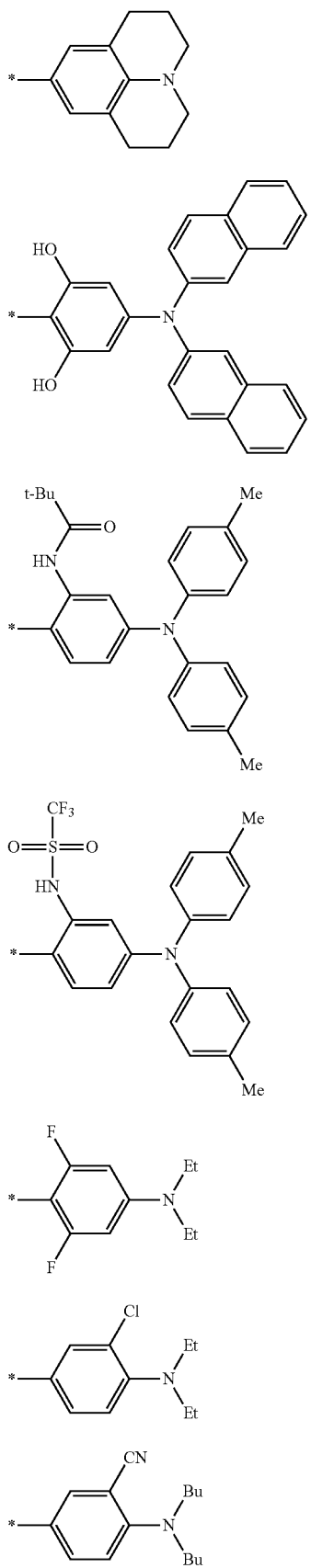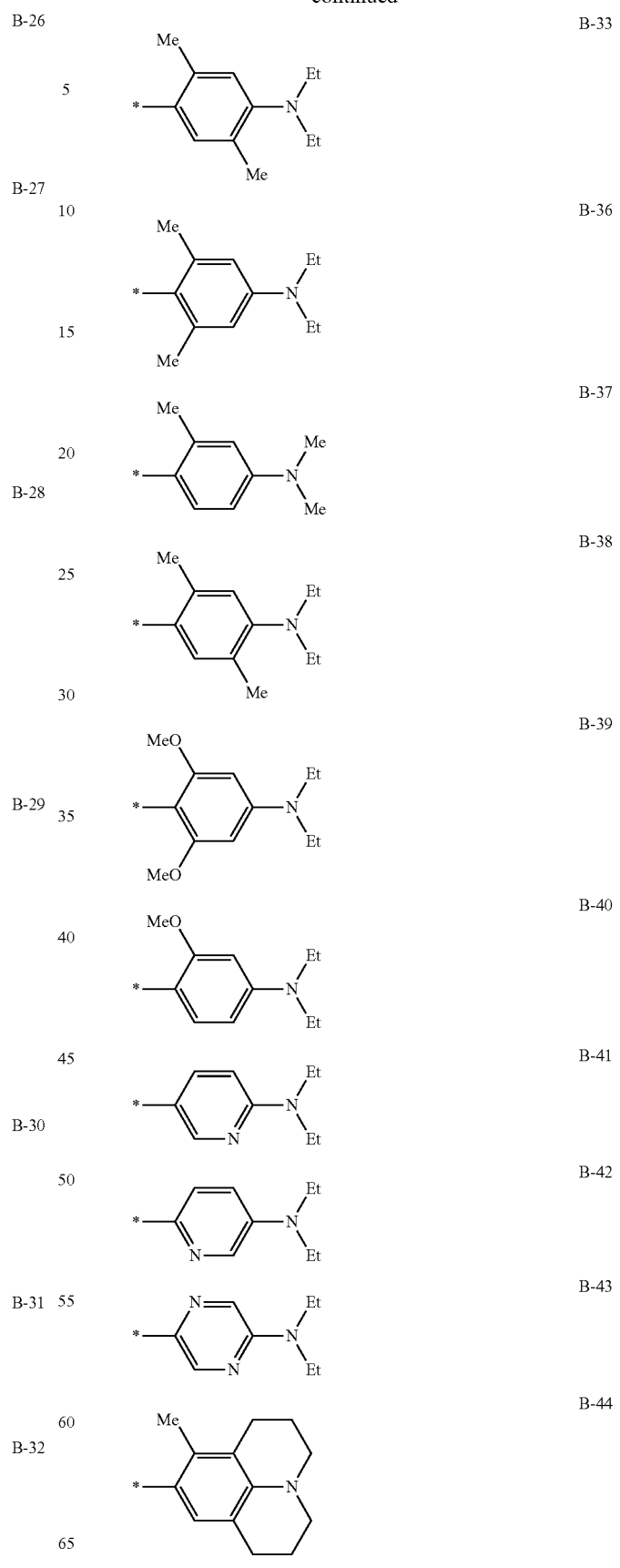

-continued
B-45
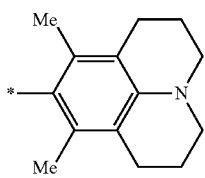
B-46
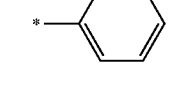
B-47
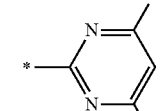
B-48
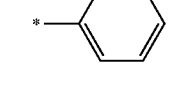
B-49
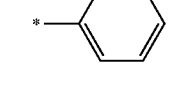
B-50
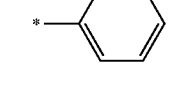
B-51
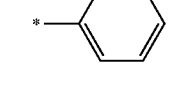
Formula (3)
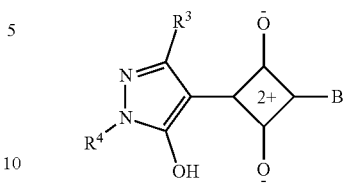
| Compound No. | R³ | R⁴ | B |
|---|---|---|---|
| 3-1 | Me | Me | B-3 |
| 3-2 | Me | Me | B-4 |
| 3-3 | Me | Me | B-5 |
| 3-4 | Me | Me | B-10 |
| 3-5 | Me | Me | B-14 |
| 3-6 | Me | Me | B-16 |
| 3-7 | Me | Me | B-17 |
| 3-8 | Me | Me | B-18 |
| 3-9 | Me | Me | B-19 |
| 3-10 | Me | Me | B-20 |
| 3-11 | Me | Me | B-21 |
| 3-12 | Me | Me | B-22 |
| 3-13 | Me | Me | B-23 |
| 3-14 | Me | Me | B-26 |
| 3-15 | Me | Me | B-32 |
| 3-16 | Me | Me | B-33 |
| 3-17 | Me | Me | B-38 |
| 3-18 | Me | Me | B-49 |
| 3-19 | Et | 2-pyridyl | B-28 |
| 3-20 | Me | 4-methyl-6-hydroxypyrimidin-2-yl | B-29 |
| 3-21 | H | H | B-23 |
| 3-22 | Et | t-Bu | B-21 |
| 3-23 | t-Bu | Me | B-18 |
| 3-24 | CF₃ | i-Pr | B-12 |
| 3-25 | COOEt | Et | B-6 |
| 3-26 | ON | Ph | B-11 |
| 3-27 | NMe₂ | Me | B-2 |
| 3-28 | i-Pr | Me | B-17 |
| 3-29 | OEt | Bu | B-27 |
| 3-30 | NH₂ | i-Pr | B-9 |
| 3-31 | t-Bu | Me | B-17 |
| 3-32 | t-Bu | Bu | B-21 |
| 3-33 | CF₃ | Me | B-18 |
| 3-34 | OEt | Et | B-33 |
| 3-35 | NMe₂ | i-Pr | B-2 |
| 3-36 | Et | Me | B-17 |
| 3-37 | Bu | Me | B-18 |
| 3-38 | NH₂ | Ph | B-19 |
| 3-39 | OEt | 2,4,6-trichlorophenyl | B-25 |
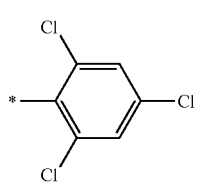

-continued

| Compound No. | R³ | R⁴ | B |
|---|---|---|---|
| 3-40 | Me | benzothiazol-2-yl | B-2 |
| 3-41 | Me | Ph | B-17 |
| 3-42 | Me | Ph | B-21 |
| 3-43 | Me | Ph | B-36 |
| 3-44 | Me | t-Bu | B-17 |
| 3-45 | Me | t-Bu | B-18 |
| 3-46 | Me | t-Bu | B-10 |
| 3-47 | OEt | Me | B-17 |
| 3-48 | OEt | Me | B-10 |
| 3-49 | Me | 2,4,6-trichlorophenyl | B-17 |
| 3-50 | Me | 2,4,6-trichlorophenyl | B-19 |
| 3-51 | Me | 2,4,6-trichlorophenyl | B-21 |
| 3-52 | Me | 2,4,6-trimethylphenyl (mesityl) | B-17 |
| 3-53 | Me | mesityl | B-20 |
| 3-54 | Me | mesityl | B-21 |
| 3-55 | t-Bu | Me | B-17 |
| 3-56 | t-Bu | Me | B-10 |
| 3-57 | t-Bu | Me | B-44 |
| 3-58 | t-Bu | t-Bu | B-17 |
| 3-59 | t-Bu | t-Bu | B-10 |
| 3-60 | t-Bu | t-Bu | B-6 |
| 3-61 | NBu₂ | Me | B-17 |
| 3-62 | NBu₂ | Me | B-10 |
| 3-63 | t-Bu | 2,4,6-trichlorophenyl | B-17 |
| 3-64 | t-Bu | 2,4,6-trichlorophenyl | B-19 |
| 3-65 | t-Bu | 2,4,6-trichlorophenyl | B-21 |
| 3-66 | t-Bu | mesityl | B-17 |
| 3-67 | t-Bu | mesityl | B-20 |
| 3-68 | t-Bu | mesityl | B-21 |
| 3-69 | Me | t-Bu | B-51 |

Formula (4)

$$\text{pyrazolo-triazole with } R^5, R^6 \text{ substituents, linked to squaraine (2+) ring bearing B}$$

| Compound No | R⁵ | R⁶ | B |
|---|---|---|---|
| 4-1 | t-Bu | *-C₆H₄-NHSO₂C₈H₁₇ (para) | B-2 |
| 4-2 | t-Bu | *-C₆H₄-NHSO₂C₈H₁₇ (para) | B-6 |
| 4-3 | t-Bu | *-C₆H₄-NHSO₂C₈H₁₇ (para) | B-10 |
| 4-4 | Me | *-C₆H₄-NHSO₂C₈H₁₇ (para) | B-4 |
| 4-5 | t-Bu | *-C₆H₄-NHSO₂CF₃ (para) | B-6 |
| 4-6 | t-Bu | *-C₆H₄-NHSO₂CF₃ (para) | B-14 |
| 4-7 | NHCOCH₂ | *-C₆H₄-NHSO₂CF₃ (para) | B-1 |
| 4-8 | t-Bu | *-C₆H₄-NHSO₂CH₃ (para) | B-6 |
| 4-9 | t-Bu | *-C₆H₄-NHSO₂CH₃ (para) | B-16 |
| 4-10 | OEt | *-C₆H₄-NHSO₂CH₃ (para) | B-11 |
| 4-11 | t-Bu | *-C₆H₄-NHCOCH(Et)Bu (para) | B-6 |
| 4-12 | t-Bu | *-C₆H₄-NHCOCH(Et)Bu (para) | B-12 |
| 4-13 | OEt | *-C₆H₄-NHCOCH(Et)Bu (para) | B-31 |
| 4-14 | H | H | B-22 |
| 4-15 | Me | Me | B-23 |
| 4-16 | Me | Me | B-17 |
| 4-17 | Me | Et | B-18 |
| 4-18 | Ph | Ph | B-8 |
| 4-19 | Et | t-Bu | B-17 |
| 4-20 | OEt | t-Bu | B-3 |
| 4-21 | OEt | Bu | B-26 |
| 4-22 | OEt | 2-pyridyl (*) | B-2 |
| 4-23 | CF3 | t-Bu | B-19 |
| 4-24 | NHCOCH₃ | t-Bu | B-2 |
| 4-25 | NHCOCH₃ | Me | B-1 |
| 4-26 | NMe₂ | t-Bu | B-6 |
| 4-27 | NMe₂ | Et | B-17 |
| 4-28 | H | Me | B-2 |
| 4-29 | t-Bu | t-Bu | B-18 |
| 4-30 | t-Bu | Me | B-17 |

Formula (5)

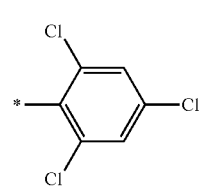

| Compound No. | R⁷ | R⁸ | B |
|---|---|---|---|
| 5-1 | t-Bu | *-C₆H₄-NHSO₂C₈H₁₇ (para) | B-2 |
| 5-2 | Me | *-C₆H₄-NHSO₂C₈H₁₇ (para) | B-6 |
| 5-3 | t-Bu | *-C₆H₄-NHSO₂CF₃ (para) | B-4 |
| 5-4 | Me | *-C₆H₄-NHSO₂CH₃ (para) | B-10 |
| 5-5 | t-Bu | *-C₆H₄-NHCOCH(Et)Bu (para) | B-6 |
| 5-6 | t-Bu | 2-pyridyl (*) | B-14 |
| 5-7 | Me | 2,4,6-trichlorophenyl (*) | B-1 |

-continued

| Compound No. | R⁷ | R⁸ | B |
|---|---|---|---|
| 5-8 | Me | 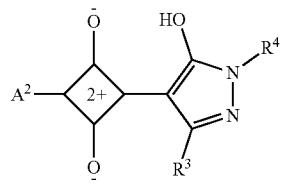 (3,4-dichlorophenyl) | B-6 |
| 5-9 | Me | 2,4,5-trimethylphenyl (Me, Me, Me) | B-16 |
| 5-10 | t-Bu | 2,4,5-trimethylphenyl (Me, Me, Me) | B-11 |
| 5-11 | Me | Me | B-17 |
| 5-12 | Me | t-Bu | B-18 |
| 5-13 | Ph | Ph | B-8 |
| 5-14 | Ph | 2,4,5-trimethylphenyl (Me, Me, Me) | B-17 |
| 5-15 | Et | Ph | B-17 |
| 5-16 | OEt | t-Bu | B-3 |
| 5-17 | OEt | Bu | B-26 |
| 5-18 | CF3 | t-Bu | B-19 |
| 5-19 | NHCOCH₃ | t-Bu | B-2 |
| 5-20 | NHCOCH₃ | 2,4,5-trimethylphenyl (Me, Me, Me) | B-1 |
| 5-21 | t-Bu | 3-(OC₁₀H₂₁)phenyl | B-2 |

As a preferable embodiment of the coloring agent represented by Formula (1), a coloring agent represented by Formula (6) is exemplified.

Formula (6)

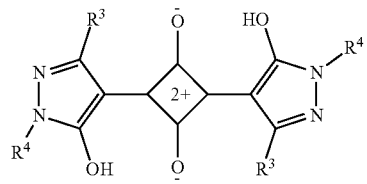

In Formula (6), $R^3$ and $R^4$ each independently represent a hydrogen atom or a substituent and have the same meanings as $R^3$ and $R^4$ in Formula (3), and the preferable ranges are also the same.

In Formula (6), $A^2$ has the same meaning as A in Formula (1). Among these, a heterocyclic group which is a nitrogen-containing 5-membered ring is preferable.

The coloring agent represented by Formula (6) is preferably a coloring agent represented by any one of Formulae (7), (8) and (9).

Formula (7)

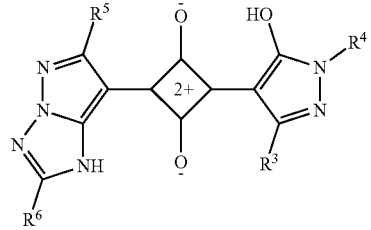

In Formula (7), $R^3$ and $R^4$ each independently represent a hydrogen atom or a substituent, and have the same meanings as $R^3$ and $R^4$ in Formula (3), and the preferable ranges are also the same. Two $R^3$'s and two $R^4$'s may be the same as or different from each other.

Formula (8)

In Formula (8), $R^3$ and $R^4$ each independently represent a hydrogen atom or a substituent, and have the same meanings as $R^3$ and $R^4$ in Formula (3), and the preferable ranges are also the same.

In Formula (8), $R^5$ and $R^6$ each independently represent a hydrogen atom or a substituent, and have the same meanings as $R^5$ and $R^6$ in Formula (4), and the preferable ranges are also the same.

Formula (9)

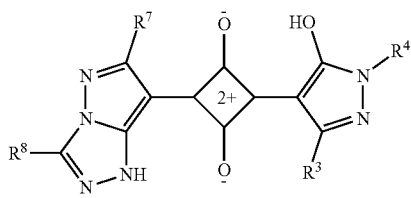

In Formula (9), $R^3$ and $R^4$ each independently represent a hydrogen atom or a substituent, and have the same meanings as $R^3$ and $R^4$ in Formula (3), and the preferable ranges are also the same.

In Formula (9), $R^7$ and $R^8$ each independently represent a hydrogen atom or a substituent, and have the same meanings as $R^7$ and $R^8$ in Formula (5), and preferable ranges are also the same.

In the present invention, in a case where a squarine-based dye is used as the dye B, any squarine-based dye may be used without particular limitations as long as the squarine-based dye is a squarine-based dye represented by any one of Formulae (6) to (9). Examples thereof include the compounds described in, for example, JP2002-097383A and JP2015-068945A.

Hereinafter, specific examples of the coloring agents represented by any of Formulae (6) to (9) will be shown. However, the present invention is not limited thereto.

In the following specific examples, Me represents methyl, Et represents ethyl, i-Pr represents i-propyl, t-Bu represents t-butyl, and Ph represents phenyl, respectively. In the following structures, * indicates a bonding site with a 4-membered carbon ring in each formula.

Formula (7)

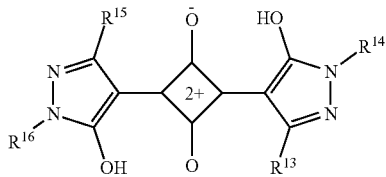

| Compound No. | $R^{13}$ | $R^{14}$ | $R^{15}$ | $R^{16}$ |
|---|---|---|---|---|
| 7-1 | Me | Me | Me | Me |
| 7-2 | Et | Me | Et | Me |
| 7-3 | Me | 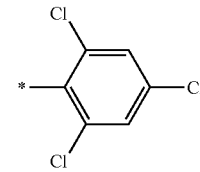 | Me | 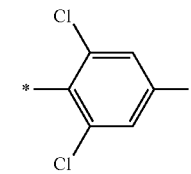 |
| 7-4 | t-Bu | 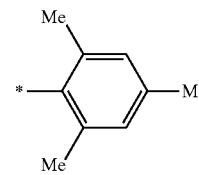 | t-Bu | 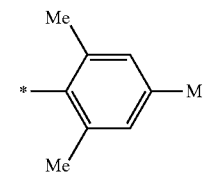 |
| 7-5 | NMe$_2$ | Me | NMe$_2$ | Me |
| 7-6 | CN | Me | CN | Me |
| 7-7 | OEt | Me | OEt | Me |
| 7-8 | Me | 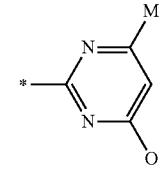 | Me | 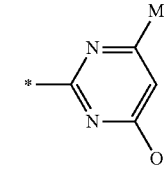 |
| 7-9 | Et | 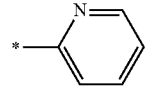 | Et | 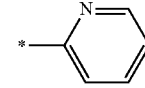 |
| 7-10 | i-Pr | 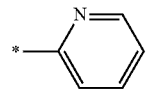 | i-Pr | 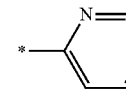 |
| 7-11 | t-Bu | t-Bu | t-Bu | t-Bu |
| 7-12 | CF$_3$ | Ph | CF$_3$ | Ph |
| 7-13 | COOEt | Me | COOEt | Me |
| 7-14 | NH$_2$ | Me | NH2 | Me |

-continued
| Compound No. | R¹³ | R¹⁴ | R¹⁵ | R¹⁶ |
|---|---|---|---|---|
| 7-15 | Me | Me | Me | 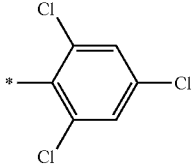 |
| 7-16 | Me | Me | t-Bu | t-Bu |
| 7-17 | Me | Me | NMe₂ | Me |
| 7-18 | Me | Me | Me | Ph |
| 7-19 | Et | Me | Et |  |
| 7-20 | COOEt | Me | Me | 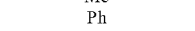 |
Formula (8)
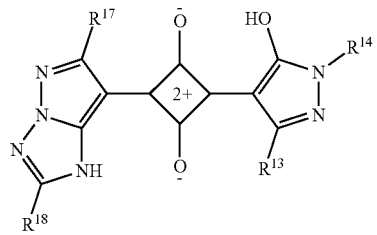
| Compound No. | R¹³ | R¹⁴ | R¹⁷ | R¹⁸ |
|---|---|---|---|---|
| 8-1 | Me | Me | Me | Me |
| 8-2 | Me | Me | t-Bu | 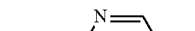 |
| 8-3 | Me | Me | t-Bu | 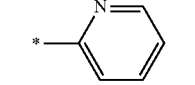 |
| 8-4 | Me | Me | t-Bu | 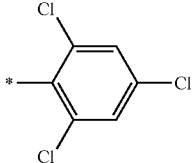 |
| 8-5 | Me | 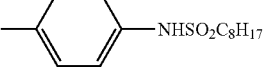 | Me | Me |

-continued
| Compound No. | R¹³ | R¹⁴ | R¹⁷ | R¹⁸ |
|---|---|---|---|---|
| 8-6 | Me | 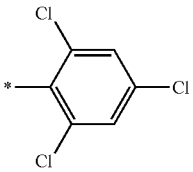 | t-Bu | 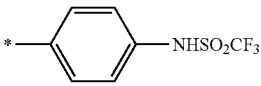 |
| 8-7 | Me | Ph | t-Bu | 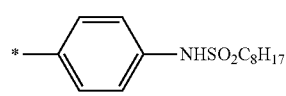 |
| 8-8 | Me | 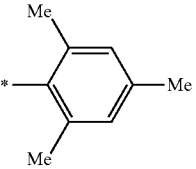 | Me | Me |
| 8-9 | Et | Me | Me | Me |
| 8-10 | i-Pr | Me | Me | Me |
| 8-11 | t-Bu | Me | Me | Me |
| 8-12 | Me | Me | OEt | Bu |
| 8-13 | COOEt | Me | Me | Me |
| 8-14 | NH₂ | Me | Me | Me |
| 8-15 | Me | Me | CF₃ | t-Bu |
Formula (9)
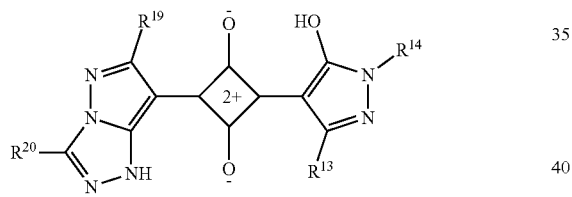
| Compound No | R¹³ | R¹⁴ | R¹⁹ | R²⁰ |
|---|---|---|---|---|
| 9-1 | Me | Me | Me | Me |
| 9-2 | Me | Me | t-Bu | 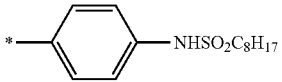 |
| 9-3 | Me | Me | Me | 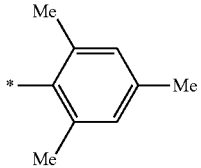 |
| 9-4 | Me | Me | Me | 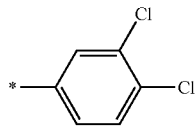 |

-continued

| Compound No | $R^{13}$ | $R^{14}$ | $R^{19}$ | $R^{20}$ |
|---|---|---|---|---|
| 9-5 | Me | 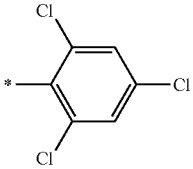 | Me | Me |
| 9-6 | Me | 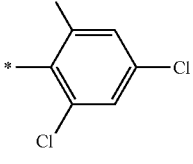 | Me | 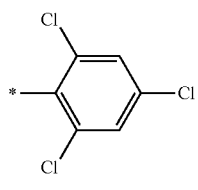 |
| 9-7 | t-Bu | Me | t-Bu | 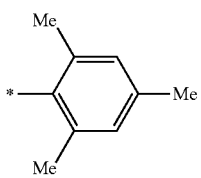 |
| 9-8 | t-Bu | Me | Me | Me |
| 9-9 | Et | Me | t-Bu | Me |
| 9-10 | i-Pr | Me | Me | 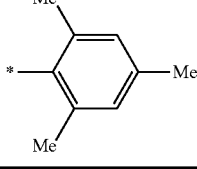 |

The total content of the coloring agent having an absorption maximum wavelength in a range of 560 to 620 nm or 460 to 520 nm in the filter according to the embodiment of the present invention is 0.1 part by mass or more with respect to 100 parts by mass of the resin constituting the filter according to the embodiment of the present invention, more preferably 0.15 parts by mass or more, still more preferably 0.2 parts by mass or more, particularly preferably 0.25 parts by mass or more, and particularly preferably 0.3 parts by mass or more.

In addition, the total content of the coloring agents having an absorption maximum wavelength in a range of 560 to 620 nm or 460 to 520 nm in the filter according to the embodiment of the present invention is usually 1 part by mass or less with respect to 100 parts by mass of the resin constituting the filter according to the embodiment of the present invention, preferably 0.6 part by mass or less, and more preferably 0.45 part by mass or less.

The dye used in the present invention includes, in addition to the dyes A and B, a fluorescent dye having a main absorption wavelength range in a wavelength range other than RGB and having a main light emission wavelength range in a wavelength range that corresponds to a wavelength range of RGB or combinations of two or more of such fluorescent dyes (dyes according to a second aspect) may be used.

In the present invention, examples of the wavelength range other than RGB include individual wavelength ranges of 430 nm or lower (for example, 380 nm to 430 nm), 480 nm to 510 nm, and 560 nm to 620 nm (preferably 610 nm or less). In addition, examples of the wavelength range of RGB include individual wavelength ranges of 430 nm to 480 nm, 510 nm to 580 nm (preferably less than 560 nm), and 610 nm or more (for example, 600 nm to 650 nm, preferably more than 620 nm and 650 nm or less).

In the present invention, the main absorption wavelength range being in the wavelength range other than RGB means that, in the visible light absorption spectrum (a wavelength range of 380 to 750 nm), among absorption maximum wavelengths, a wavelength at which the highest absorbance appears is in any of wavelength ranges other than RGB. In addition, the main light emission wavelength range being in the wavelength range that corresponds to the wavelength range of RGB means that, in the visible light absorption spectrum (a wavelength range of 380 to 750 nm), among maximum light emission wavelengths, a wavelength at which the highest degree of light emission appears is in any of the wavelength range of RGB.

The dyes according to the second aspect are not particularly limited as long as the fluorescent dye has the above-mentioned properties, and examples thereof include individual fluorescent dyes such as anthracene-based fluorescent dyes, anthraquinone-based fluorescent dyes, arylmethine-based fluorescent dyes, azo-based fluorescent dyes, azomethine-based fluorescent dyes, bimane-based fluorescent dyes, coumarin-based fluorescent dyes, 1,5-diazabicyclo[3.3.0]octadiene-based fluorescent dyes, diketo-pyrrole-based fluorescent dyes, naphthalenol-imine-based fluorescent dyes, naphthalimide-based fluorescent dyes, perylene-based fluorescent dyes, phenolphthalein-based fluorescent dyes, pyrrole methine-based fluorescent dyes, pyran-based fluorescent dyes, pyrene-based fluorescent dyes, porphycene-based fluorescent dyes, porphyrin-based fluorescent dyes, quinacridone-based fluorescent dyes, rhodamine-based fluorescent dyes, rubrene-based fluorescent dyes, and stilbene-based fluorescent dyes.

Combinations of two or more fluorescent dyes selected from the group consisting of individual fluorescent dyes such as perylene-based fluorescent dyes, azo-based fluorescent dyes, pyrrole methine-based fluorescent dyes, pyran-based fluorescent dyes, and coumarin-based fluorescent dyes are preferably exemplified, and combinations of two or more fluorescent dyes selected from the group consisting of individual fluorescent dyes such as perylene-based fluorescent dyes, pyrrole methine-based fluorescent dyes, pyran-based fluorescent dyes, and coumarin-based fluorescent dyes are more preferably exemplified.

<Resin>

The resin contained in the filter according to the embodiment of the present invention (hereinafter, also referred to as "resin used in the present invention" or "matrix resin") preferably has certain hydrophobicity. That is, by using the resin used in the present invention as the matrix resin of the color correction filter, the moisture content of the color correction filter can be set to 0.5% by mass or less. By using such a highly hydrophobic resin in combination with the above coloring agent, the light resistance of the color correction filter can be further improved.

In the resin contained in the filter according to the embodiment of the present invention, it is preferable that an fd value calculated by Relational Expression I below satisfies Relational Expression [C] from the viewpoint of providing a sharp absorption waveform and high polarization performance.

$$fd = \delta d/(\delta d + \delta p + \delta h) \quad \text{Relational Expression I:}$$

$$0.80 \leq fd \leq 0.95 \quad \text{Relational Expression [C]:}$$

in Relational Expression I, $\delta d$, $\delta p$, and $\delta h$ respectively indicate a term corresponding to a London dispersion force, a term corresponding to a dipole-dipole force, and a term corresponding to a hydrogen bonding force with respect to a solubility parameter St calculated by a Hoy method. That is, fd represents a ratio of $\delta d$ to the sum of $\delta d$, $\delta p$ and $\delta h$.

By setting the fd value to 0.95 or less, the solubility of the matrix resin in a solvent capable of dissolving the coloring agent can be further improved. In addition, by setting the fd value to 0.80 or more, a sharper absorption waveform can be easily obtained, and the quantum yield of fluorescence emitted by the coloring agent can be further reduced.

Further, in a case where the filter contains two or more matrix resins, the fd value is calculated as follows.

$$fd = \Sigma(wi \cdot fdi)$$

Here, wi represents the mass fraction of the i-th matrix resin, and fdi represents the fd value of the i-th matrix resin.

—Term $\delta d$ Corresponding to London Dispersion Force—

The term $\delta d$ corresponding to the London dispersion force refers to $\delta d$ obtained for the Amorphous Polymers described in the column "2) Method of Hoy (1985, 1989)" on pages 214 to 220 of the document "Properties of Polymers $3^{rd}$, ELSEVIER, (1990)", and is calculated according to the description in the column of the document.

—Term $\delta p$ Corresponding to Dipole-Dipole Force—

The term $\delta p$ corresponding to the dipole-dipole force refers to $\delta p$ obtained for Amorphous Polymers described in the column "2) Method of Hoy (1985, 1989)" on pages 214 to 220 of the document "Properties of Polymers $3^{rd}$, ELSEVIER, (1990)", and is calculated according to the description in the column of the document.

—Term $\delta h$ Corresponding to Hydrogen Bonding Force—

The term $\delta h$ corresponding to the hydrogen bonding force refers to $\delta h$ obtained for the Amorphous Polymers described in the column "2) Method of Hoy (1985, 1989)" on pages 214 to 220 of the document "Properties of Polymers $3^{rd}$, ELSEVIER, (1990)", and is calculated according to the description in the column of the document.

Preferable examples of the resin used in the present invention include a polystyrene resin and a cyclic polyolefin resin.

(Polystyrene Resin)

The polystyrene resin means a resin containing 50% by mass or more of a styrene component. In the present invention, one polystyrene resin may be used, or two or more polystyrene resins may be used in combination. Here, the styrene component is a constitutional unit derived from a monomer having a styrene skeleton in the structure thereof.

In the polystyrene resin, the content of the styrene component preferably 70% by mass or more, and more preferably 85% by mass or more for the purpose of controlling the filter to have a preferable photo-elastic coefficient and preferable hygroscopicity. It is also preferable that the polystyrene resin is constituted of only a styrene component.

The polystyrene resin may be a homopolymer of a styrene compound or a copolymer of two or more styrene compounds. Here, the styrene compound is a compound having a styrene skeleton in the structure thereof, and is meant to include, in addition to styrene, a compound in which a substituent is introduced into a portion other than the ethylenically unsaturated bond of styrene. Examples of the styrene compounds include styrene; alkylstyrene such as α-methylstyrene, o-methylstyrene, m-methylstyrene, p-methylstyrene, 1,3-dimethylstyrene, 2,4-dimethylstyrene, o-ethylstyrene, p-ethylstyrene, and tert-butyl styrene; and substituted styrene having a hydroxyl group, an alkoxy group, a carboxyl group, or a halogen introduced into the benzene nucleus of styrene such as hydroxystyrene, tert-butoxy styrene, vinyl benzoic acid, o-chlorostyrene, and p-chlorostyrene. Among these, the polystyrene used in the present invention is preferably a homopolymer of styrene (that is, polystyrene) from the viewpoints of availability and cost of materials.

The constituent components other than the styrene component that may be contained in the polystyrene resin are not particularly limited. That is, the polystyrene resin may be a styrene-diene copolymer, a styrene-polymerizable unsaturated carboxylic acid ester copolymer, or the like. In addition, it is also possible to use a mixture of polystyrene and synthetic rubber (for example, polybutadiene or polyisoprene). Further, high impact polystyrene (HIPS) obtained by graft-polymerizing styrene to synthetic rubber is also preferable. Further, a polystyrene obtained by dispersing a rubber-like elastic body in a continuous phase of a polymer including a styrene component (for example, a copolymer of a styrene component and a (meth)acrylate ester component), and graft-polymerizing the copolymer with the rubber-like elastic body (referred to as graft type high impact polystyrene "graft HIPS") is also preferable. Furthermore, a so-called styrene-based elastomer can also be preferably used.

In addition, the polystyrene resin may be hydrogenated (may be a hydrogenated polystyrene resin). The hydrogenated polystyrene resin is not particularly limited, and the hydrogenated polystyrene resin is preferably a hydrogenated styrene-diene-based copolymer such as a hydrogenated styrene-butadiene-styrene block copolymer (SEBS) or hydrogenated styrene-isoprene-styrene block copolymer (SEPS) which is a resin obtained by adding hydrogen to SBS or SIS. Only one of these hydrogenated polystyrene resins may be used, or two or more thereof may be used.

As the polystyrene resin, a plurality of types of polystyrene resins having different compositions, molecular weights, and the like may be used in combination.

The polystyrene resin can be obtained by a known anion, bulk, suspension, emulsion or solution polymerization method. In addition, in the polystyrene resin, the unsaturated double bond of the benzene ring of the conjugated diene or the styrene monomer may be hydrogenated. The hydrogenation rate can be measured by a nuclear magnetic resonance apparatus (NMR).

As the polystyrene resin, a commercially available product may be used, and examples thereof include "CLEAREN 530L" and "CLEAREN 730L" manufactured by Denki Kagaku Kogyo Kabushiki Kaisha, "TUFPRENE 1265" and "ASAPRENE T411" manufactured by Asahi Kasei Co., Ltd., "KRATON D1102A", "KRATON D1116A" manufactured by Kraton Polymers Japan Ltd., "STYROLUX S" and "STYROLUX T" by Styrolution Group. GmbH, "ASAFLEX 840" and "ASAFLEX 860" manufactured by Asahi Kasei Chemicals Corporation (all are SBS), "679", "HF77", and "SGP-10" manufactured by PS Japan Corp., "DIC STYRENE XC-515" and "DIC STYRENE XC-535" manufactured by DIC Corporation (all are GPPS), "475D", "110103", and "IIT478" manufactured by PS Japan Corporation, and "DIC STYRENE GH-8300-5" manufactured by DIC Corporation (all are HIPS). Examples of the hydrogenated polystyrene resin include "TUFTEC H series" manufactured by Asahi Kasei Chemicals Corporation, and "KRATON G series" manufactured by Shell Japan Ltd. (all are SEBS), "DYNARON" manufactured by JSR Corporation (hydrogenated styrene-butadiene random copolymer), and "SEPTON" manufactured by Kuraray Co., Ltd. (SEPS). Examples of the modified polystyrene resin include "TUFTEC M series" manufactured by Asahi Kasei Chemicals Corporation, "EPOFRIEND" manufactured by Daicel Corporation, "Polar Group Modified DYNARON" manufactured by JSR Corporation, and "RESEDA" manufactured by ToaGosei Co., Ltd.

(Cyclic Polyolefin Resin)

The cyclic olefin compound forming the cyclic polyolefin resin is not particularly limited as long as the compound has a ring structure including a carbon-carbon double bond, and examples thereof include norbornene compounds and monocyclic olefin compounds, cyclic conjugated diene compounds, vinyl alicyclic hydrocarbon compounds, which are not norbornene compounds, and the like.

Examples of the cyclic polyolefin resin include (1) polymers including a structural unit derived from a norbornene compound, (2) polymers including a structural unit derived from a monocyclic olefin compound other than the norbornene compound, (3) polymers including a structural unit derived from a cyclic conjugated diene compound, (4) polymers including a structural unit derived from a vinyl alicyclic hydrocarbon compound, hydrides of polymers including a structural unit derived from each of the compounds (1) to (4), and the like. In the present invention, ring-opening polymers of the respective compounds are included in the polymers including a structural unit derived from a norbornene compound and the polymers including a structural unit derived from a monocyclic olefin compound.

The cyclic polyolefin resin is not particularly limited, but a polymer having a structural unit derived from a nor-bornene compound, which is represented by Formula (A-II) or (A-III), is preferable. The polymer having the structural unit represented by Formula (A-II) is an addition polymer of a norbornene compound, and the polymer having the structural unit represented by Formula (A-III) is a ring-opening polymer of a norbornene compound.

Formula (A-II)

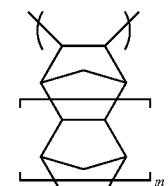

Formula (A-III)

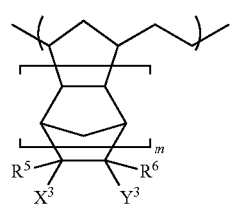

In Formula (A-II) or (A-III), m is an integer of 0 to 4, and preferably 0 or 1.

In Formula (A-II) or (A-II), $R^3$ to $R^6$ each independently represent a hydrogen atom or a hydrocarbon group having 1 to 10 carbon atoms.

In the present invention, a hydrocarbon group is not particularly limited as long as the hydrocarbon group is a group consisting of a carbon atom and a hydrogen atom, and examples thereof include an alkyl group, an alkenyl group, an alkynyl group, and an aryl group (an aromatic hydrocarbon group). Among these, an alkyl group or an aryl group is preferable.

In Formula (A-II) or (A-III), $X^2$ and $X^3$, and $Y^2$ and $Y^3$ each independently represent a hydrogen atom, a hydrocarbon group having 1 to 10 carbon atoms, a halogen atom, a hydrocarbon group having 1 to 10 carbon atoms which is substituted by a halogen atom, $-(CH_2)nCOOR^{11}$, $-(CH_2)nOCOR^{12}$, $-(CH_2)nNCO$, $-(CH_2)nNO_2$, $-(CH_2)nCN$, $-(CH_2)nCONR^{13}R^{14}$, $-(CH_2)nNR^{13}R^{14}$, $-(CH_2)nOZ$, $-(CH_2)nW$, or $(-CO)_2O$ or $(-CO)_2NR^{15}$ which is formed by bonding $X^2$ and $Y^2$, and $X^3$ and $Y^3$ to each other.

Here, $R^{11}$ to $R^{15}$ each independently represent a hydrogen atom or a hydrocarbon group having 1 to 20 carbon atoms, Z represents a hydrocarbon group or a hydrocarbon group substituted by halogen, W represents $Si(R^{16})_pD_{(3-p)}$ ($R^{16}$ represents a hydrocarbon group having 1 to 10 carbon atoms, and D represents a halogen atom, $-OCOR^{17}$, or $-OR^{17}$ ($R^{17}$ represents a hydrocarbon group having 1 to 10 carbon atoms), and p is an integer of 0 to 3). n is an integer of 0 to 10, preferably 0 to 8, and more preferably 0 to 6.

In Formula (A-II) or (A-III), $R^3$ to $R^6$ are each preferably a hydrogen atom or $-CH_3$, and, from the viewpoint of moisture permeability, more preferably a hydrogen atom.

$X^2$ and $X^3$ are each preferably a hydrogen atom, $-CH_3$, or $-C_2H_5$ and, from the viewpoint of moisture permeability, more preferably a hydrogen atom.

$Y^2$ and $Y^3$ are each preferably a hydrogen atom, a halogen atom (particularly a chlorine atom), or $-(CH_2)nCOOR^{11}$ (particularly —COOCH₃) and, from the viewpoint of moisture permeability, more preferably a hydrogen atom.

Other groups are appropriately selected.

The polymer having the structural unit represented by Formula (A-II) or (A-III) may further include at least one or more structural units represented by Formula (A-I).

Formula (A-I)

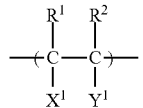

In Formula (A-I), $R^1$ and $R^2$ each independently represent a hydrogen atom or a hydrocarbon group having 1 to 10 carbon atoms, and $X^1$ and $Y^1$ each independently represent a hydrogen atom, a hydrocarbon group having 1 to 10 carbon atoms, a halogen atom, a hydrocarbon group having 1 to 10 carbon atoms which is substituted by a halogen atom, —(CH₂)nCOOR¹¹, —(CH₂)nOCOR¹², —(CH₂)nNCO, —(CH₂)nNO₂, —(CH₂)nCN, —(CH₂)nCONR¹³R¹⁴, —(CH₂)nNR¹³R¹⁴, —(CH₂)nOZ, —(CH₂)nW, or (—CO)₂O or (—CO)₂NR¹⁵ which is formed by bonding $X^1$ and $Y^1$ to each other.

Here, $R^{11}$ to $R^{15}$ each independently represent a hydrogen atom or a hydrocarbon group having 1 to 20 carbon atoms, Z represents a hydrocarbon group or a hydrocarbon group substituted by halogen, W represents $Si(R^{16})_pD_{(3-p)}$ ($R^{16}$ represents a hydrocarbon group having 1 to 10 carbon atoms, and D represents a halogen atom, —OCOR¹⁷, or —OR¹⁷ ($R^{17}$ represents a hydrocarbon group having 1 to 10 carbon atoms), and p is an integer of 0 to 3). n represents an integer of 0 to 10.

From the viewpoint of adhesiveness to a polarizer, the content of the structural unit derived from a norbornene compound in the cyclic polyolefin having the structural unit represented by Formula (A-II) or (A-III) is preferably 90% by mass or less, more preferably 30% to 85% by mass, still more preferably 50% to 79% by mass, and most preferably 60% to 75% by mass with respect to the total mass of the cyclic polyolefin. Here, the proportion of the structural unit derived from a norbornene compound represents the average value in the cyclic polyolefin.

The addition (co)polymer of a norbornene compound is described in JP1998-007732A (JP-H10-007732A), JP2002-504184A, US2004/229157A1A, or WO2004/070463A.

The polymer of a norbornene compound is obtained by the addition polymerization of norbornene compounds (for example, polycyclic unsaturated compounds of norbornene).

In addition, as the polymer of a norbornene compound, copolymers obtained by the addition copolymerization of, as necessary, a norbornene compound, olefin such as ethylene, propylene, or butene, conjugated diene such as butadiene or isoprene, unconjugated diene such as ethylidene norbornene, and an ethylenically unsaturated compound such as acrylonitrile, acrylic acid, methacrylic acid, maleic acid anhydride, acrylic acid ester, methacrylic acid ester, maleimide, vinyl acetate, or vinyl chloride are exemplified. Among these, copolymers with ethylene are preferable.

Examples of the addition (co)polymers of a norbornene compound include APL8008T (Tg: 70° C.), APL6011T (Tg: 105° C.), APL6013T (Tg: 125° C.), and APL6015T (Tg: 145° C.) which are launched by Mitsui Chemicals, Inc. under a trade name of APEL and have mutually different glass transition temperatures (Tg). In addition, pellets such as TOPAS8007, TOPAS6013, and TOPAS6015 are put on the market by Polyplastics Co., Ltd. Further, Appear 3000 is put on the market by Film Ferrania S. R. L.

As the polymer of a norbornene compound, commercially available products can be used. For example, polymers are put on the market by JSR Corporation under a trade name of Arton G or Arton F, and polymers are put on the market by Zeon Corporation under a trade name of Zeonor ZF14, ZF16, Zeonex 250, or Zeonex 280.

The hydride of a polymer of a norbornene compound can be synthesized by the addition polymerization or the metathesis ring-opening polymerization of a norbornene compound or the like and then the addition of hydrogen. The synthesis method is described in, for example, JP1989-240517A (JP-H1-240517A), JP1995-196736A (JP-H7-196736A), JP1985-026024A (JP-S60-026024A), JP1987-019801A (JP-S62-019801A), JP2003-159767A, JP2004-309979A, and the like.

The molecular weight of the cyclic polyolefin resin that is used in the present invention is appropriately selected depending on the intended use, but the weight-average molecular weight measured in terms of polyisoprene or polystyrene by the gel permeation chromatography of a cyclohexane solution (a toluene solution in a case where the polymer is not dissolved) is in a range of, usually, 5000 to 500000, preferably 8000 to 200000, and more preferably 10000 to 100000. A polymer having a molecular weight in the above-mentioned range is capable of satisfying both the mechanical strength and the molding workability of compacts at a high level in a well-balanced manner.

In the filter according to the embodiment of the present invention, the content of the matrix resin is preferably 5% by mass or more, more preferably 20% by mass or more, still more preferably 50% by mass or more, still even more preferably 70% by mass or more, still even more preferably 80% by mass, and still even more preferably 90% by mass or more.

The content of the matrix resin in the filter according to the embodiment of the present invention is usually 99.90% by mass or less, and preferably 99.85% by mass or less.

The number of the matrix resins contained in the filter according to the embodiment of the present invention may be two or more, and polymers having different compositional ratios and/or molecular weights may be used in combination. In this case, the total content of the respective polymers is in the above range.

<Other Components>

The filter according to the embodiment of the present invention may also contain a polarization degree improver, an antifading agent, a matting agent, a leveling agent, and the like, in addition to the coloring agent and the matrix resin described above.

(Polarization Degree Improver)

The filter according to the embodiment of the present invention preferably contains a polarization degree improver. By quenching the fluorescence emitted by the coloring agent with a polarization degree improver, an organic EL display device can improve the degree of polarization of a polarizing plate having the purpose of preventing reflected glare of external light and the like.

The polarization degree improver used in the present invention is preferably an electron donating type quencher or an electron accepting type quencher. Hereinafter, the electron donating type quencher and the electron accepting type quencher used in the present invention will be described below.

—Electron Donating Type Quencher—

The electron donating type quencher used in the present invention donates an electron to the SOMO of a low energy level of two SOMOs of the coloring agent in an excited state, and then receives the electron from the SOMO of a high energy level of the coloring agent to deactivate the coloring agent in the excited state to the ground state.

The energy level of the HOMO of the electron donating type quencher used in the present invention satisfies Relational Expression [A-1] below with respect to the energy level of the HOMO of the coloring agent.

$$E_{Hq}-E_{Hd} \leq 0.40 \text{ eV} \qquad \text{Relational Expression [A-1]}$$

where $E_{Hd}$ and $E_{Hq}$ respectively represent the following values, $E_{Hd}$: energy level of HOMO of coloring agent, and $E_{Hq}$: energy level of HOMO of electron donating type quencher.

Since the energy levels satisfy the above relationship, it is possible to effectively suppress the fluorescence emission of the coloring agent.

The energy level of the HOMO of the electron donating type quencher used in the present invention more preferably satisfies Relational Expression [A-2], and most preferably satisfies Relational Expression [A-3].

$$E_{Hq}-E_{Hd} \leq 0.20 \text{ eV} \qquad \text{Relational Expression [A-2]}$$

$$E_{Hq}-E_{Hd} \leq 0.10 \text{ eV} \qquad \text{Relational Expression [A-3]}$$

—Calculation Method of Energy Level—

As the energy levels of the coloring agent and polarization degree improver used in the present invention, the values obtained from the oxidation potential for the HOMO and the reduction potential for the LUMO are used. A method of measuring and calculating each potential will be described below.

The oxidation potential of the coloring agent and the oxidation potential and reduction potential of the polarization degree improver used in the present invention are respectively measured by an electrochemical analyzer (660A manufactured by ALS Co., Ltd.) using a gold electrode as a working electrode, a platinum black electrode as a counter electrode, an Ag wire as a reference electrode, and tetrabutylammonium hexafluorophosphate as a supporting electrolyte, and the standard potential of a ferrocene/ferricinium ion system (Fc/Fc$^+$) measured under the same conditions is used as the standard potential. Regarding a coloring agent containing a polarization degree improver described below, two oxidation potentials are detected. However, the noble potential is attributed to the oxidation potential of the coloring agent portion and the base potential is attributed to the oxidation potential of the polarization degree improver portion.

The reduction potential of the coloring agent is calculated as follows.

First, the absorption spectrum of the coloring agent is measured using a spectrophotometer (8430 manufactured by HP Inc.), and the fluorescence spectrum is measured using a fluorescence photometer (Fluorog 3 manufactured by HORIBA, Ltd.). As the solvent used for measurement, the same solvent as used in the above potential measurement is used.

Next, the absorption spectrum and the fluorescence spectrum obtained above are respectively normalized by the absorbance at the absorption maximum wavelength and the degree of light emission at the light emission maximum wavelength, the wavelength of the intersection of the two is obtained, and the value of this wavelength is converted into an energy unit (eV) to obtain a HOMO-LUMO band gap.

The reduction potential of the coloring agent is calculated by adding the value of the HOMO-LUMO band gap to the value of the oxidation potential (eV) of the coloring agent measured above.

The compound preferably used as the electron donating type quencher in the present invention will be described below.

The structure represented by Formula (I) or (I') can be preferably used as the electron donating type quencher used in the present invention.

Formula (I)

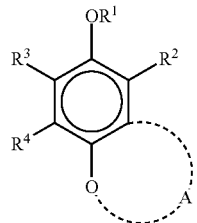

In Formula (I), $R^1$ represents a hydrogen atom, an alkyl group, an acyl group, a sulfonyl group, a carbamoyl group, a sulfamoyl group, an alkoxycarbonyl group, an aryloxycarbonyl group, or a trialkylsilyl group, and A represents a non-metal atom necessary for forming 5-membered or 6-membered ring. $R^2$, $R^3$, and $R^4$ each represent a hydrogen atom, an alkyl group, a cycloalkyl group, an alkoxy group, an aryl group, an aryloxy group, an aralkyl group, an aralkoxy group, an alkenyl group, an alkenoxy group, an acylamino group, a halogen atom, an alkylthio group, diacylamino group, an arylthio group, an alkoxycarbonyl group, an acyloxy group, an acyl group or a sulfonamide group, and $R^2$, $R^3$, and $R^4$ may be the same as or different from each other. Further, the compound represented by Formula (I) includes a bis-spiro compound in which the ring A has a structure containing a spiro atom.

As the alkyl group represented by $R^1$ in Formula (I), for example, methyl, ethyl, and propyl; as the acyl group, for example, acetyl, and benzoyl; as the sulfonyl group, for example, methanesulfonyl, butanesulfonyl, benzenesulfonyl, and toluenesulfonyl; as the carbamoyl group, for example, N-methylcarbamoyl, N,N-diethylcarbamoyl, and N-phenylcarbamoyl; as the sulfamoyl group, for example, N-methylsulfamoyl, N,N-dimethylsulfamoyl, and N-phenylsulfamoyl; as the alkoxycarbonyl group, for example, methoxycarbonyl, ethoxycarbonyl, and benzyloxycarbonyl; as the aryloxycarbonyl group, for example, phenoxycarbonyl; and as the trialkylsilyl group, for example, trimethylsilyl, and dimethylbutylsilyl may be exemplified as preferable examples.

A in Formula (I) represents a non-metal atom necessary for forming a 5-membered or 6-membered ring, and this ring may have a substituent. Preferable examples of this substituent include an alkyl group (for example, methyl), an alkoxy group (for example, methoxy), an aryl group (for example, phenyl), an aryloxy group (for example, phenoxy), an aralkyl group (for example, benzyl), an aralkoxy group (for example, benzyloxy), an alkenyl group (for example, allyl), an N-substituted amino group (for example, an alkylamino group, a dialkylamino group, an N-alkyl-N-arylamino group, and piperazino), and a heterocyclic group (for example, benzothiazolyl, and benzoxazoyl). Further, the substituent may have a residue forming a fused ring. The alkyl group and aryl group as a substituent which the A may have may further have a substituent, and preferable examples of the substituent include a halogen atom, a hydroxy group, a carboxy group, an alkoxycarbonyl group, an acyloxy group, a sulfo group, a sulfonyloxy group, an amide group (for example, acetamide, ethanesulfonamide, and benzamide), an alkoxy group, and an aryloxy groups.

As the alkyl group represented by $R^2$, $R^3$, and $R^4$ in Formula (I), for example, methyl, ethyl, and propyl; as the cycloalkyl group, for example, cyclohexyl; as the alkoxy group, for example, methoxy, ethoxy, and butoxy; as the aryl group, for example, phenyl; as the aryloxy group, for example, phenoxy; as the aralkyl group, for example, benzyl; as the aralkoxy group, for example, benzyloxy; as the alkenyl group, for example, allyl; as the alkenoxy group, for example, allyloxy; as the acylamino group, for example, acetylamino, and benzamide; as the halogen atom, for example, a chlorine atom, and a bromine atom; as the alkylthio group, for example, ethylthio; as the diacylamino group, for example, succinimide, and hydantoinyl; as the arylthio group, for example, phenylthio; as the alkoxycarbonyl group, for example, methoxycarbonyl, ethoxycarbonyl, and benzyloxycarbonyl; as the acyloxy group, for example, acetyloxy, and benzoyloxy; as the acyl group, for example, methylcarbonyl; and as the sulfonamide group, for example, dimethyl sulfonamide, and diethyl sulfonamide may be exemplified as preferable examples.

Examples of the bis-spiro compound, which is a preferable embodiment of the compound represented by Formula (I), include a compound represented by Formula (I').

Formula (I')

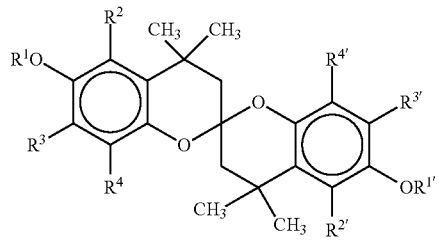

$R^1$, $R^2$, $R^3$, and $R^4$ in Formula (I') have the same meanings as $R^1$, $R^2$, $R^3$, and $R^4$ in Formula (I). $R^{1'}$, $R^{2'}$, $R^{3'}$, and $R^{4'}$ in Formula (I') have the same meanings as $R^1$, $R^2$, $R^3$, and $R^4$ in Formula (I).

The total of carbon atoms included in $R^2$, $R^3$, $R^4$, and the ring A in Formula (1) is preferably 20 or less, and particularly preferably 12 or less. For general purposes, the compound represented by Formula (1) is preferably a compound having a total number of carbon atoms of up to about 30 in the molecule, and a 5-hydroxycoumarane compound and a 6-hydroxychroman compound in which one of $R^2$ and $R^3$ in Formula (I) is a hydrogen atom, and a 6,6'-dihydroxybis-2,2'-spirochroman compound included in Formula (I') are particularly useful. More preferably, $R^2$, $R^3$, $R^4$, $R^{2'}$, $R^{3'}$, and $R^{4'}$ in Formulae (I) and (I's) each represent an alkyl group, an alkoxy group, an aryl group, an aryloxy group, or an alkylthio group.

Specific examples of the compounds represented by Formulae (I) to (I') are shown below.

Formula (I)

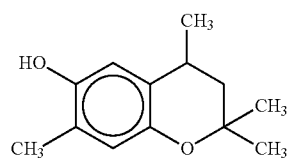

I-1

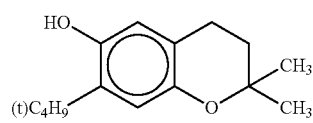

I-2

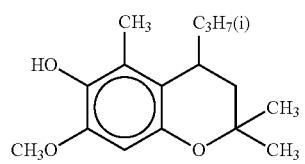

I-3

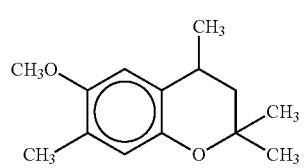

I-4

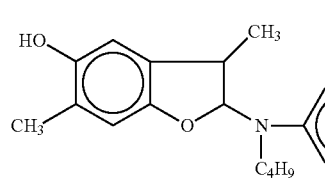

I-5

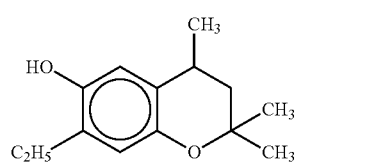

I-6

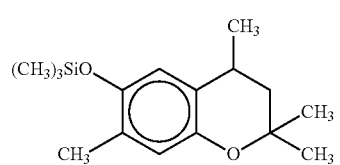

I-7

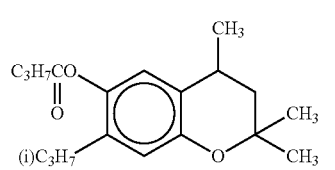

I-8

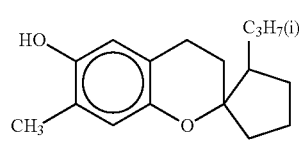

I-9

I-10 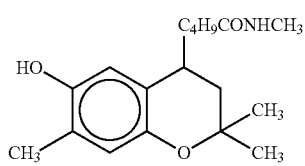
I-11 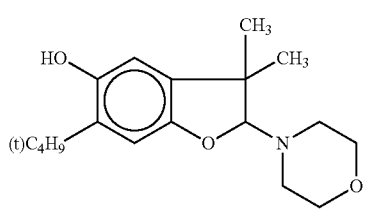
I-12 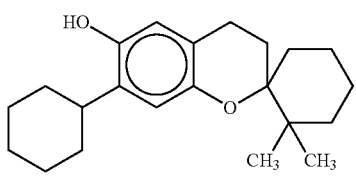
I-13 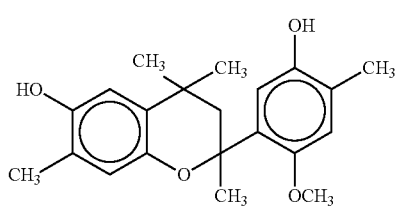
I-14 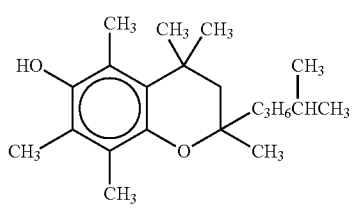
Formula (I′)
I′-1 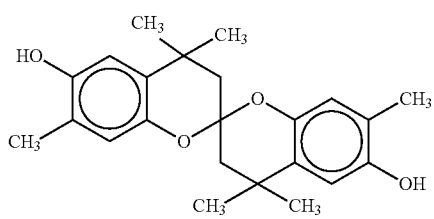
I′-2 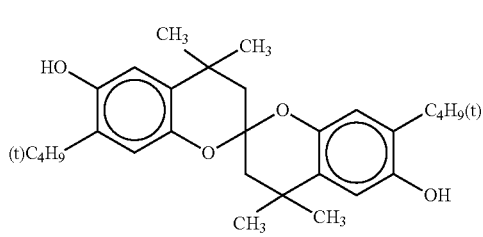
I′-3 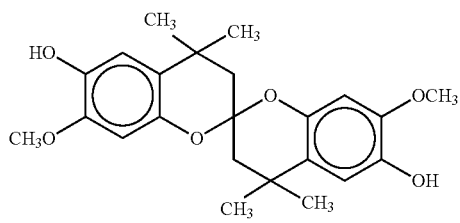
I′-4 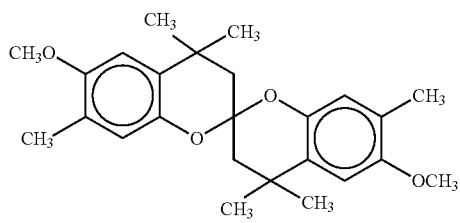
I′-5 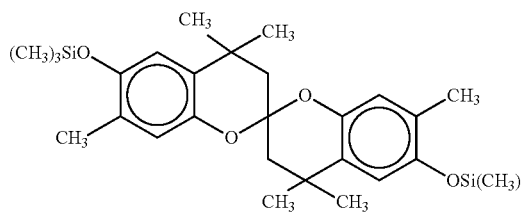
I′-6 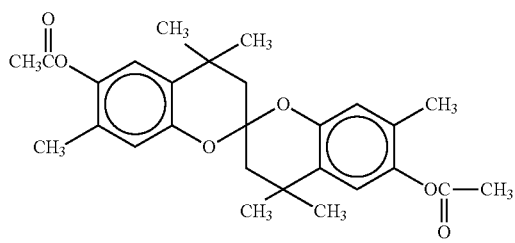
I′-7 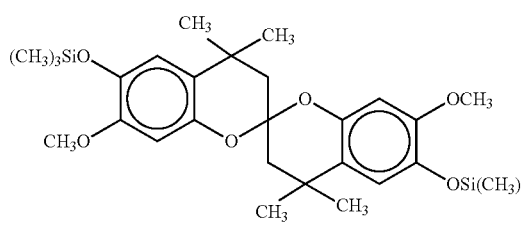
I′-8 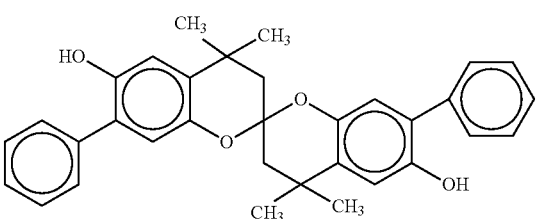
A metallocene represented by Formula (L) is also preferable as the electron donating type quencher used in the present invention.

Formula (L)

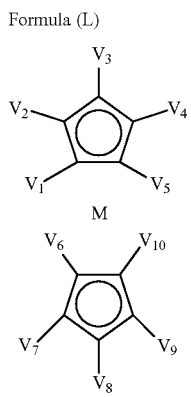

In Formula (L), M represents Fe, Ti, V, Cr, Co, Ni, Ru, Os, or Pd. $V_1$, $V_2$, $V_3$, $V_4$, $V_5$, $V_6$, $V_7$, $V_8$, $V_9$, and $V_{10}$ each represent a hydrogen atom or a monovalent substituent. More preferably, M represents Fe, and such compounds are called ferrocenes.

Formula (L) will be described in detail below.

In Formula (L), $V_1$, $V_2$, $V_3$, $V_4$, $V_5$, $V_6$, $V_7$, $V_8$, $V_9$, and $V_{10}$ each represent a hydrogen atom or a monovalent substituent. As the substituent, any group may be used, but the following groups are preferable.

Preferable examples thereof to be used include an unsubstituted alkyl group (for example, a methyl group, an ethyl group, a propyl group, an isopropyl group, a butyl group, an isobutyl group, a hexyl group, an octyl group, a dodecyl group, an octadecyl group, a cyclopentyl group, a cyclopropyl group, or a cyclohexyl group), a substituted alkyl group {in a case where the substituent is V, the substituent represented by V is not particularly limited; examples thereof include a carboxy group, a sulfo group, a cyano group, a halogen atom (for example, a fluorine atom, a chlorine atom, a bromine atom, or an iodine atom), a hydroxy group, an alkoxycarbonyl group (for example, a methoxycarbonyl group, an ethoxycarbonyl group, a phenoxycarbonyl group, or a benzyloxycarbonyl group), an alkoxy group (for example, a methoxy group, an ethoxy group, a benzyloxy group, or a phenethyloxy group), an aryloxy group having 18 or less carbon atoms (for example, a phenoxy group, a 4-methylphenoxy group, or an α-naphthoxy group), an acyloxy group (for example, an acetyloxy group, or a propionyloxy group), an acyl group (for example, an acetyl group, a propionyl group, a benzoyl group, or a mesyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), an aryl group (for example, a phenyl group, a 4-chlorophenyl group, a 4-methylphenyl group, or an α-naphthyl group), a heterocyclic group (for example, a 2-pyridyl group, a tetrahydrofurfuryl group, a morpholino group, or a 2-thiopheno group), an amino group (for example, an amino group, a dimethylamino group, an anilino group, or a diphenylamino group), an alkylthio group (for example, a methylthio group, or an ethylthio group), an alkylsulfonyl group (for example, a methylsulfonyl group, or a propylsulfonyl group), an alkylsulfinyl group (for example, a methylsulfinyl group), a nitro group, a phosphate group, an acylamino group (for example, an acetylamino group), an ammonium group (for example, a trimethylammonium group, or a tributylammonium group), a mercapto group, a hydrazino group (for example, a trimethylhydrazino group), a ureido group (for example, a ureido group, or an N,N-dimethylureido group), an imide group, and an unsaturated hydrocarbon group (for example, a vinyl group, an ethynyl group, a 1-cyclohexenyl group, a benzylidine group, or a benzylidene group). The number of carbon atoms of the substituent V is preferably 18 or less. In addition, these substituents may be further substituted by V.

an unsubstituted aryl group (for example, a phenyl group, or a 1-naphthyl group), a substituted aryl group (examples of the substituent include those described above in the definition of V), an unsubstituted heterocyclic group (for example, a 2-pyridyl group, a 2-thiazolyl group, a morpholino group, or a 2-thiopheno group), a substituted heterocyclic group (examples of the substituent include those described above in the definition of V), and the substituent represented by V.

More specifically, preferable examples thereof include an alkyl group (for example, a methyl group, an ethyl group, a carboxymethyl group, a 2-carboxyethyl group, a 3-carboxypropyl group, a 4-carboxybutyl group, a sulfomethyl group, a 2-sulfoethyl group, a 3-sulfopropyl group, a 4-sulfobutyl group, a 3-sulfobutyl group, a 2-hydroxy-3-sulfopropyl group, a 2-cyanoethyl group, a 2-chloroethyl group, a 2-bromoethyl group, a 2-hydroxyethyl group, a 3-hydroxypropyl group, a hydroxymethyl group, a 2-hydroxyethyl group, a 4-hydroxybutyl group, a 2,4-dihydroxybutyl group, a 2-methoxyethyl group, a 2-ethoxyethyl group, a methoxymethyl group, a 2-ethoxycarbonylethyl group, a methoxycarbonylmethyl group, a 2-methoxyethyl group, a 2-ethoxyethyl group, a 2-phenoxyethyl group, a 2-acetyloxyethyl group, a 2-propionyloxyethyl group, a 2-acetylethyl group, a 3-benzoylpropyl group, a 2-carbamoylethyl group, a 2-morpholinocarbonylethyl group, a sulfamoylmethyl group, a 2-(N,N-dimethylsulfamoyl)ethyl group, a benzyl group, a 2-naphthylethyl group, a 2-(2-pyridyl)ethyl group, an allyl group, a 3-aminopropyl group, a dimethylaminoethyl group, a 3-dimethylaminopropyl group, a methylthiomethyl group, a 2-methylsulfonylethyl group, a methylsulfinylmethyl group, a 2-acetylaminoethyl group, an acetylaminomethyl group, a trimethylammoniummethyl group, a 2-mercaptoethyl group, a 2-trimethylhydrazinoethyl group, a methylsulfonylcarbamoylmethyl group, a (2-methoxy)ethoxymethyl group, or the like}, an aryl group (for example, a phenyl group, a 1-naphthyl group, or a p-chlorophenyl group), a heterocyclic group (for example, a 2-pyridyl group, a 2-thiazolyl group, or a 4-phenyl-2-thiazolyl group), and a substituent represented by V (for example, a carboxy group, a formyl group, an acetyl group, a benzoyl group, a 3-carboxypropanoyl group, a 3-hydroxypropanoyl group, a chlorine atom, an N-phenylcarbamoyl group, an N-butylcarbamoyl group, a boric acid group, a sulfo group, a cyano group, a hydroxy group, a methoxy group, a methoxycarbonyl group, an acetyloxy group, or a dimethylamino group). Two of $V_1$ to $V_{10}$ may be bonded to each other to form a ring. These rings may be either aliphatic rings or aromatic rings. In addition, these rings may be substituted by, for example, the above-mentioned substituent V.

Typical examples of the compound represented by Formula (L) are shown below, but the present invention is not limited thereto.

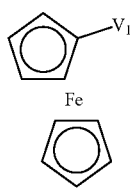

| Compound No. | $V_1$ |
|---|---|
| I-1 | H |
| I-2 | $CO_2H$ |
| I-3 | $(CH_2)_{11}N^+(CH_3)_3I^-$ |
| I-4 | CHO |
| I-5 | $SO_3H$ |
| I-6 | CO—C₆H₅ |
| I-7 | —C₆H₅ |
| I-8 | $B(OH)_2$ |
| I-9 | $CH_2N^+(CH_3)_3I^-$ |
| I-10 | $CH_2N(CH_3)_2$ |
| I-11 | $CO(CH_2)_2CO_2H$ |
| I-12 | $COCH_3$ |
| I-13 | CONH—C₆H₅ |
| I-14 | CONH—$(CH_2)_3CH_3$ |
| I-15 | $CH_2OH$ |

| Compound No. | $V_1$ |
|---|---|
| I-16 | Cl |
| I-17 | $CH_2P^+(C_6H_5)_3 \ I^-$ |
| I-18 | $CO(CH_2)_3Br$ |
| I-19 | $CO(CH_2)_3OH$ |
| I-20 | $CO(CH_2)_2OH$ |
| I-21 | CH=N—OH |
| I-22 | CH=N⁺—O⁻ |
| I-23 | $CH_2SO_3^-Na^+$ |
| I-24 | $CH_2OCH_3$ |
| I-25 | $CH_2NHCOCH_3$ |
| I-26 | $C_2H_5$ |
| I-27 | $CH(OH)CH_3$ |
| I-28 | $C(OH)(CH_3)_2$ |

-continued

| Compound No. | $V_1$ |
|---|---|
| I-29 | $(CH_2)_4OH$ |
| I-30 | $CH(OH)(CH_2)_2CH_2OH$ |
| I-31 | (ferrocene with $C_2H_5$ on both Cp rings) |
| I-32 | (ferrocene with CH(OH)CH₃ on both Cp rings) |
| I-33 | (ferrocene with COCH₃ on both Cp rings) |
| I-34 | (ferrocene with $SO_3^-NH_4^+$ on both Cp rings) |
| I-35 | (decamethylferrocene) |
| I-36 | $\left( H-\underset{\overset{|}{Fe}}{C_5H_4}-\underset{R}{\overset{|}{C}}(C_6H_5)-C_5H_4-Fe-C_5H_5 \right)_n$ |

| Compound No. | V₁ |
|---|---|
| I-37 | R = H; R = 2-methoxyphenyl (H₃CO) |
| I-38 | Ferrocene with -OC(O)CH₃ substituent |
| I-39 | Biferrocene |
| I-40 | Bis(ferrocenyl) sulfone (SO₂) |
| I-41 | Ferrocene with -CH₂N(CH₃)₂ and -CH=CH₂ substituents |
| I-42 | 1,1'-dicyanoferrocene |
| I-43 | Ferrocene with -CH₂CH₂C(O)- bridge |
| I-44 | [3]Ferrocenophane (propylene-bridged ferrocene) |
| I-45 | [2.2]Ferrocenophane |
| I-46 | Ferrocene fused with cyclohexanone |
| I-47 | Ferrocene fused with fluorenone |
| I-48 | Ferrocene fused with indene rings |
| I-50 | Ferrocene with -CH=CH-CHO substituent |

| Compound No. | V₁ |
|---|---|
| I-51 |  |
| I-52 |  |
| I-53 |  |

The metallocene used in the present invention can be synthesized with reference to the method described in Organic Reactions, Volume 17, pp. 1 to 154 (1969) by D. E. Bublitz et al. As the notations for metallocene and ferrocene, the following notations other than those of the present invention are known but the compound indicated is the same.

Notation of the Present Invention a)

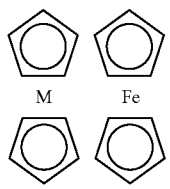

Other Notations b)

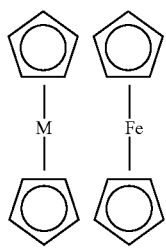

c)

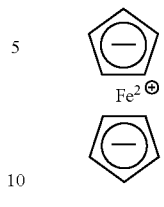

The compound represented by Formula (IA) is also preferable as the electron donating type quencher in the present invention.

Formula (IA)

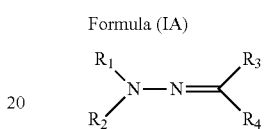

In Formula (IA), $R_1$, $R_2$, and $R_3$ each represent an alkyl group, an aryl group, or a heterocyclic group. However, in each of $R_1$ and $R_2$, the carbon atom directly bonded to the nitrogen atom is not substituted by an oxo group, a thioxo group or an imino group. $R_4$ represents a hydrogen atom, an alkyl group, an aryl group, or a heterocyclic group.

In addition, it is preferable that the compound represented by Formula (IA) is a compound represented by Formula (IIA).

Formula (IIA)

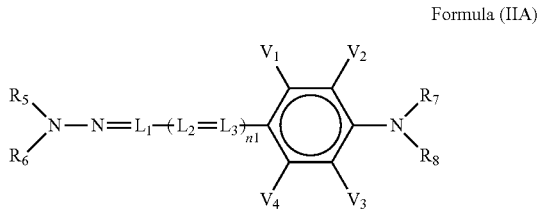

In Formula (IIA). $R_5$ and $R_6$ have the same meanings as $R_1$ and $R_2$ in Formula (IA), respectively. $R_7$ and $R_8$ each represent a hydrogen atom, an alkyl group, an aryl group, or a heterocyclic group. $V_1$, $V_2$, $V_3$, and $V_4$ each represent a hydrogen atom or a monovalent substituent. $L_1$, $L_2$, and $L_3$ each represent a methine group. n1 represents 0 or 1.

Formula (IA) will be described in detail below.

Examples of the substituents represented by $R_1$, $R_2$, and $R_3$ in Formula (IA) include an unsubstituted alkyl group (for example, a methyl group, an ethyl group, a propyl group, an isopropyl group, a butyl group, an isobutyl group, a hexyl group, an octyl group, a dodecyl group, an octadecyl group, a cyclopentyl group, a cyclopropyl group, or a cyclohexyl group), a substituted alkyl group {in a case where the substituent is Va, the substituent represented by Va is not particularly limited; examples thereof include a carboxy group, a sulfo group, a cyano group, a halogen atom (for example, a fluorine atom, a chlorine atom, a bromine atom, or an iodine atom), a hydroxy group, an alkoxycarbonyl group (for example, a methoxycarbonyl group, an ethoxycarbonyl group, a phenoxycarbonyl group, or a benzyloxycarbonyl group), an alkoxy group (for example, a methoxy group, an ethoxy group, a benzyloxy group, or a phenethyloxy group), an aryloxy group having 18 or less carbon atoms (for example, a phenoxy group, a 4-methylphenoxy group, or an α-naphthoxy group), an acyloxy group (for example, an acetyloxy group, or a propionyloxy group), an acyl group (for example, an acetyl group, a propionyl group, a benzoyl group, or a mesyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), an aryl group (for example, a phenyl group, a 4-chlorophenyl group, a 4-methylphenyl group, or an α-naphthyl group), a heterocyclic group (for example, a 2-pyridyl group, a tetrahydrofurfuryl group, a morpholino group, or a 2-thiopheno group), an amino group (for example, an amino group, a dimethylamino group, an anilino group, or a diphenylamino group), an alkylthio group (for example, a methylthio group, or an ethylthio group), an alkylsulfonyl group (for example, a methylsulfonyl group, or a propylsulfonyl group), an alkylsulfinyl group (for example, a methylsulfinyl group), a nitro group, a phosphate group, an acylamino group (for example, an acetylamino group), an ammonium group (for example, a trimethylammonium group, or a tributylammonium group), a mercapto group, a hydrazino group (for example, a trimethylhydrazino group), a ureido group (for example, a ureido group, or an N,N-dimethylureido group), an imide group, and an unsaturated hydrocarbon group (for example, a vinyl group, an ethynyl group, a 1-cyclohexenyl group, a benzylidine group, or a benzylidene group). The number of carbon atoms of the substituent Va is preferably 18 or less. In addition, these substituents may be further substituted by Va.

More specifically, preferable examples thereof include an alkyl group (for example, a carboxymethyl group, a 2-carboxyethyl group, a 3-carboxypropyl group, a 4-carboxybutyl group, a 2-sulfoethyl group, a 3-sulfopropyl group, a 4-sulfobutyl group, a 3-sulfobutyl group, a 2-hydroxy-3-sulfopropyl group, a 2-cyanoethyl group, a 2-chloroethyl group, a 2-bromoethyl group, a 2-hydroxyethyl group, a 3-hydroxypropyl group, a hydroxymethyl group, a 2-hydroxyethyl group, a 2-methoxyethyl group, a 2-ethoxyethyl group, a 2-ethoxycarbonylethyl group, a methoxycarbonylmethyl group, a 2-methoxyethyl group, a 2-ethoxyethyl group, a 2-phenoxyethyl group, a 2-acetyloxyethyl group, a 2-propionyloxyethyl group, a 2-acetylethyl group, a 3-benzoylpropyl group, a 2-carbamoylethyl group, a 2-morpholinocarbonylethyl group, a sulfamoylmethyl group, a 2-(N,N-dimethylsulfamoyl)ethyl group, a benzyl group, a 2-naphthylethyl group, a 2-(2-pyridyl)ethyl group, an allyl group, a 3-aminopropyl group, a 3-dimethylaminopropyl group, a methylthiomethyl group, a 2-methylsulfonylethyl group, a methylsulfinylmethyl group, a 2-acetylaminoethyl group, a 3-trimethylammoniummethyl group, a 2-mercaptoethyl group, a 2-trimethylhydrazinoethyl group, a methylsulfonylcarbamoylmethyl group, a (2-methoxy)ethoxymethyl group, or the like}, an aryl group (for example, a phenyl group, a α-naphthyl group, a β-naphthyl group, for example, a phenyl group or a naphthyl group substituted by the above-mentioned unsubstituted alkyl group or the above-mentioned substituent Va), and a heterocyclic group (for example, a 2-pyridyl group, a 2-thiazolyl group, or a 2-pyridyl group substituted by the above-mentioned substituent Va).

In addition, in Formula (IA), $R_1$ and $R_2$, and $R_3$ and $R_4$ may be bonded to each other to form a ring. These rings may be substituted by the above-mentioned substituent Va, for example. However, the carbon atom directly bonded to the nitrogen atom of $R_1$ and $R_2$ is not substituted by an oxo group, a thioxo group or an imino group. For example, $R_1$ and $R_2$ each are not an acetyl group, a carboxy group, a benzoyl group, a formyl group, a thioacetyl group, a thioaldehyde group, a thiocarboxy group, a thiobenzoyl group, an imino group, an N-methylimino group, or an N-phenylimino group, and in a case where a ring is formed by the two rings ($R_1$ and $R_2$), not a malonyl group, a succinyl group, a glutaryl group or an adipoyl group.

In Formula (IA), $R_1$ and $R_2$ each more preferably represent the above-mentioned unsubstituted alkyl group and the above-mentioned substituted alkyl group for Formula (A). $R_1$ and $R_2$ each particularly preferably represent an unsubstituted alkyl group (for example, a methyl group, an ethyl group, a propyl group, or a butyl group), and a substituted alkyl group for example, a sulfoalkyl group (for example, a 2-sulfoethyl group, a 3-sulfopropyl group, a 4-sulfobutyl group, or a 3-sulfobutyl group), a carboxyalkyl group (for example, a carboxymethyl group, or a 2-carboxyethyl group), a hydroxyalkyl group (for example, a 2-hydroxyethyl group).

In Formula (IA), $R_3$ more preferably represents a substituent represented by Formula (IIIA).

Formula (IIIA)

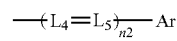

In Formula (IIIA), $L_4$ and $L_5$ each represent a methine group. Ar represents an aryl group. n2 represents an integer of 0 or more. Ar is preferably a phenyl group or a substituted phenyl group (the above-mentioned Va is mentioned as the substituent). $L_4$ and $L_5$ each preferably represent an unsubstituted methine group. n2 is preferably 0 or 1.

In Formula (IA), as $R_4$, a hydrogen atom or the same substituents as $R_1$, $R_2$ and $R_3$ in Formula (IA) are used. $R_4$ preferably represents a hydrogen atom.

The hydrazone compound represented by Formula (IA) may be freely isolated as a salt in a case where the salts are advantageous in terms of synthesis and storage. In such a case, any compound may be used as long as the compound can form a salt with a hydrazine and preferable salts include the followings. Examples thereof include arylsulfonates (for example, p-toluenesulfonate, and p-chlorobenzenesulfonate), aryldisulfonates (for example, 1,3-benzenedisulfonate, 1,5-naphthalenedisulfonate, and 2,6-naphthalenedisulfonate), thiocyanates, picrates, carboxylates (for example, oxalate, acetate, benzoate, and hydrogen-oxalate), hydrohalogenates (for example, hydrochloride, hydrofluoride, hydrobromide, hydroiodide), sulfates, perchlorates, tetrafluoroborates, sulfites, nitrates, phosphates, carbonates and bicarbonates. The hydrogenoxalates, oxalates, and hydrochlorides are preferable.

Formula (IIA) will be described in detail below.

In Formula (IIA), $R_5$ and $R_6$ have the same meanings as $R_1$ and $R_2$ in Formula (IA), and preferable examples thereof are the same groups as those of $R_1$ and $R_2$.

In Formula (IIA), $R_7$ and $R_8$ each preferably represent a hydrogen atom or the same substituents as the above examples of the substituents for $R_1$ and $R_2$ in Formula (IA). $R_7$ and $R_8$ each more preferably represent an unsubstituted alkyl group or a substituted alkyl group, and particularly preferably represent an unsubstituted alkyl group (for example, a methyl group, an ethyl group, a propyl group, or a butyl group), a substituted alkyl group {for example, a sulfoalkyl group (for example, a 2-sulfoethyl group, a 3-sulfopropyl group, a 4-sulfobutyl group, or a 3-sulfobutyl group), a carboxyalkyl group (for example, a carboxymethyl group, or a 2-carboxyethyl group), and a hydroxyalkyl group (for example, a 2-hydroxyethyl group)}.

In Formula (IIA), $V_1$, $V_2$, $V_3$, and $V_4$ each represent a hydrogen atom or a monovalent substituent. The substituent is not particularly limited, and examples thereof include the substituents exemplified above as $R_1$, $R_2$, $R_3$, and Va in Formula (IA). Particularly preferable examples thereof include an unsubstituted alkyl group (for example, a methyl group, or an ethyl group), a substituted alkyl group (for example, a 2-sulfobutyl group, or a 2-carboxyethyl group) and an alkoxy group (for example, a methoxy group, or an ethoxy group).

In Formula (IIA). $L_1$, $L_2$, and $L_3$ each represent an unsubstituted methine group or a substituted methine group (the substituents for the methine group include, for example, the substituents exemplified above as $R_1$, $R_2$, $R_3$, and Va). The unsubstituted methine group is preferable. $n_1$ is preferably 0.

The typical examples of the compound represented by Formulae (IA) and (IIA) are shown below, but the present invention is not limited thereto.

The compound represented by Formula (IA) (the compound represented by Formula (IA) includes the compound represented by Formula (IIA). However, here, examples excluding the compound represented by Formula (IIA) as the compound represented by Formula (IA) will be mentioned.)

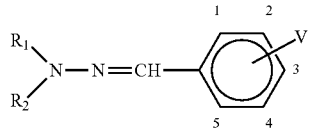

| Compound No. | $R_1$ | $R_2$ | V |
|---|---|---|---|
| IA-1 | $CH_3$ | $CH_3$ | H |
| IA-2 | $CH_3$ | $CH_3$ | 3-$OCH_3$ |
| IA-3 | $CH_3$ | $CH_3$ | 3-Cl |
| IA-4 | $(CH_2)_2SO_3Na$ | $CH_3$ | H |
| IA-5 | $(CH_2)_4SO_2Na$ | $CH_3$ | 1-$CH_3$ |
| IA-6 | $(CH_2)_3SO_3Na$ | $CH_3$ | 1-$OCH_3$ |
| IA-7 | $(CH_2)_2CO_2H$ | $(CH_2)_2CO_2H$ | 2-$OCH_3$ |
| IA-8 | $(CH_2)_2CO_2H$ | $C_2H_5$ | H |
| IA-9 | $(CH_2)_3OH$ | $CH_3$ | 3-$SCH_3$ |
| IA-10 | $(CH_2)_2CO_2C_2H_5$ | $CH_3$ | 2,4-$Cl_2$ |
| IA-11 | $(CH_2)_2CN$ | $CH_3$ | 1,5-$(CH_3)_2$ |
| IA-12 | $(CH_2)_3NHCOCH_3$ | $CH_3$ | H |
| IA-13 | $(CH_2)_2SO_3Na$ | $(CH_2)_2SO_3Na$ | H |
| IA-14 | $CH_3$ | ⟨phenyl⟩ | 3-$OC_2H_5$ |
| IA-15 | ⟨phenyl⟩ | ⟨phenyl⟩ | H |
| IA-16 | ⟨pyrrolidinyl–N=CH–phenyl⟩ | | |
| IA-17 | ⟨piperidinyl–N=CH–benzodioxole⟩ | | |
| IA-18 | ⟨morpholinyl–N=CH–phenyl⟩ | | |
| IA-19 | $CH_3$,$CH_3$ / $(CH_2)_2CH_3$,$(CH_2)_2CH_3$ ($CO_2H)_2$ | | |
| IA-20 | $CH_3$,$CH_3$ / $CH_3$,phenyl ($CO_2H)_2$ | | |
| IA-21 | $CH_3$,$CH_3$ / diphenyl | | |
| IA-22 | $CH_3$,$CH_3$ / cyclohexyl ($CO_2H)_2$ | | |
| IA-23 | $CH_3$,$CH_3$ / cyclopentyl ($CO_2H)_2$ | | |
| IA-24 | $CH_3$,$CH_3$ / pyridyl | | |
| IA-25 | $CH_3$,$CH_3$–N–N=CH–(CH=CH)$_2$–phenyl–N–$CH_3$,$CH_3$ | | |

Compound Represented by Formula (11A)

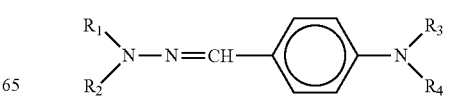

| Compound No. | $R_1$ | $R_2$ | $R_3$ | $R_4$ |
|---|---|---|---|---|
| IIA-1 | $CH_3$ | $CH_3$ | $CH_3$ | $CH_3$ |
| IIA-2 | $CH_3$ | $CH_3$ | $CH_3$ | $(CH_2)_2OH$ |
| IIA-3 | $CH_3$ | $CH_3$ | $CH_3$ | $(CH_2)_2OC_2H_5$ |
| IIA-4 | $CH_3$ | $CH_3$ | $CH_3$ | $CH_2CO_2H$ |
| IIA-5 | $CH_3$ | $CH_3$ | $CH_3$ | $(CH_2)_2N(CH_3)_3^{\oplus} I^{\ominus}$ |
| IIA-6 | $CH_3$ | $CH_3$ | $CH_2CO_2H$ | $CH_2CO_2H$ |
| IIA-7 | $CH_3$ | $CH_3$ | $CH_3$ | $(CH_2)_2SO_3Na$ |
| IIA-8 | $CH_3$ | $CH_3$ | $CH_3$ | $(CH_2)_2Cl$ |
| IIA-9 | $CH_3$ | $CH_3$ | $CH_3$ | $CH_2CN$ |
| IIA-10 | $CH_3$ | $(CH_2)_2SO_3Na$ | $CH_3$ | $CH_3$ |
| IIA-11 | $CH_3$ | $(CH_2)_2SO_3Na$ | $CH_3$ | $(CH_2)_2SO_3Na$ |
| IIA-12 | $(CH_2)_2SO_3Na$ | $(CH_2)_2SO_3Na$ | $CH_3$ | $CH_3$ |
| IIA-13 | $CH_3$ | $(CH_2)_3OH$ | $CH_3$ | $CH_3$ |
| IIA-14 | $CH_3$ | $(CH_2)_2CO_2H$ | $CH_3$ | $CH_3$ |
| IIA-15 | $CH_3$ | $(CH_2)_2CN$ | $CH_3$ | $CH_3$ |
| IIA-16 | $CH_3$ | $(CH_2)_3NHCOCH_3$ | $CH_3$ | $CH_3$ |
| IIA-17 | $CH_3$ | $(CH_2)_2CO_2C_2H_5$ | $CH_3$ | $CH_3$ |

IIA-18

IIA-19

IIA-20

IIA-21

IIA-22

IIA-23

IIA-24

IIA-25

-continued

| Compound No. | R₁ | R₂ | R₃ | R₄ |
|---|---|---|---|---|
| IIA-26 | | | | |
| IIA-27 | | | | |
| IIA-28 | | | | |
| IIA-29 | | | | |
| IIA-30 | | | | |
| IIA-31 | | | | |

The compound represented by Formula (IA) (including Formula (IIA)) can be more easily produced by a known method. That is, the compound can be obtained by adding a small amount of acids (for example, acetic acid, and hydrochloric acid) as condensing agents, if necessary, and condensing hydrazones with aldehydes or ketones. Specific methods are described in JP1985-034099B (JP-S60-034099B), JP1985-034100B (JP-S60-034100B), and the like.

Further, reductones represented by Formula (A) or Formula (B) are also preferable as the electron donating type quencher used in the present invention.

Formula (A)

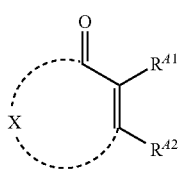

In Formula (A), $R^{A1}$ and $R^{A2}$ each independently represent a hydroxy group, an amino group, an acylamino group, an alkylsulfonylamino group, an arylsulfonylamino group, an alkoxycarbonylamino group, a mercapto group, or an alkylthio group. X represents a non-metal atom group which is constituted of a carbon atom and an oxygen atom and/or a nitrogen atom and which constitutes a 5- or 6-membered ring together with —C(=O)—C($R^{A1}$)=C($R^{A2}$)—.

$R^{A1}$ and $R^{A2}$ each preferably represent a hydroxy group, an amino group, an alkylsulfonylamino group, or an arylsulfonylamino group, more preferably represent a hydroxy group or an amino group, and even more preferably represent a hydroxy group.

In Formula (A), it is preferable that X has at least one —O— bond, and is formed by combining one or two or more of —C($R^{A3}$)($R^{A4}$)—, —C($R^{A5}$)=, —C(=O)—, —N(Ra)— and N=. Here, $R^{A3}$ to $R^{A5}$ and Ra each independently preferably represent a hydrogen atom, an alkyl group having 1 to 10 carbon atoms which may have a substituent, an aryl group having 6 to 15 carbon atoms which may have a substituent, a hydroxy group, or a carboxyl group.

Examples of the 5- or 6-membered ring formed through X in Formula (A) include a cyclopentenone ring (2-cyclopenten-1-one ring; the formed compound is reductic acid), a furanone ring [2(5H)-furanone ring], a dihydropyranone ring [3,4-dihydro-2H-pyran-4-one ring (2,3-dihydro-4H-pyrone ring), a 3,6-dihydro-2H-pyran-2-one ring, a 3,6-dihydro-2H-pyran-6-one ring (5,6-dihydro-2-pyrone ring)], and a 3,4-dihydro-2H-pyrone ring. Preferable are the cyclopentenone ring, the furanone ring, and the dihydropyrone ring, more preferable are the furanone ring, and the dihydropyrone ring, and particularly preferable is the furanone ring.

These rings may be condensed, and a condensed ring may be any of a saturated ring and an unsaturated ring.

Among the reductones represented by Formula (A), a compound represented by Formula (A1) is preferable, and among these, a compound represented by Formula (A2) is more preferable.

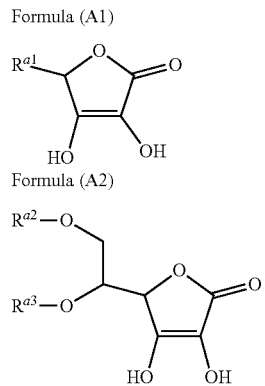

In Formula (A1), $R^{a1}$ represents a hydrogen atom, an alkyl group, an aryl group, or a heterocyclic group, and these group may have a substituent.

$R^{a1}$ is preferably an alkyl group which may have a substituent, and more preferably —CH(OR)CH$_2$OR$^{a2}$, and in this case, the preferable compound is the compound represented by Formula (A2).

In Formula (A2), $R^{a2}$ and $R^{a3}$ each independently represent a hydrogen atom, an alkyl group, an acyl group, or an alkoxycarbonyl group, and $R^{a2}$ and $R^{a3}$ may be bonded to each other to form a ring. The formed ring is preferably a 1,3-dioxolane ring, and the ring may further have a substituent. A compound having a dioxolane ring can be synthesized by acetalization or ketalization by the reaction of ascorbic acid with ketones or aldehydes, and ketones and aldehydes as raw materials can be used without particular limitation.

In Formula (A2), one of particularly preferable combinations of substituents is a compound wherein $R^{a2}$ is an acyl group and $R^{a3}$ is a hydrogen atom, the acyl group may be any of an aliphatic acyl group and an aromatic acyl group, and in a case of an aliphatic acyl group, the aliphatic acyl group preferably has 2 to 30 carbon atoms, more preferably 4 to 24 carbon atoms, and still more preferably 8 to 18 carbon atoms. In the case of an aromatic acyl group, the aromatic acyl group preferably has 7 to 24 carbon atoms, more preferably 7 to 22 carbon atoms, and still more preferably 7 to 18 carbon atoms. Specific examples of the preferable acyl group may include butanoyl, hexanoyl, 2-ethylhexanoyl, decanoyl, lauroyl, myristoyl, palmitoyl, stearoyl, palmitoleyl, myristoleyl, oleoyl, benzoyl, 4-methyl-benzoyl, and 2-methylbenzoyl.

A compound represented by Formula (B) as well as a compound represented by Formula (A) is preferable.

Formula (B)

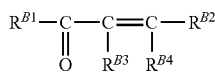

In Formula (B), $R^{B1}$ and $R^{B2}$ each independently represent a hydrogen atom, an alkyl group, an alkenyl group, a cycloalky group, an aryl group, an acyl group, a carboxyl group, an amino group, an alkoxy group, an alkoxycarbonyl group, or a heterocyclic group, and $R^{B3}$; and $R^{B4}$ each independently represent a hydroxy group, an amino group, an acylamino group, an alkylsulfonyl group, an arylsulfonylamino group, an alkoxycarbonylamino group, or a mercapto group.

The alkyl group in $R^{B1}$ and $R^{B2}$ preferably has 1 to 10 carbon atoms. The alkyl group is preferably methyl, ethyl, or t-butyl.

The alkenyl group in $R^{B1}$ and $R^{B2}$ preferably has 2 to 10 carbon atoms. The alkenyl group is preferably vinyl or allyl, and more preferably vinyl.

The cycloalkyl group in $R^{B1}$ and $R^{B2}$ preferably has 3 to 10 carbon atoms. The cycloalkyl group is preferably cyclopropyl, cyclopentyl, or cyclohexyl.

These alkyl group, alkenyl group and cycloalkyl group may have a substituent, and the substituent is preferably at least one selected from a hydroxy group, a carboxyl group and a sulfo group.

In a case the alkenyl group is vinyl, a vinyl group substituted with a carboxyl group is preferable.

The aryl group in $R^{B1}$ and $R^{B2}$ preferably has 6 to 12 carbon atoms. The aryl group may have a substituent, and the substituent is preferably at least one selected from an alkyl group, a hydroxy group, a carboxyl group, a sulfo group, a halogen atom, a nitro group, and a cyano group.

The acyl group in $R^{B1}$ and $R^{B2}$ is preferably formyl, acetyl, isobutyryl, or benzoyl.

The amino group in $R^{B1}$ and $R^{B2}$ includes an amino group, an alkylamino group, and an aryl amino group, and amino, methylamino, dimethylamino, ethylamino, diethylamino, dipropylamino, phenylamino, N-methyl-N-phenyl amino are preferable.

The alkoxy group in $R^{B1}$ and $R^{B2}$ preferably has 1 to 10 carbon atoms. The alkoxy group is preferably methoxy or ethoxy.

The alkoxycarbonyl group in $R^{B1}$ and $R^{B2}$ is preferably methoxycarbonyl.

In the heterocyclic group in $R^{B1}$ and $R^{B2}$, the ring constituting hetero atoms is preferably an oxygen atom, a sulfur atom, or a nitrogen atom, and the ring structure is preferably a 5-membered ring or a 6-membered ring. The heterocyclic group can be either an aromatic heterocyclic group or a saturated heterocyclic group and may be condensed.

The heterocyclic rings in the heterocyclic group is preferably a pyridine ring, a pyrimidine ring, a pyrrole ring, a furan ring group, a thiophene ring, a pyrazole ring, piperidine ring, a piperazine ring, or a morpholine ring.

$R^{B1}$ and $R^{B2}$ more preferably represent an alkyl group having 1 to 6 carbon atoms or an aryl group having 6 to 12 carbon atoms.

The amino group in $R^{B3}$ and $R^{B4}$ includes an amino group, an alkylamino group, and an arylamino group, and an amino group or an alkylamino group, such as methylamino, ethylamino, n-butylamino, or hydroxyethylamino, is preferable.

The acylamino group in $R^{B3}$ and $R^{B4}$ is preferably acetylamino or benzoylamino.

The alkylsulfonylamino group in $R^{B3}$ and $R^{B4}$ is preferably methylsulfonylamino.

The arylsulfonylamino group in $R^{B3}$ and $R^{B4}$ is preferably benzenesulfonylamino or p-toluenesulfonylamino.

The alkoxycarbonylamino group in $R^{B3}$ and $R^{B4}$ is preferably methoxycarbonylamino.

$R^{B3}$ and $R^{B4}$ each more preferably represent a hydroxy group, an amino group, an alkylsulfonylamino group, or an arylsulfonylamino group.

As the electron donating type quencher used in the present invention, reductones are more preferable. Specific examples thereof include the compounds exemplified in paragraphs 0014 to 0034 of JP2008-027599A (JP-H06-027599A), paragraphs 0012 to 0020 of JP2008-110163A (JP-H06-110163A), and paragraphs 0022 to 0031 of JP2010-114899A (JP-108-114899A).

Among these, myristic acid esters of L-ascorbic acid, palmitic acid esters and stearic acid esters are particularly preferable.

Hydroquinones, aminophenols, aminonaphthols, 3-pyrazolidinones, saccharin, and precursors thereof, picoliniums are also preferable as the electron donating type quencher used in the present invention. Examples thereof are shown below.

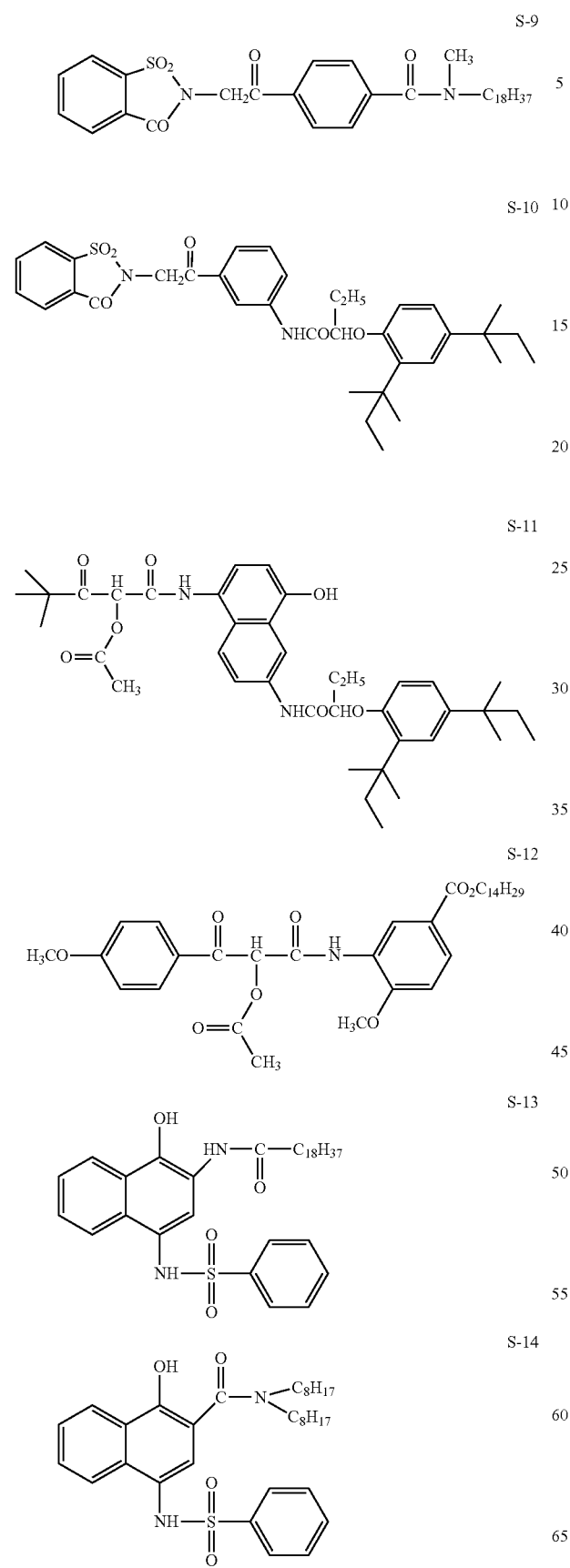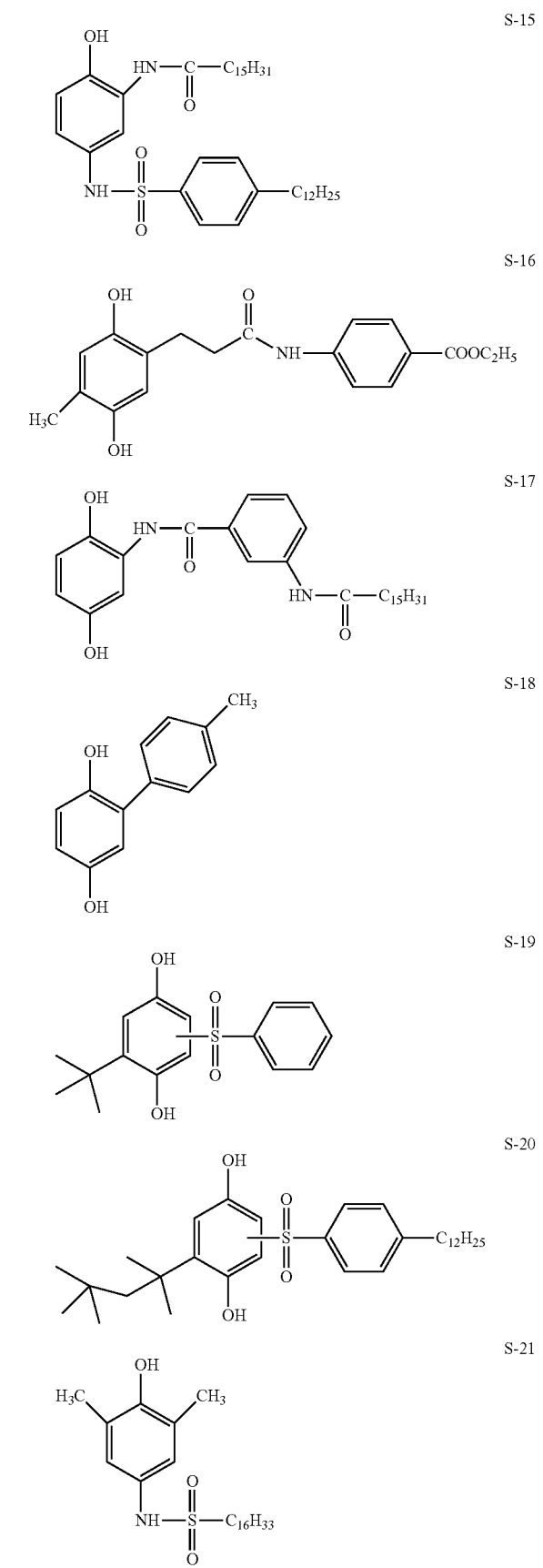

-continued

S-22 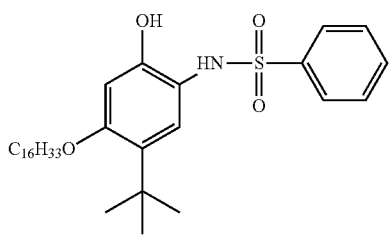

S-23 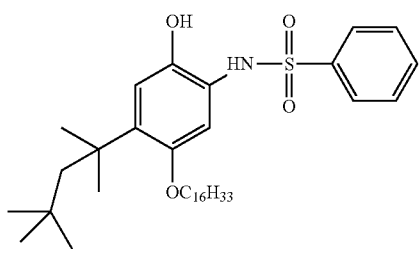

S-24 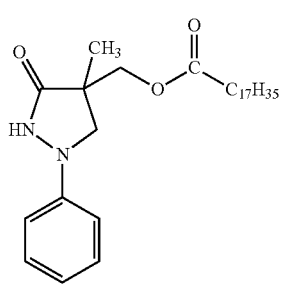

S-25 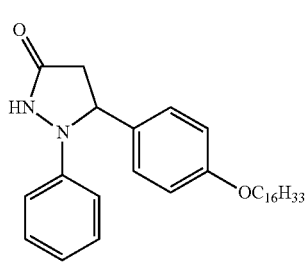

S-26 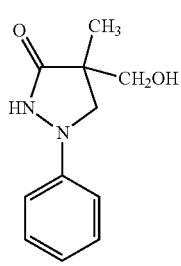

S-27 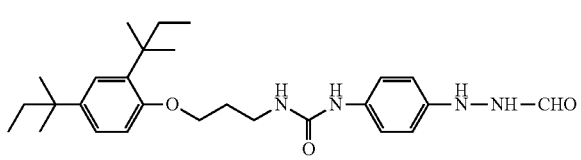

S-28 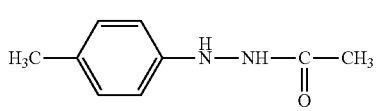

-continued

S-29 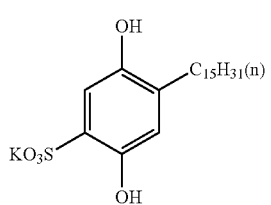

S-30 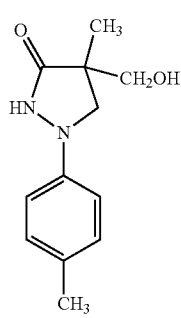

S-31 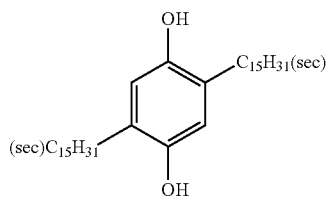

S-32 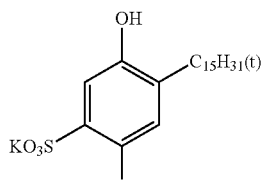

S-33 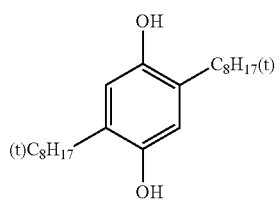

—Electron Accepting Type Quencher—

Next, the electron accepting type quencher used in the present invention will be described.

The electron accepting type quencher used in the present invention receives an electron from the SOMO of a high energy level of two SOMOs of the coloring agent in the excited state and then donates the electron to the SOMO of the low energy level of the coloring agent to deactivate the coloring agent in the excited state to the ground state.

The energy level of the LUMO of the electron accepting type quencher used in the present invention satisfies Relational Expression [B-1] below with respect to the energy level of the LUMO of the coloring agent used in the present invention.

$$E_{Ld} - E_{Lq} \leq 0 \text{ eV} \qquad \text{Relational Expression [B-1]}$$

where $E_{Ld}$ and $E_{Lq}$ respectively represent the following values, $E_{Ld}$: energy level of LUMO of coloring agent, and $E_{Lq}$: energy level of LUMO of electron accepting type quencher.

By satisfying Relational Expression [B-1] above, the electron transfer from the coloring agent in the excited state to the electron accepting type quencher easily occurs, and quenching can be performed efficiently.

The energy level of the LUMO of the electron accepting type quencher in the present invention more preferably satisfies Relational Expression [B-2] below with respect to the energy level of the LUMO of the coloring agent used in the present invention, and still more preferably satisfies Relational Expression [B-3] below.

$$E_{Ld} - E_{Lq} \leq -0.2 \text{ eV} \quad \text{Relational Expression [B-2]}$$

$$E_{Ld} - E_{Lq} \leq -0.4 \text{ eV} \quad \text{Relational Expression [B-3]}$$

The energy levels of the coloring agent and the electron accepting type quencher can be calculated by the same method as described above in the description of the electron donating type quencher.

A phthalimide compound represented by Formula (E) can be preferably used as the electron accepting type quencher used in the present invention.

Formula (E)

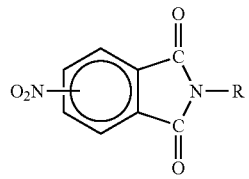

In Formula (E), R represents a monovalent organic group having 1 to 14 carbon atoms selected from the group consisting of an alkyl group, an aromatic hydrocarbon group, a halogen atom, a nitro group, and/or an aromatic hydrocarbon group substituted with an alkyl group.

Specific examples of the compound represented by Formula (E) are shown below.

E-1

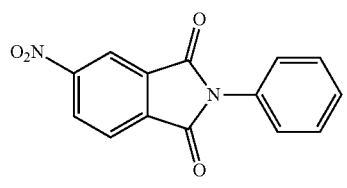

E-2

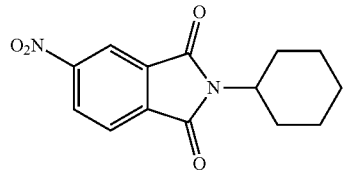

E-3

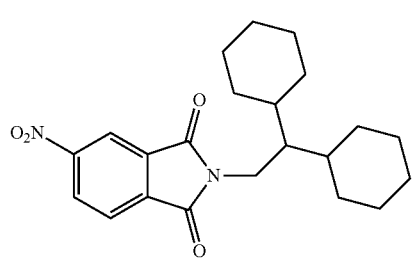

E-4

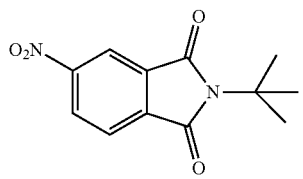

E-5

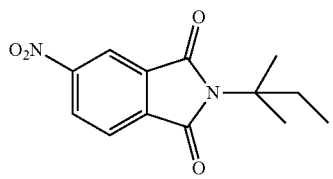

E-6

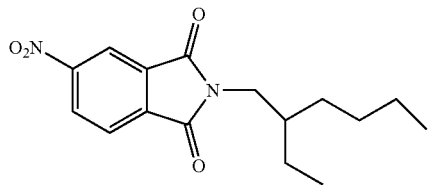

Naphthalimides having the following structures can also be preferably used as the electron accepting type quencher used in the present invention.

Formula (IB)

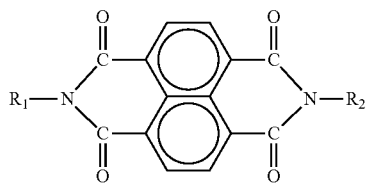

In Formula (IB), $R_1$ and $R_2$ each represent an alkyl group having 20 or less carbon atoms, a substituted alkyl group, and an aryl group having or not having a substituent, and $R_1$ and $R_2$ may be the same as or different from each other. Examples of the substituted alkyl group include a hydroxyethyl group and a benzyl group. The aryl group represents a phenyl group, a naphthyl group and the like, and the substituent thereof represents a halogen, a lower alkyl group, a nitro group, an amino group, and the like.

Phthalimides having the following structures can also be preferably used as the electron accepting type quencher used in the present invention.

Formula (IIB)

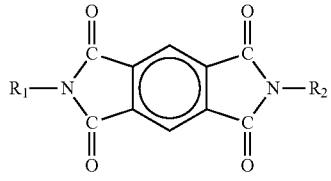

In Formula (IIB), $R_1$ and $R_2$ each represent an alkyl group having 20 or less carbon atoms (including a cycloalkyl group), a substituted alkyl group, and an aryl group having or not having a substituent, and $R_1$ and $R_2$ may be the same as or different from each other. Examples of the substituted alkyl group include a hydroxyethyl group and a benzyl group. The aryl group represents a phenyl group, a naphthyl group and the like, and the substituent thereof represents a halogen, a (lower) alkyl group, a nitro group, an amino group, and the like.
Specific examples are shown below.
1
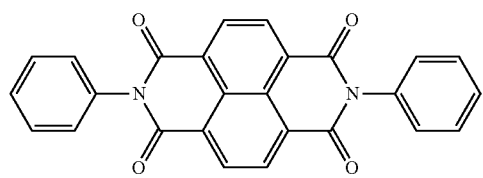
2
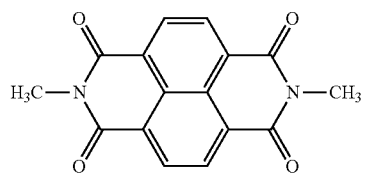
3
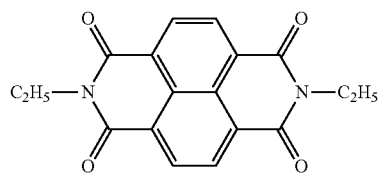
4
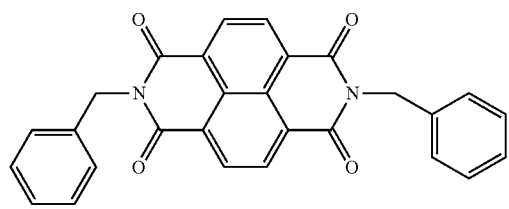
5
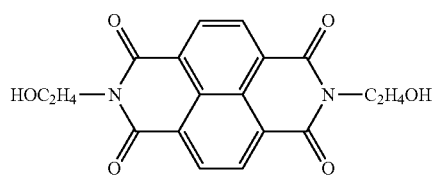
6
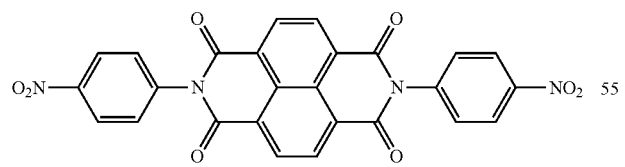
7
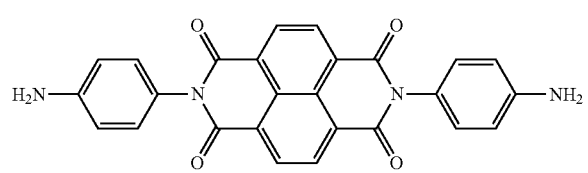
-continued
8
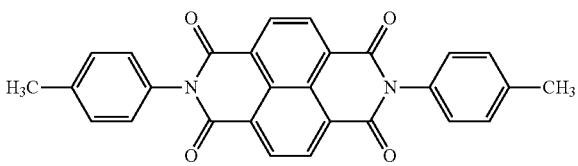
9
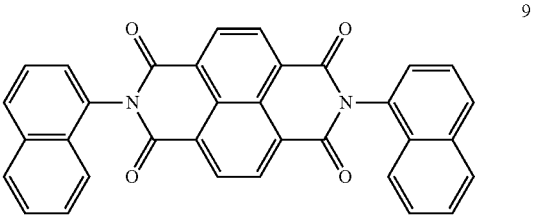
10
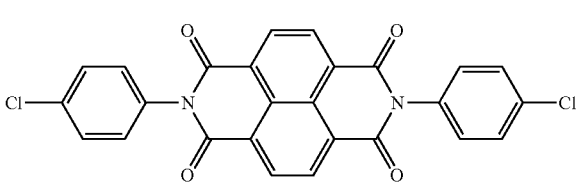
11
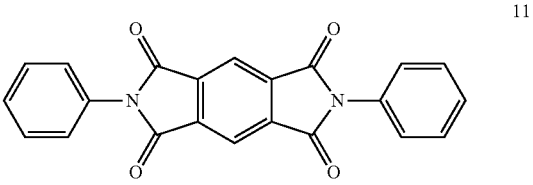
12
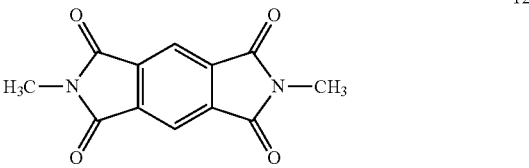
13
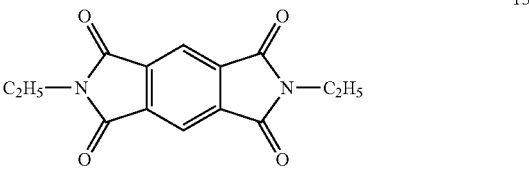
14
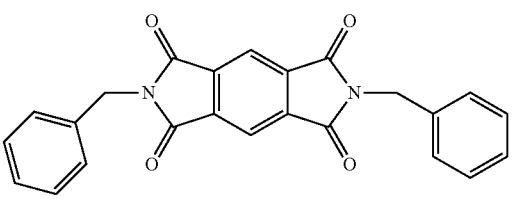
16
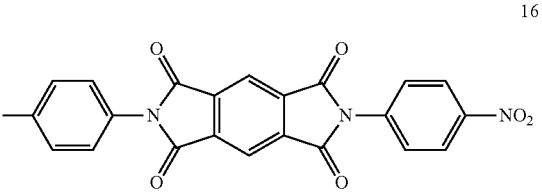

-continued

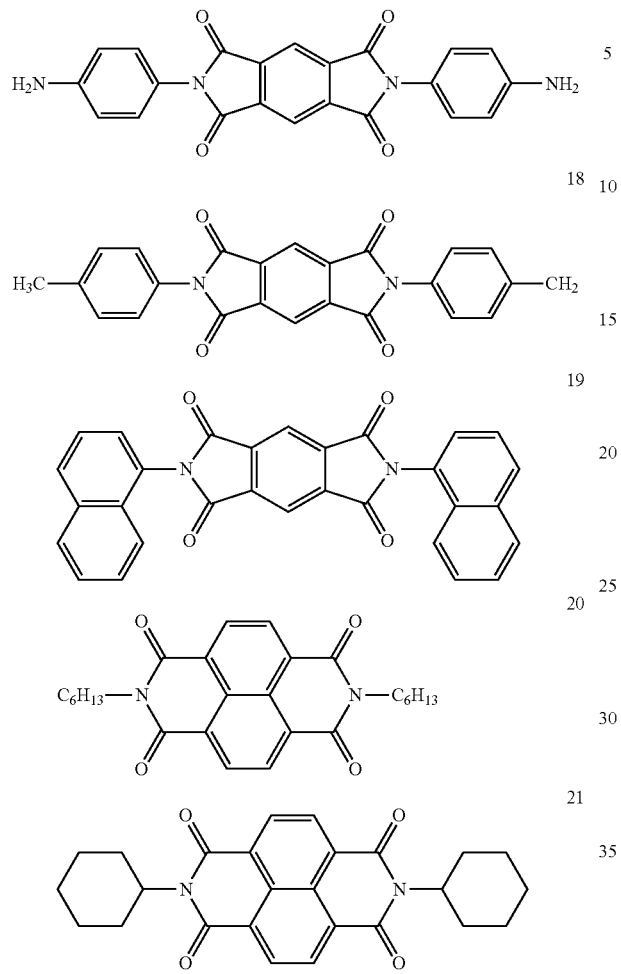

Quinones represented by Formula (IIC) can also be preferably used as the electron accepting type quencher used in the present invention.

Formula (IIC)

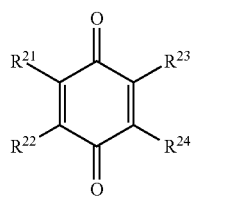

{in Formula (IIC), $R^{21}$, $R^{22}$, $R^{23}$, and $R^{24}$ each represent a hydrogen atom, a substituted or unsubstituted alkyl group having 1 to 10 carbon atoms, a substituted or unsubstituted alkoxy group having 1 to 10 carbon atoms, a substituted or unsubstituted alkylthio group having 1 to 10 carbon atoms, a substituted or unsubstituted aryl group, a substituted or unsubstituted arylthio group, a substituted or unsubstituted aryloxy group, a halogen atom, or a cyano group. $R^{21}$ and $R^{22}$ or $R^{23}$ and $R^{24}$ may be linked to each other to form a ring.}

Specific examples are shown below.

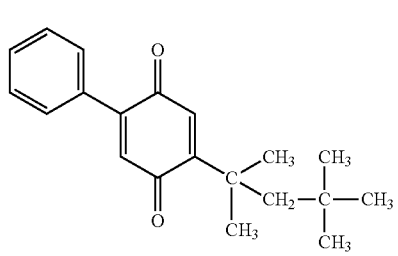
IIC-1

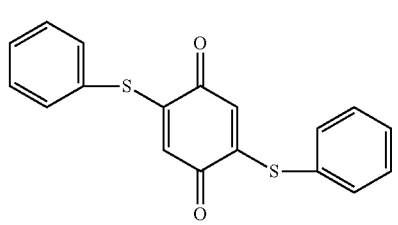
IIC-2

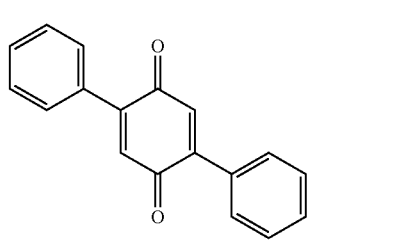
IIC-3

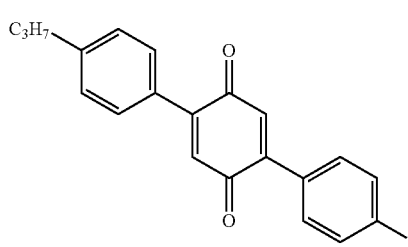
IIC-4

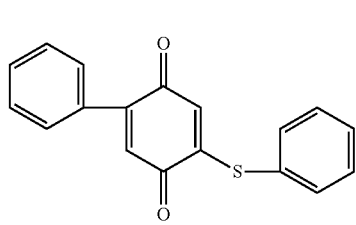
IIC-5

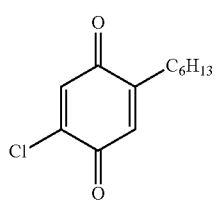
IIC-6

IIC-7

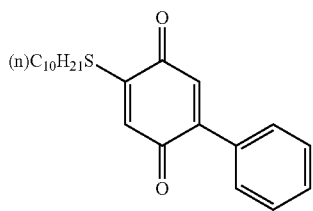

IIC-8

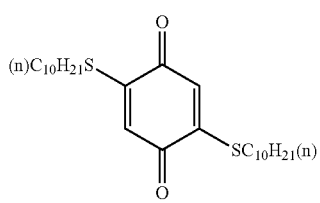

IIC-9

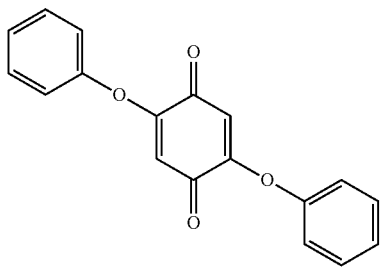

IIC-10

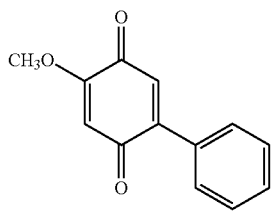

IIC-11

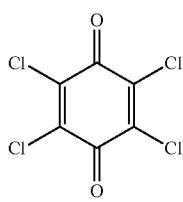

IIC-12

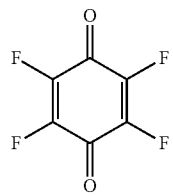

The content of the polarization degree improver in the filter according to the embodiment of the present invention is preferably 0% to 6% by mass, more preferably 0.1% to 5% by mass, and still more preferably 0.3% to 4.5% by mass. By controlling the amount of the polarization degree improver added to be equal to or less than the above upper limit value, the degree of polarization can be improved without causing side effects such as discoloration of the filter.

(Coloring Agent Containing Polarization Degree Improver)

The polarization degree improver used in the present invention is preferably linked to the coloring agent by a covalent bond through a linking group, if necessary, to form a coloring agent containing a polarization degree improver. The coloring agent having such an embodiment is also included in the squarine-based coloring agent represented by Formula (I) defined in the present invention.

The energy levels of the coloring agent portion and the polarization degree improver portion of the coloring agent containing a polarization degree improver according to the present invention can be calculated by the same method as the above-mentioned calculation method of the energy levels of the coloring agent and the polarization degree improver. In the potential measurement, two oxidation potentials are detected from the coloring agent containing a polarization degree improver used in the present invention. However, a value close to the oxidation potential of the coloring agent without a polarization degree improver is used as an oxidation potential of the coloring agent portion, and a value far from the above oxidation potential is used as an oxidation potential of the polarization degree improver portion.

Examples of the coloring agent containing a polarization degree improver used in the present invention are shown below.

AA-1

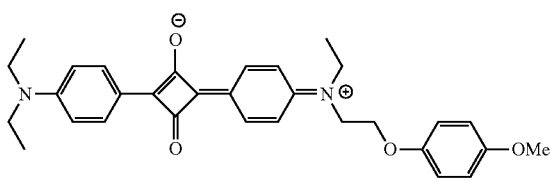

AA-2

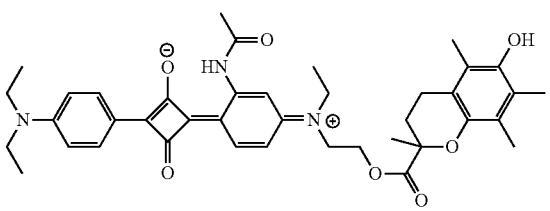

-continued
AA-3
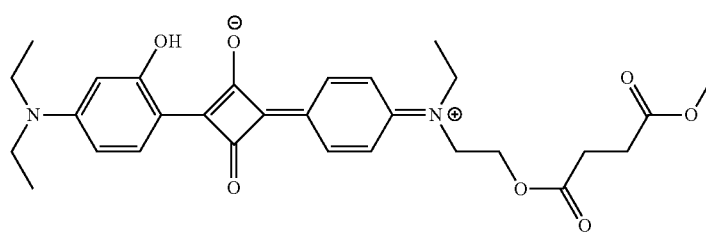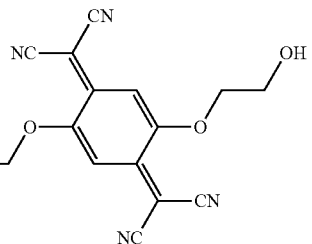
AA-4
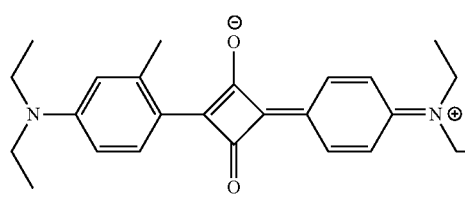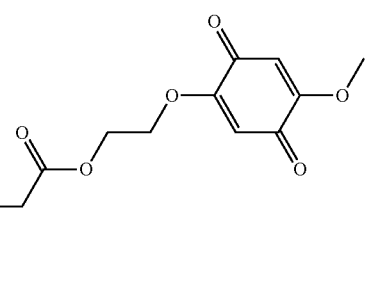
AA-5
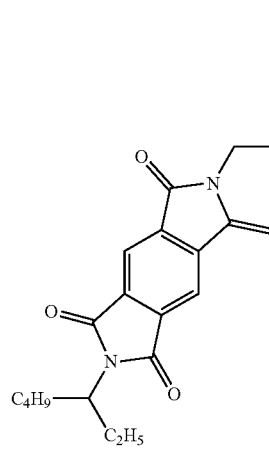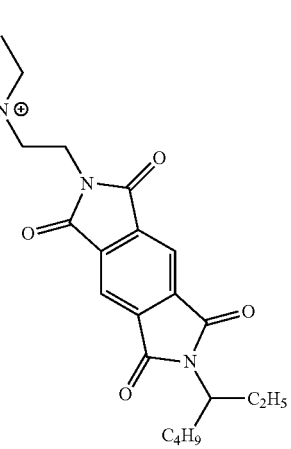
AA-6
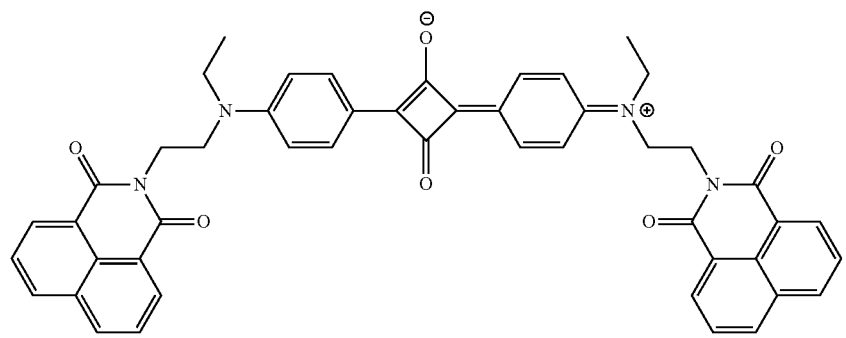
AA-7
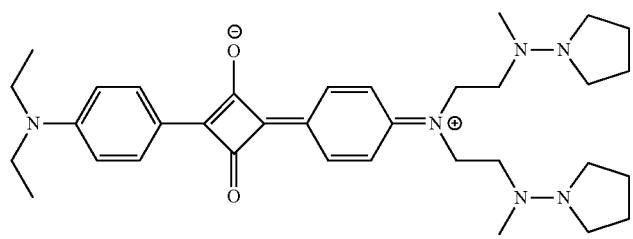

-continued
AA-8
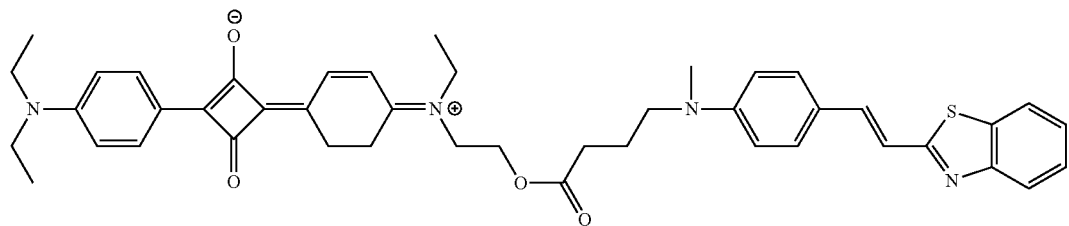
A-9
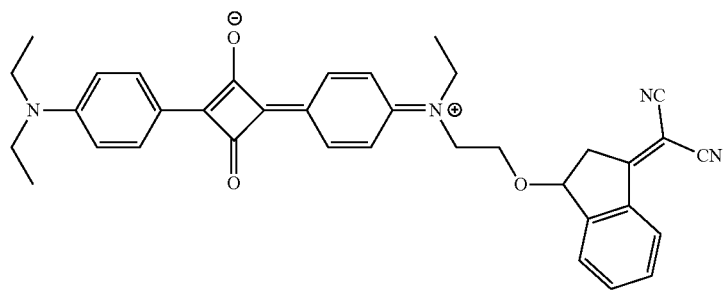
A-10
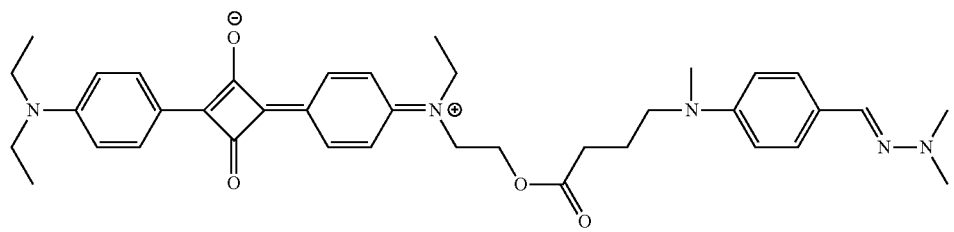
A-11
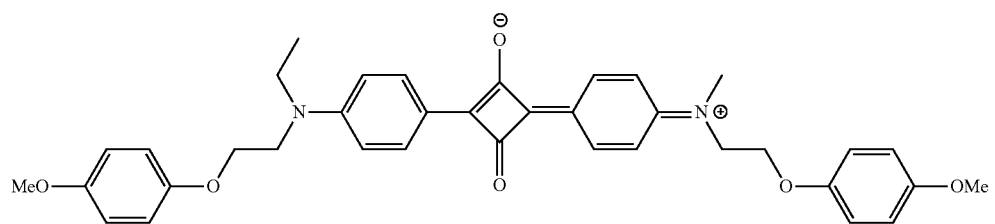
AA-12
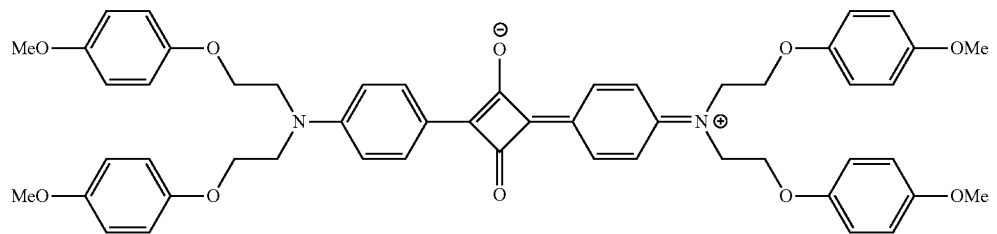
AA-13
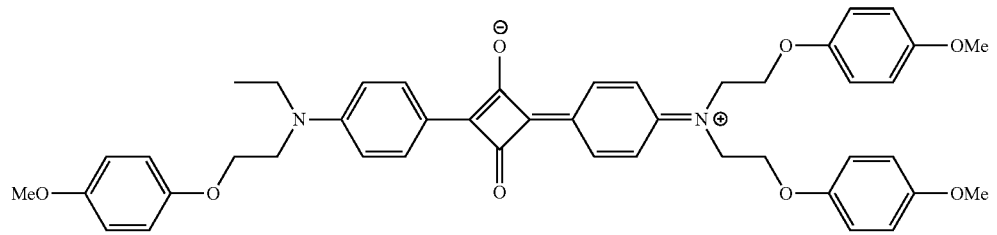

-continued
AA-14
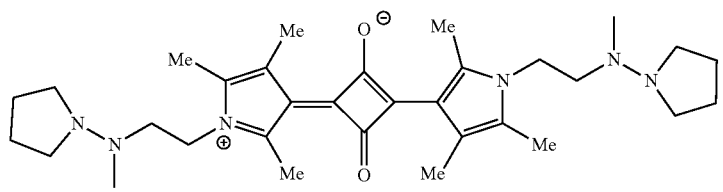
AA-15
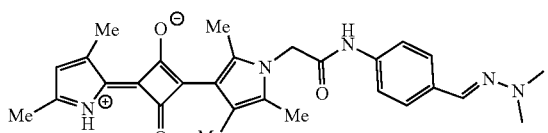
AA-16
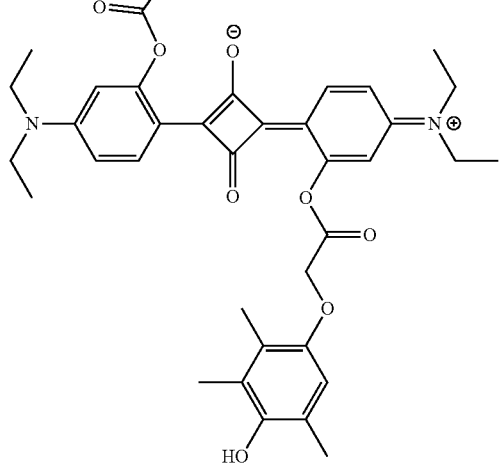
AA-17
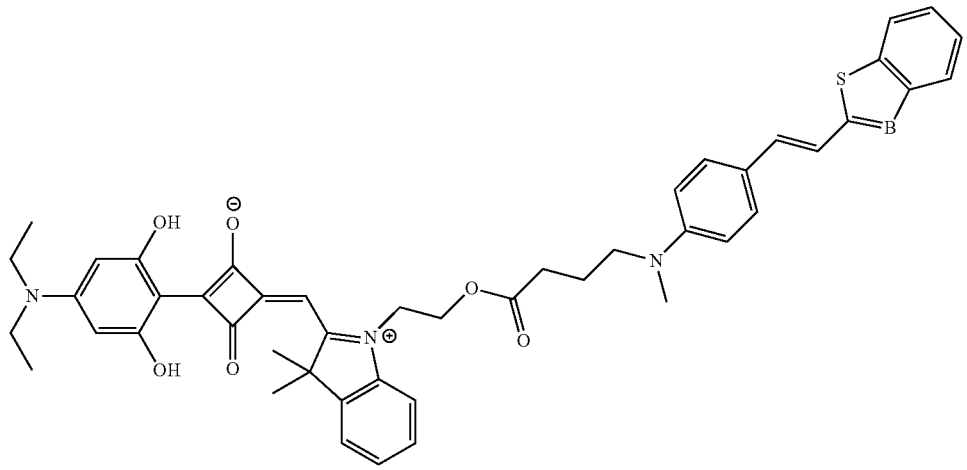
AA-18
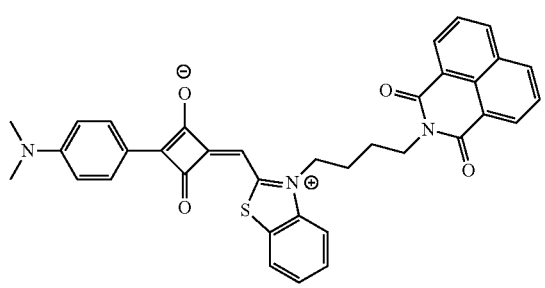
AA-19
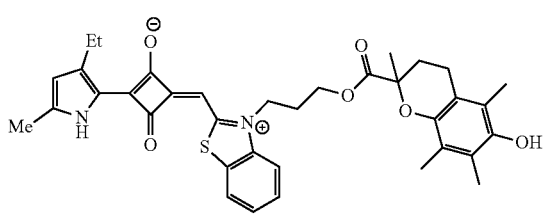

-continued
BB-1
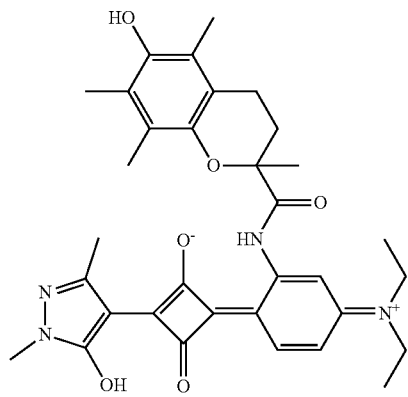
BB-2
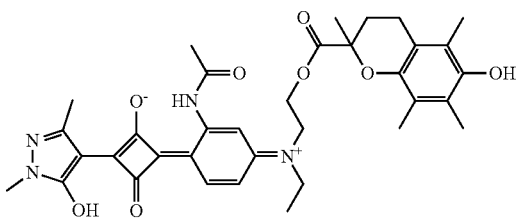
BB-3
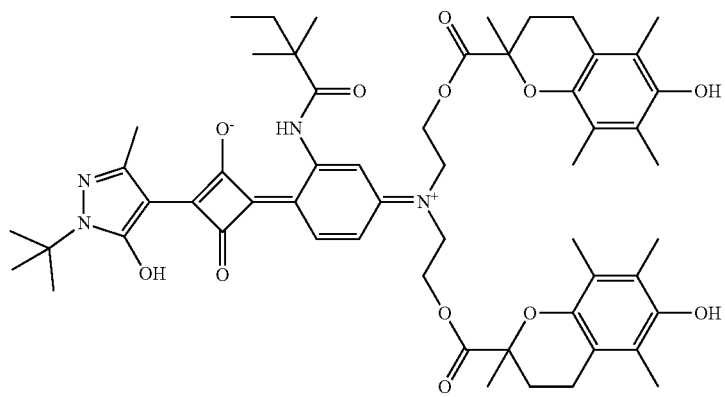
BB-4
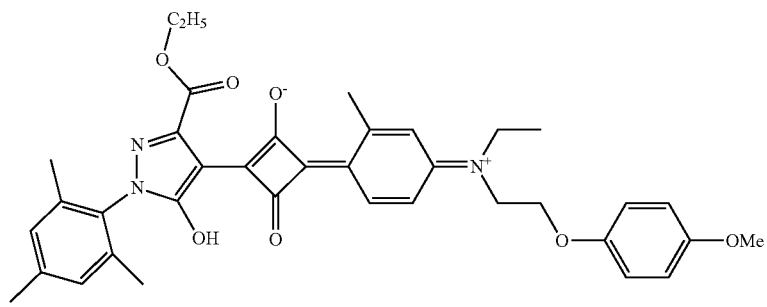
BB-5
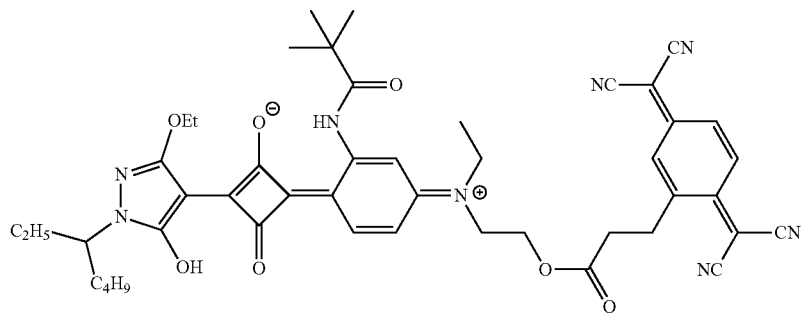

-continued
BB-6
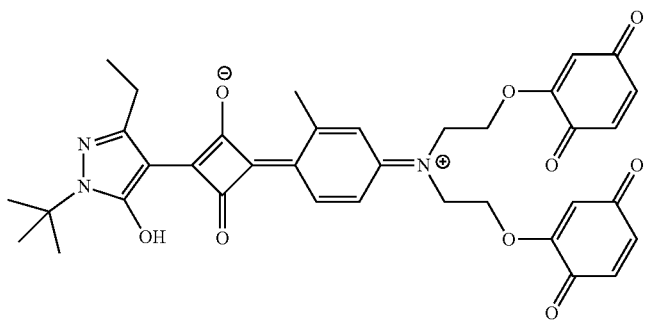
BB-7
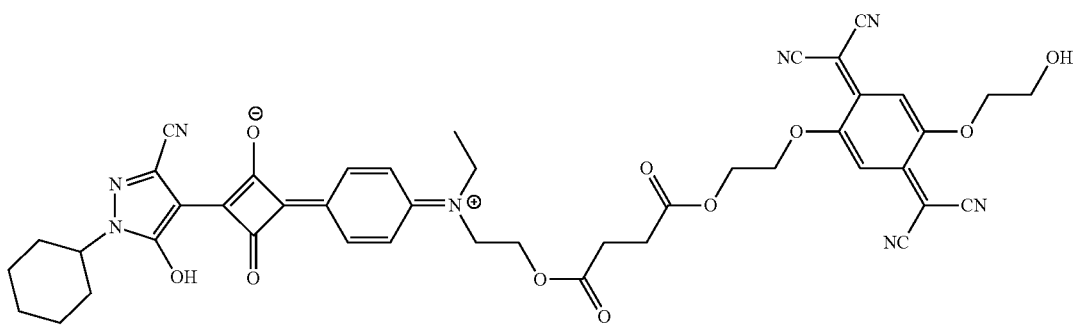
BB-8
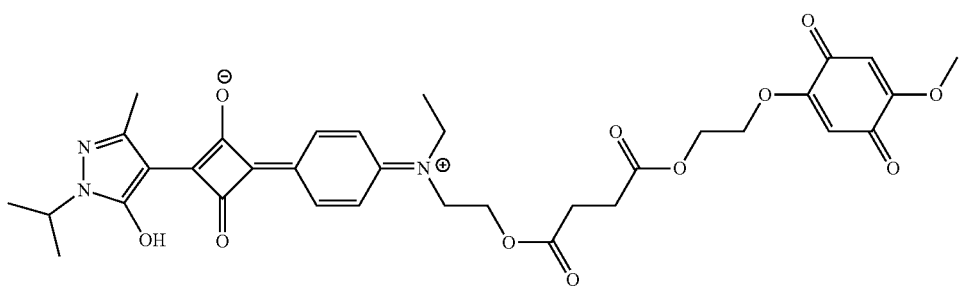
BB-9
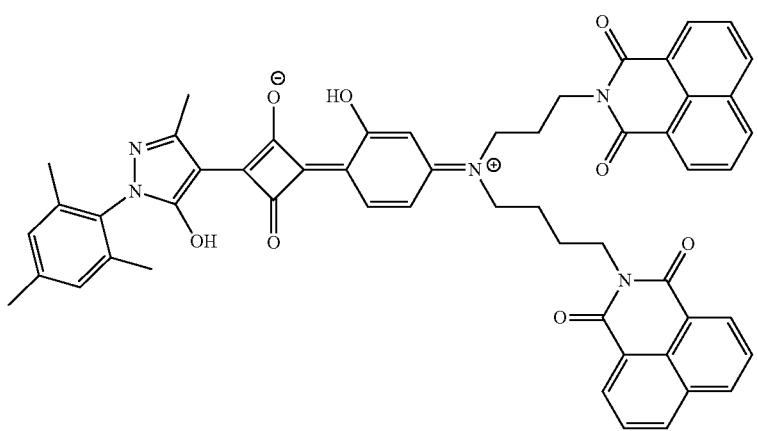

-continued
BB-10
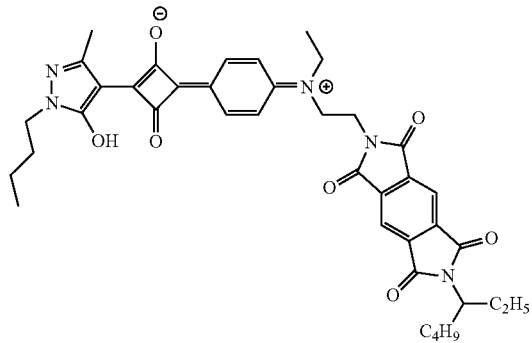
BB-11
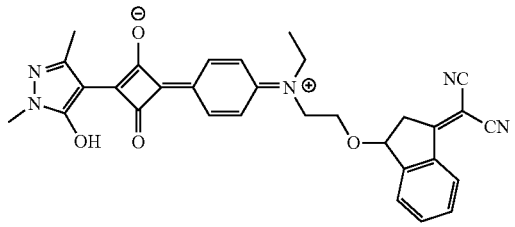
BB-12
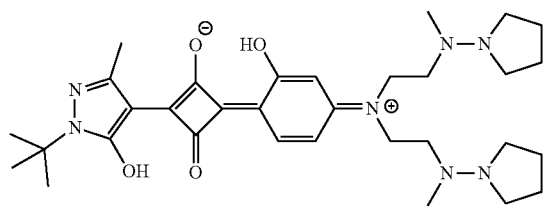
BB-13
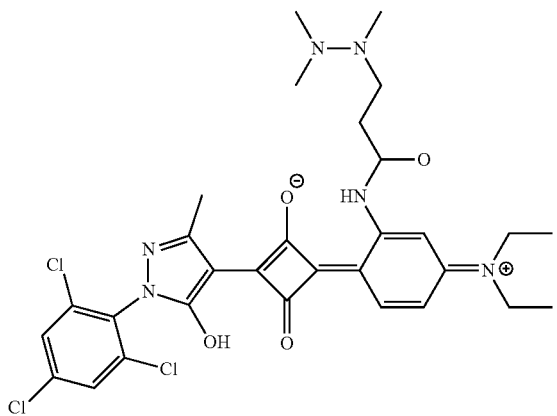
BB-14
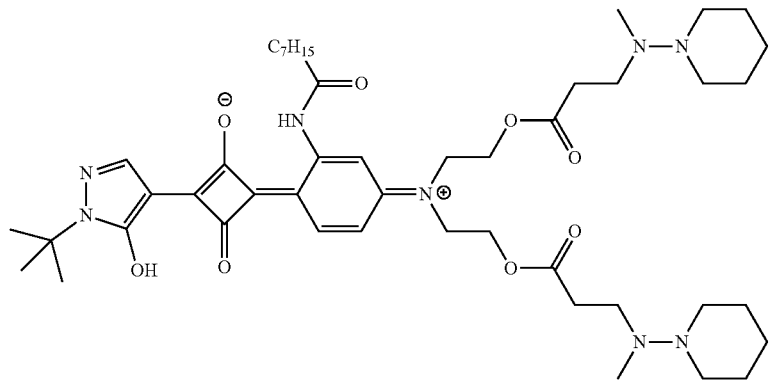
BB-15
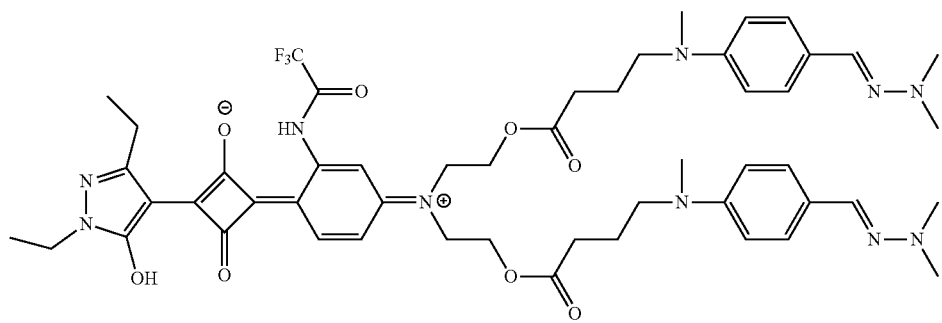

BB-16
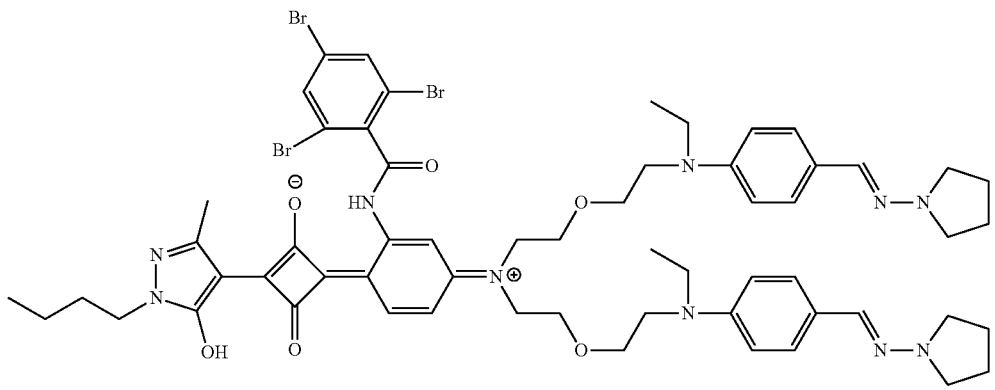
BB-17
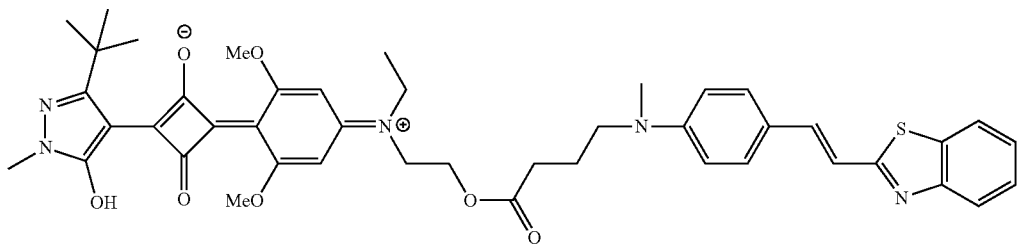
BB-18
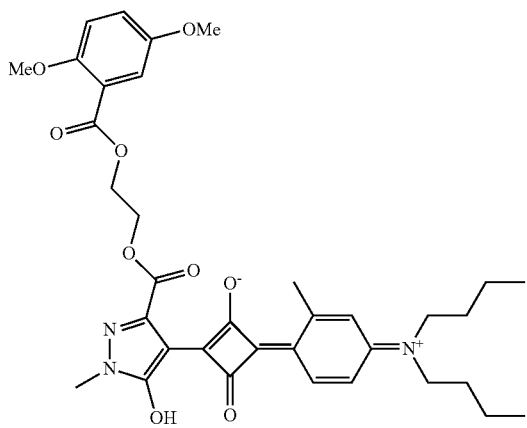
BB-19
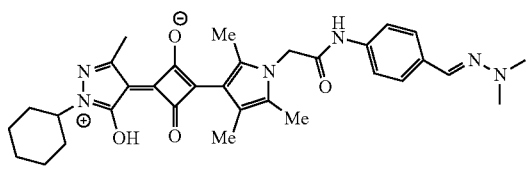
BB-20
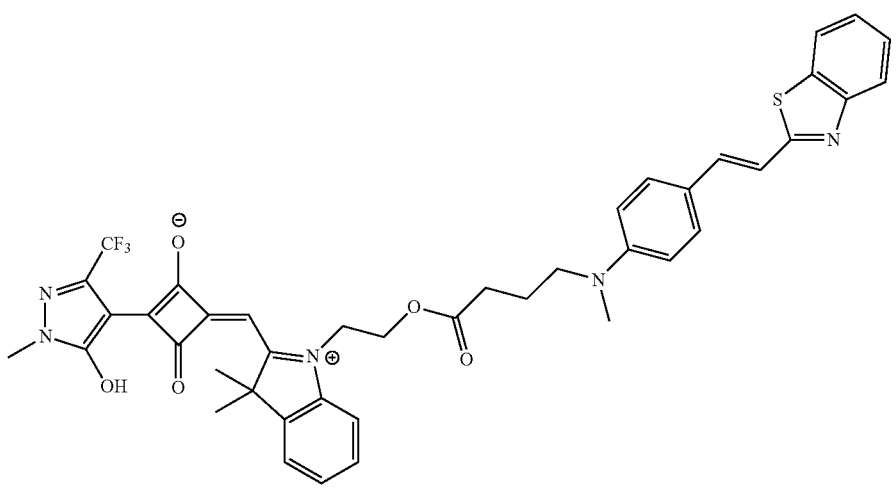

-continued
BB-21
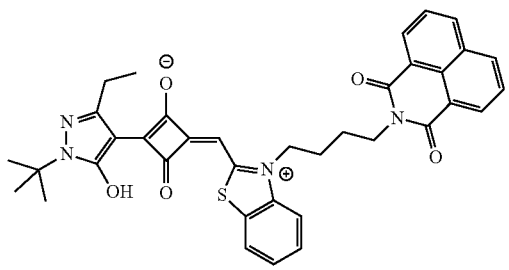
BB-22
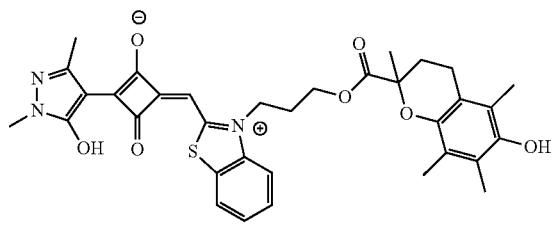
BB-23
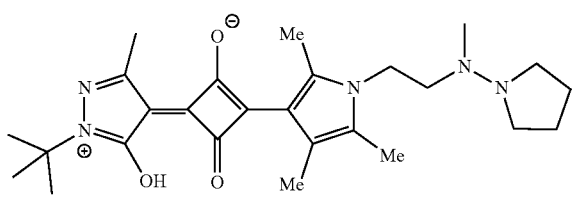
C-1
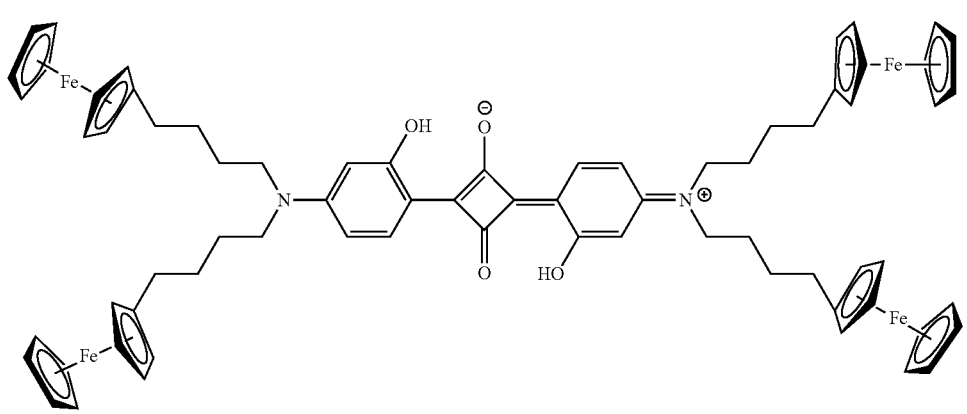
C-2
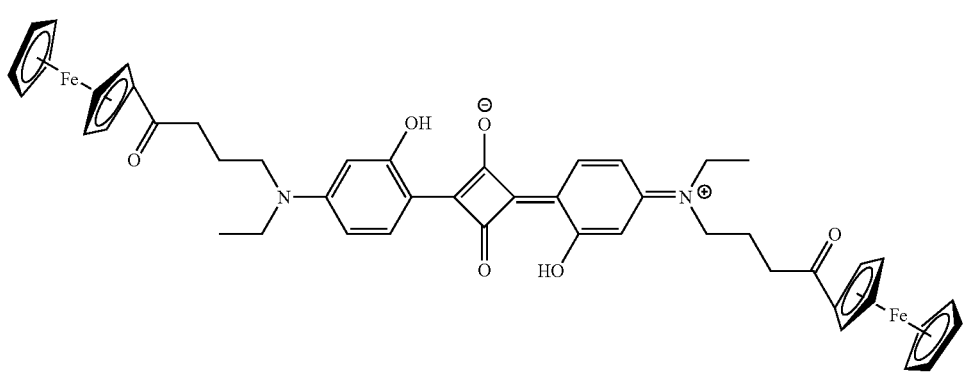

-continued
C-3
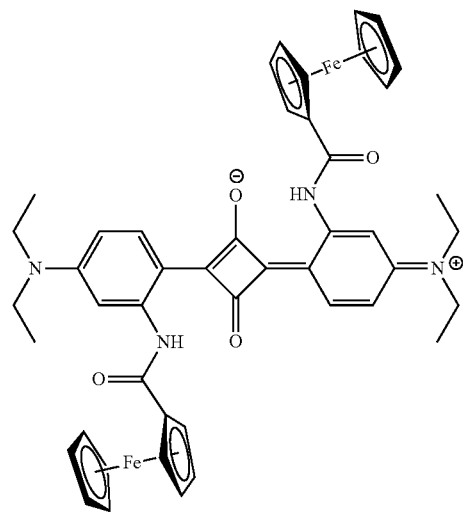
C-4
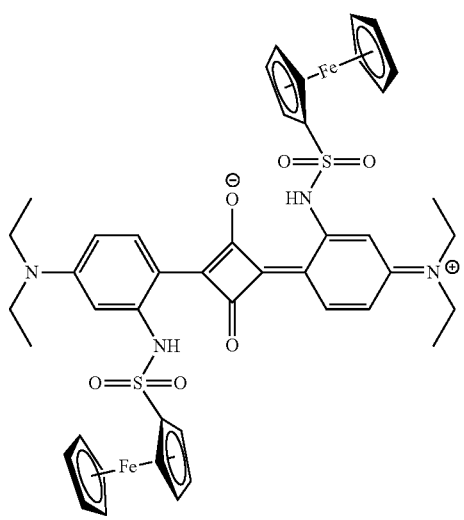
C-5
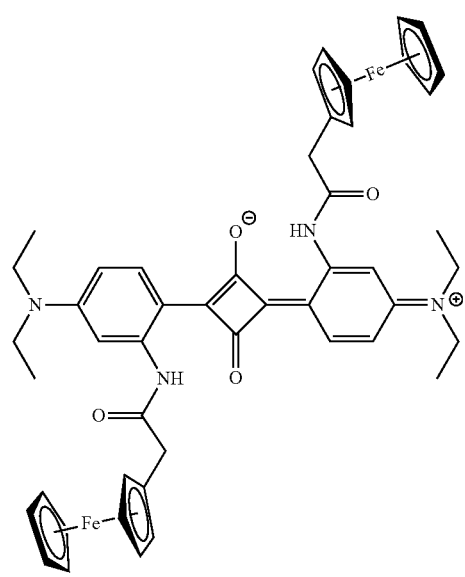
C-6
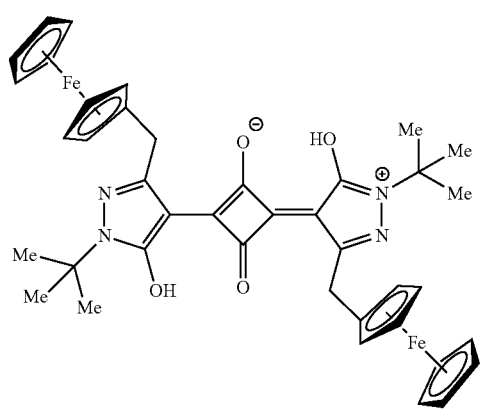
C-7
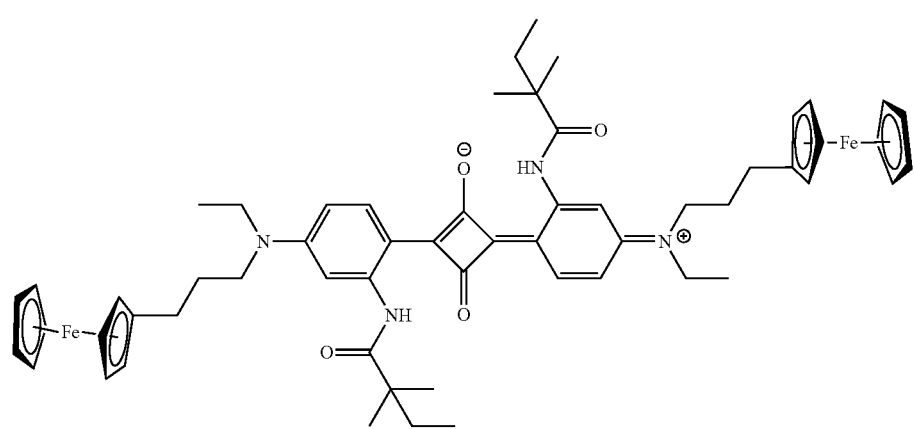

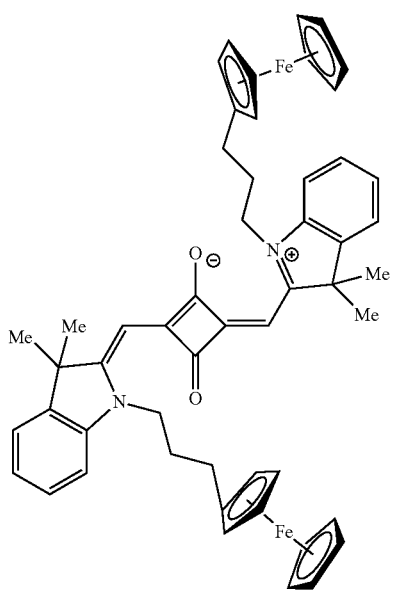
C-8
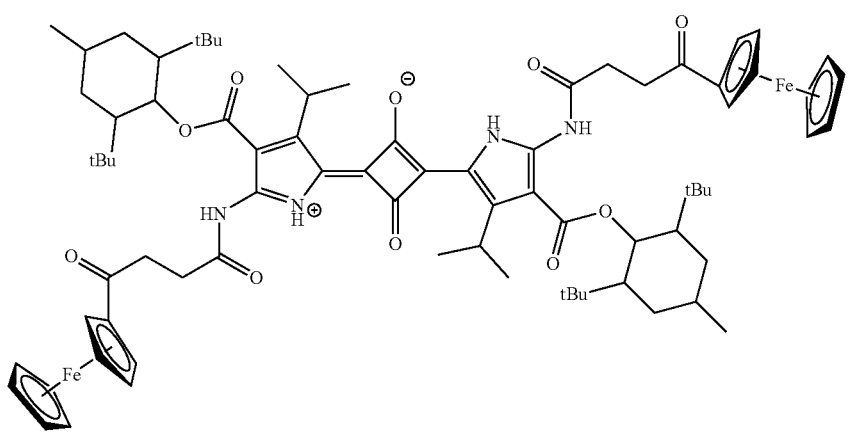
C-9
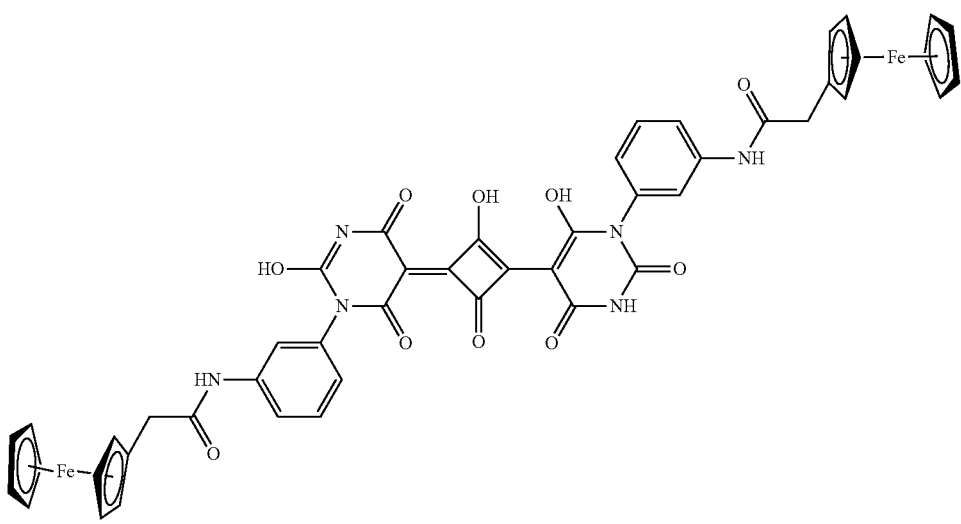
C-10

-continued
C-11
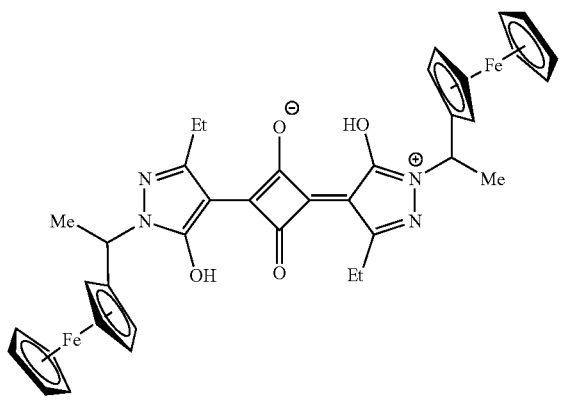
C-12
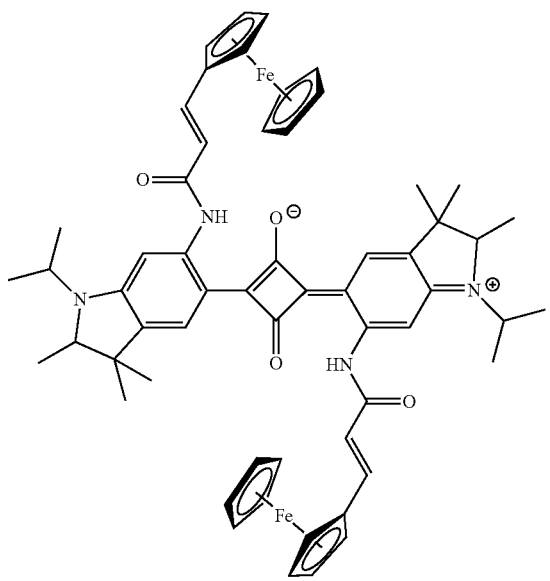
C-13
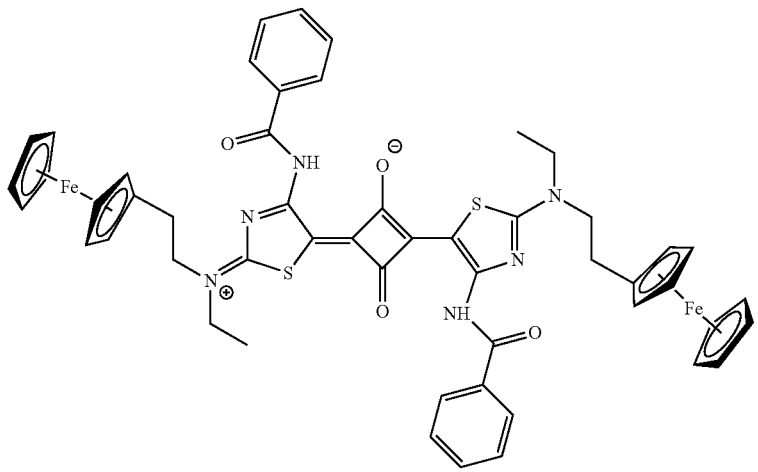
C-14
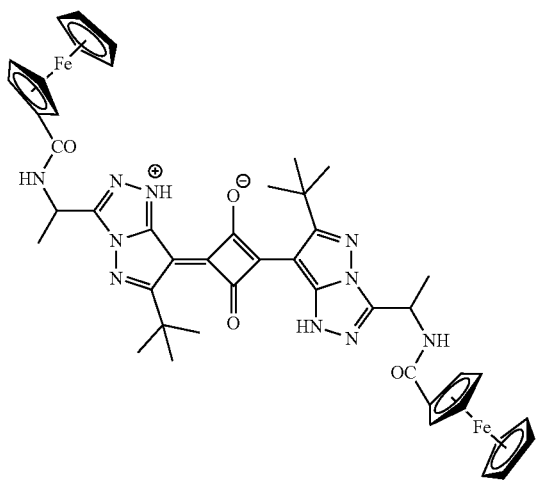
C-15
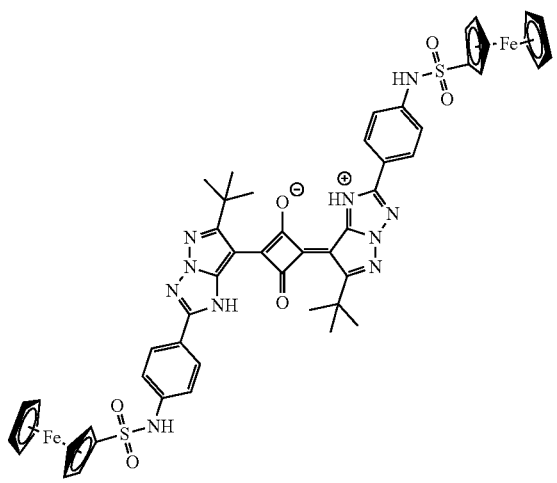

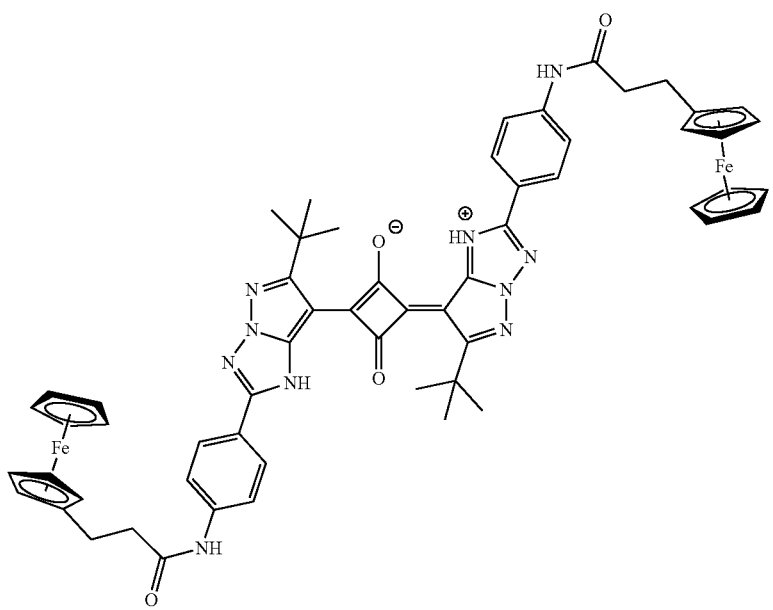
C-16
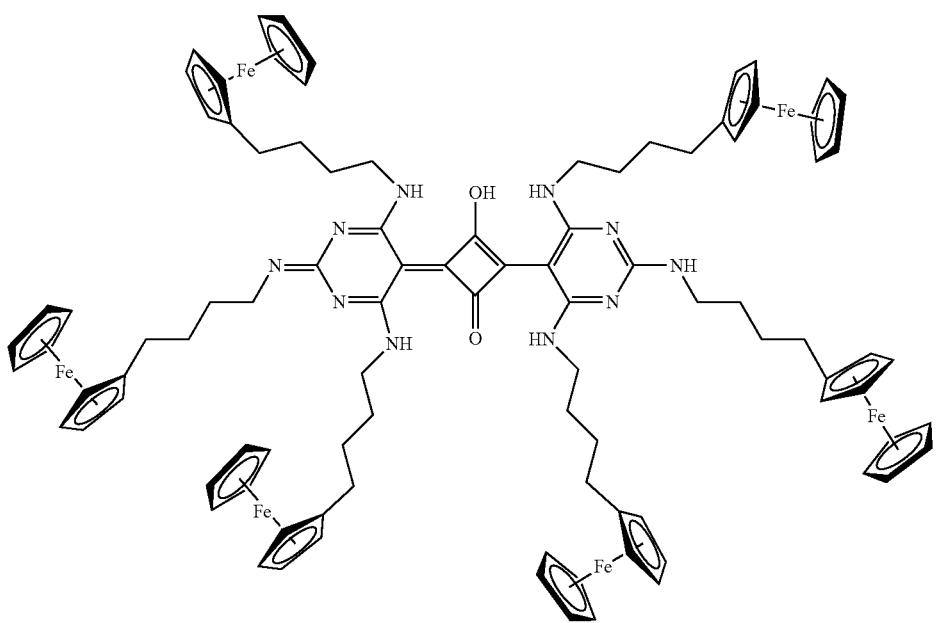
C-17

-continued
C-18
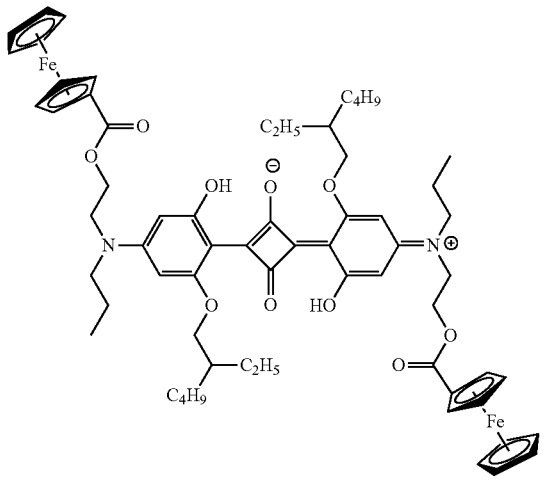
C-19
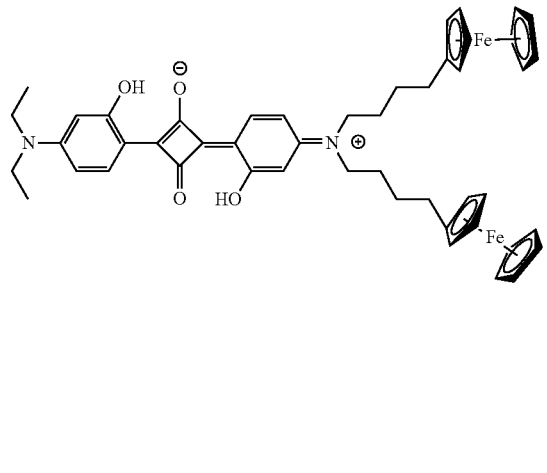
C-20
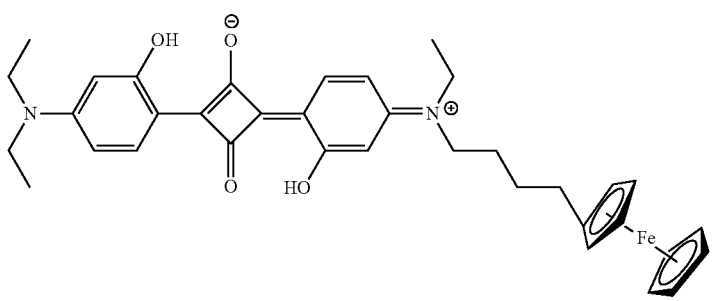
C-21
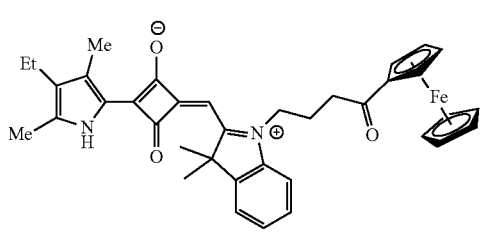
C-22
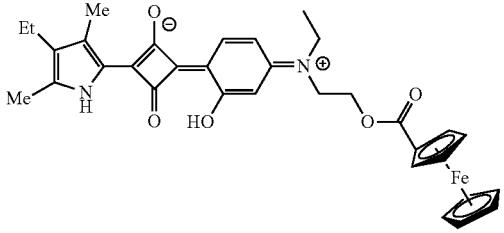
C-23
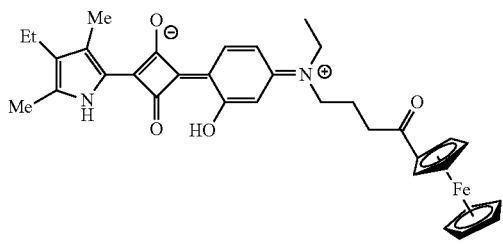
C-24
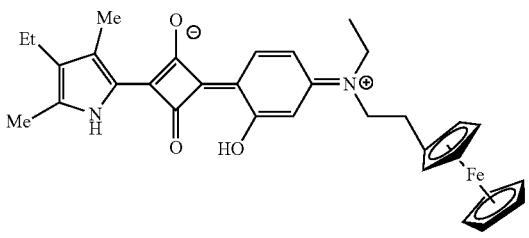

C-25
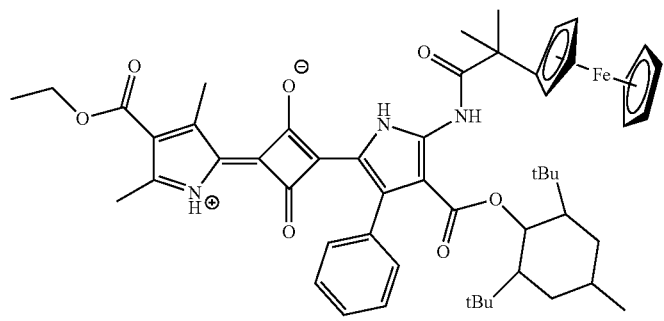
C-26
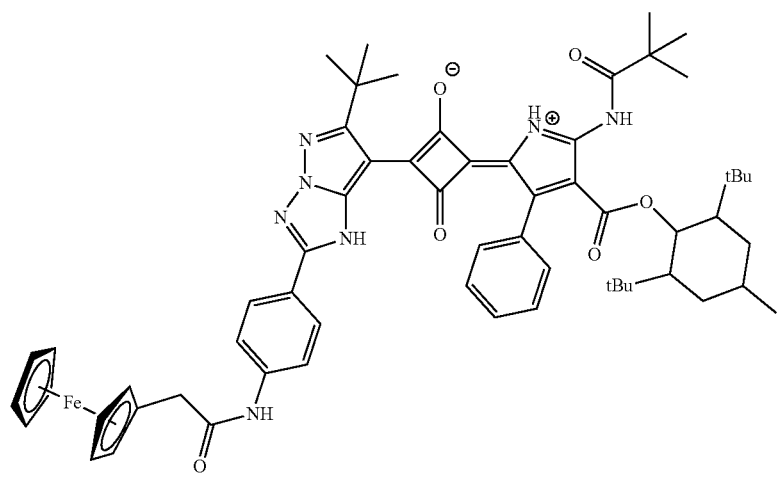
C-27
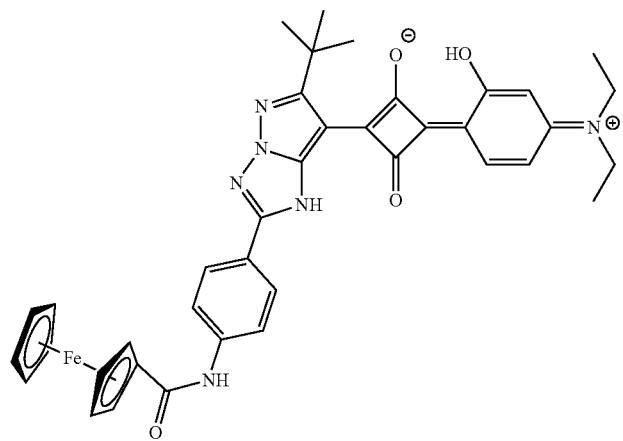

-continued
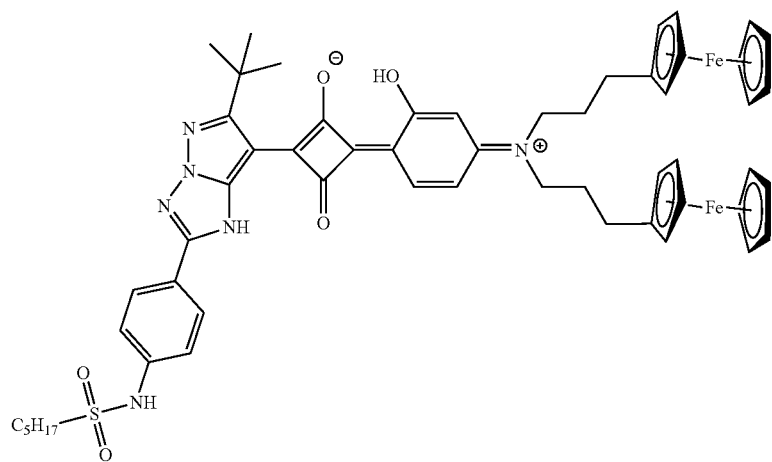
C-28
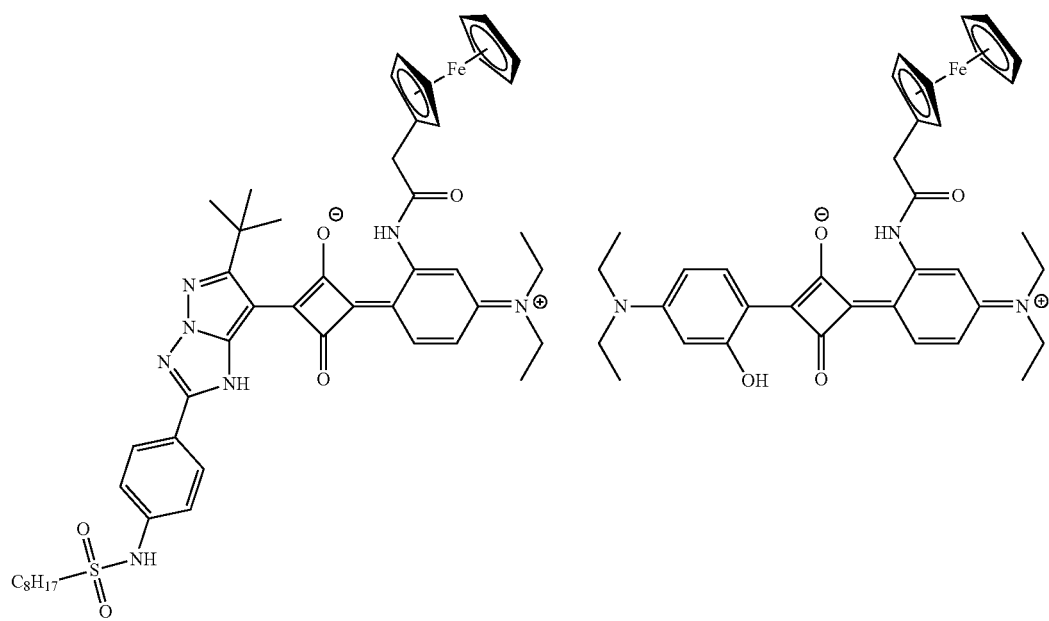
C-29    C-30
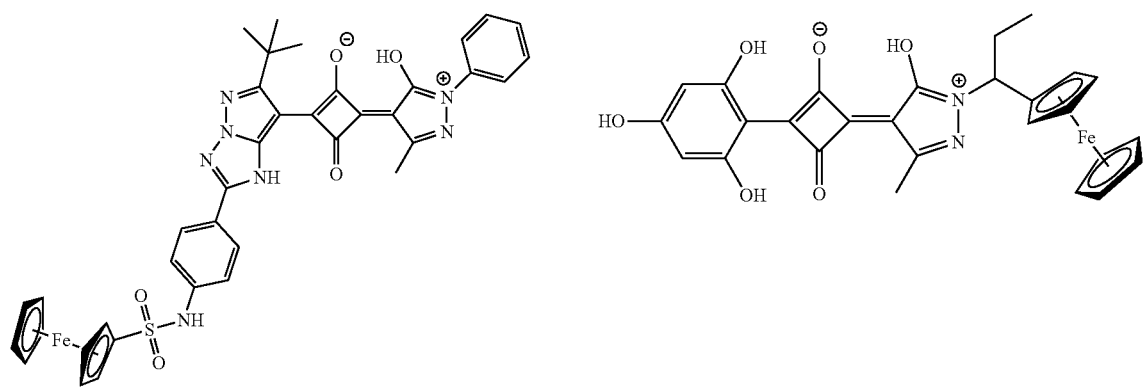
C-31    C-32

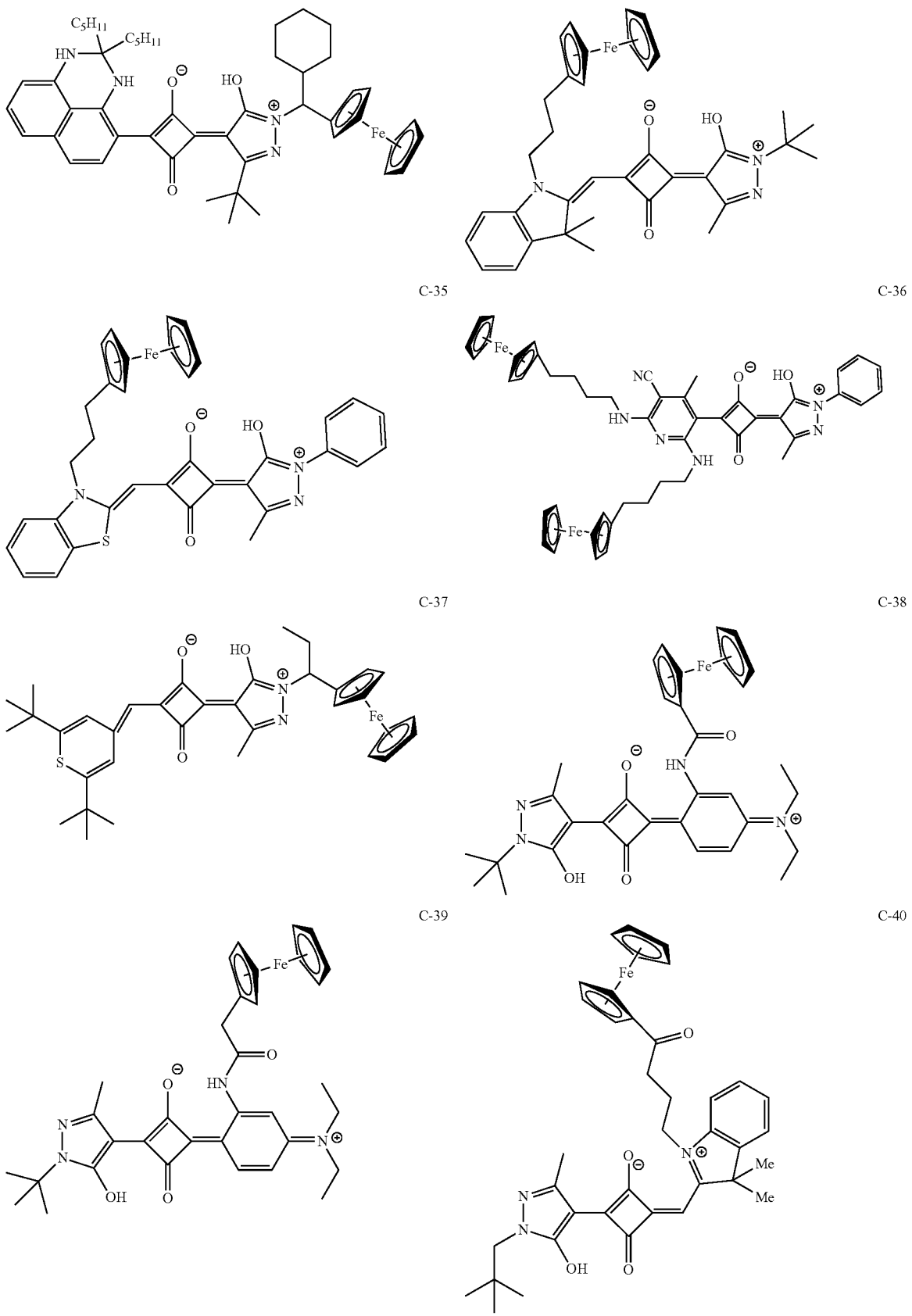

-continued
C-41
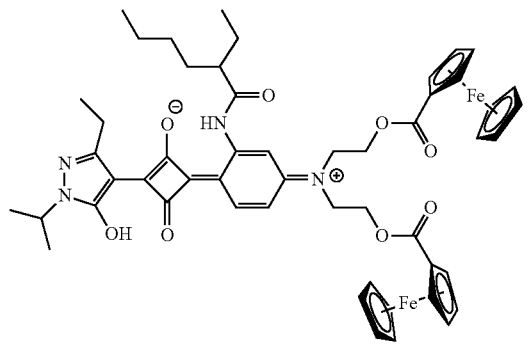
C-42
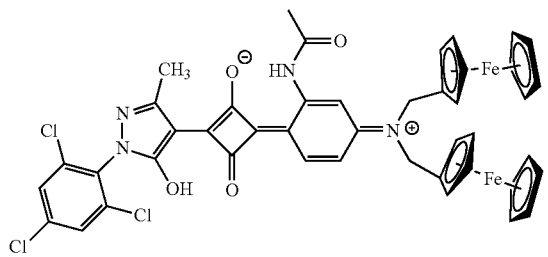
C-43
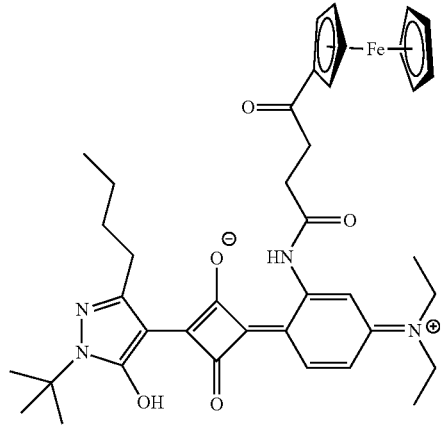
C-44
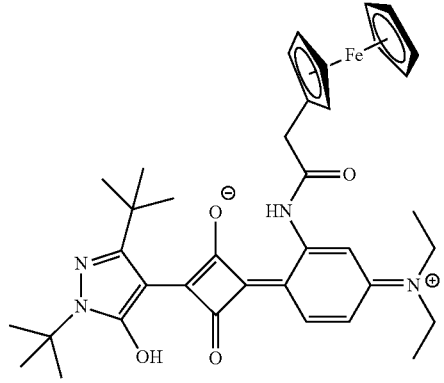
C-45
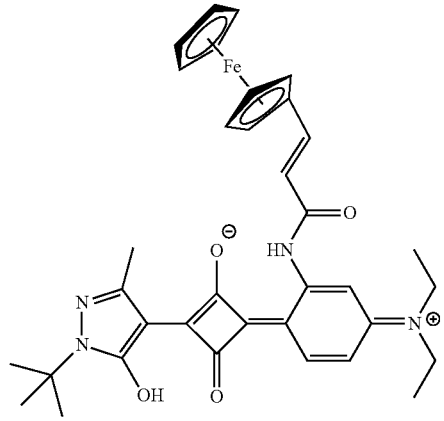
C-46
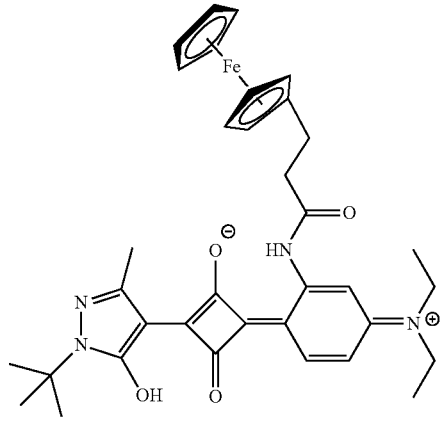
C-47
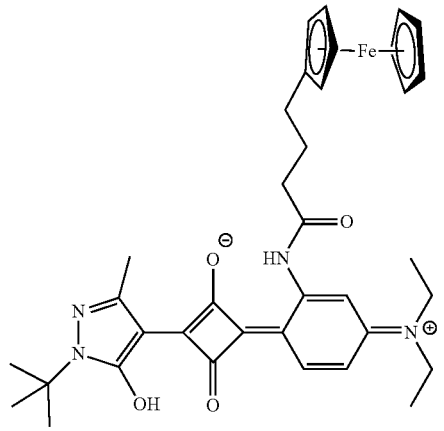
C-48
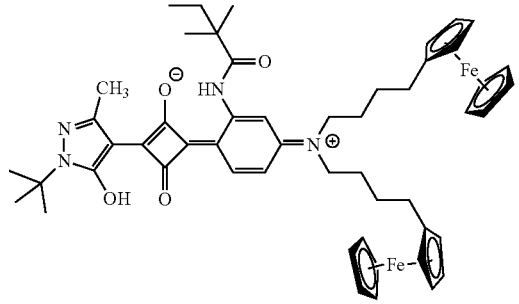

-continued
C-49
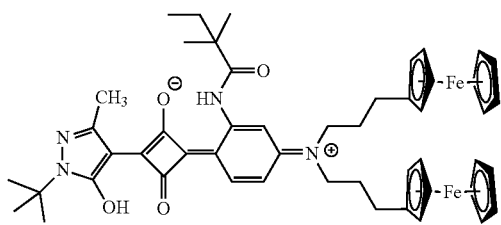
C-50
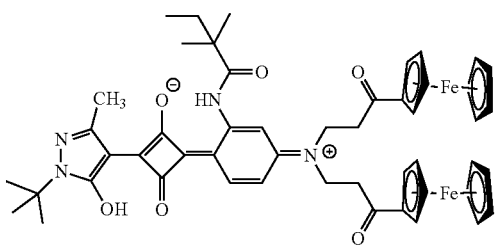
C-51
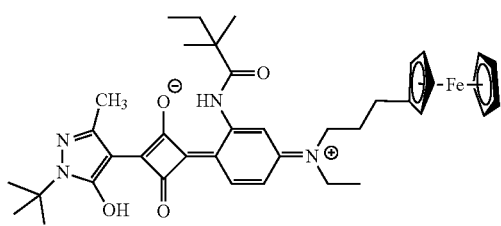
C-52
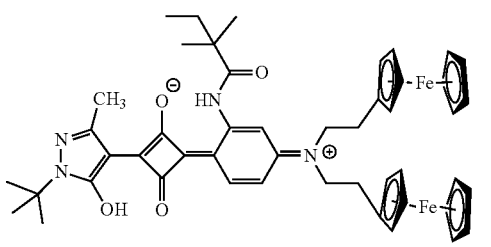
C-53
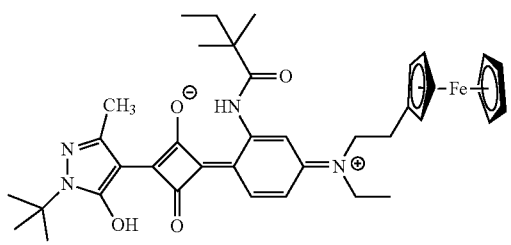
C-54
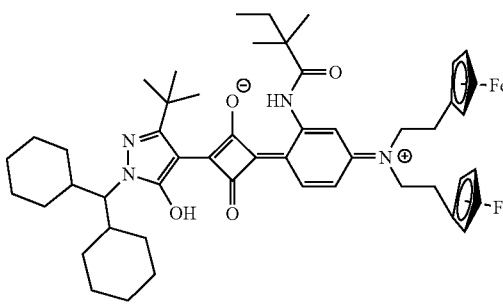
C-55
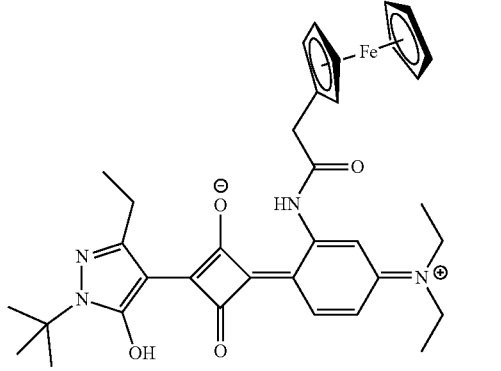
C-56
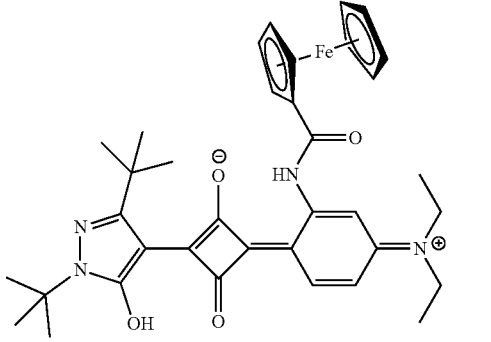
C-57
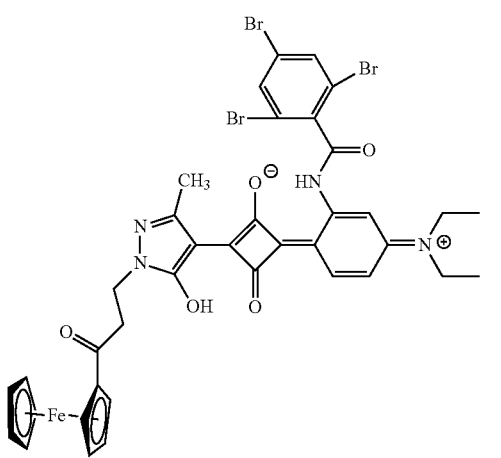
C-58
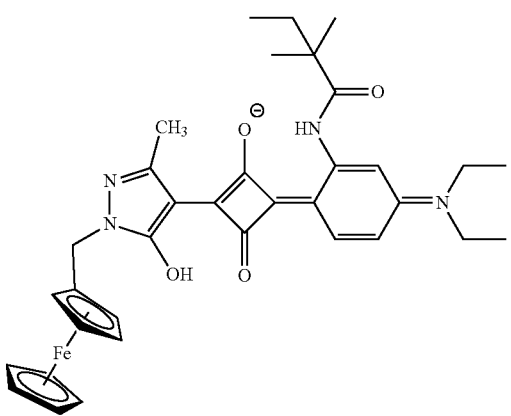

-continued
C-59
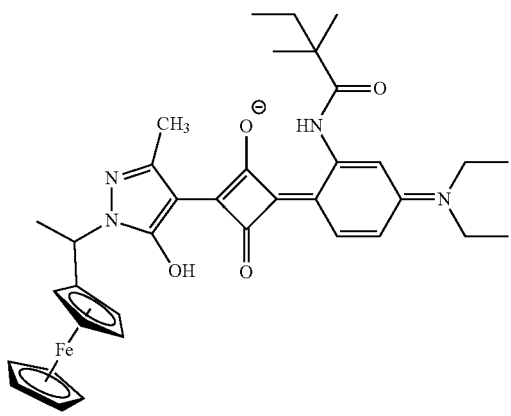
C-60
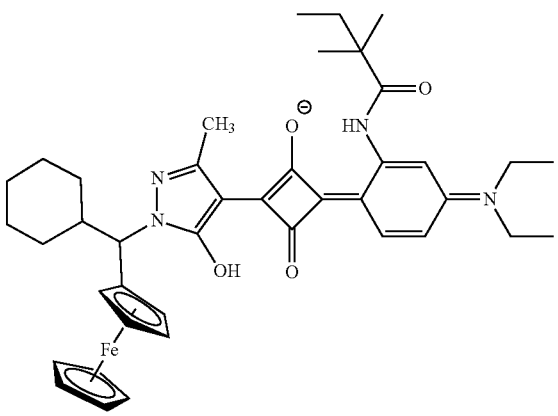
C-61
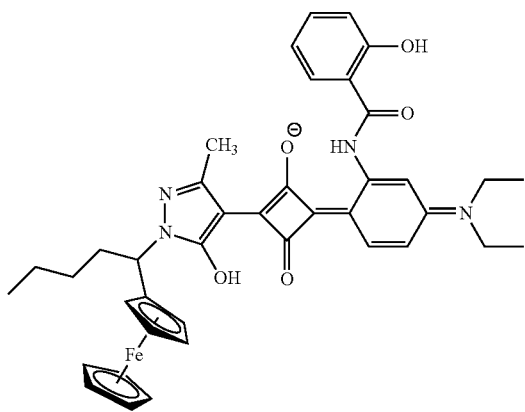
C-62
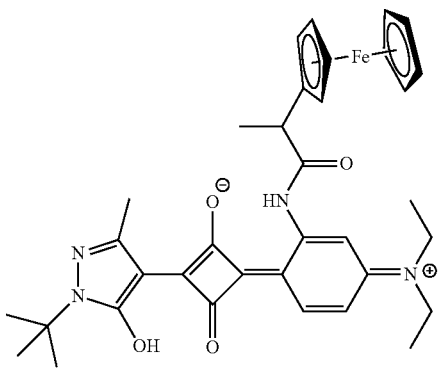
C-63
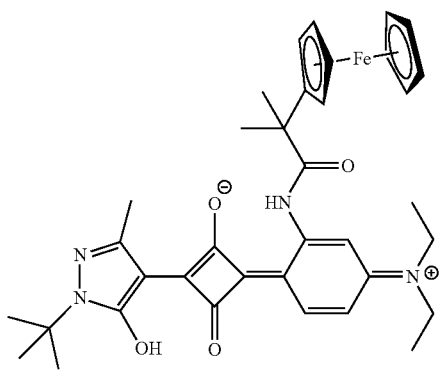
C-64
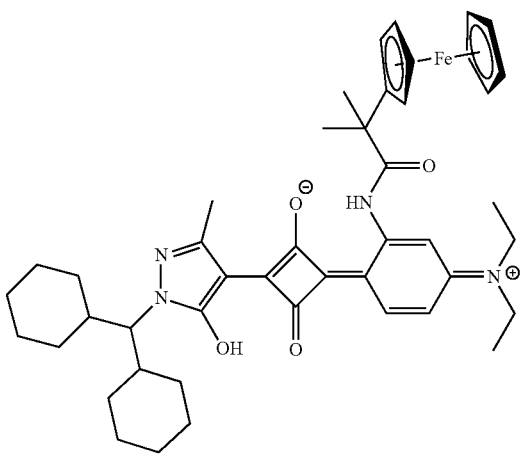

-continued
C-65
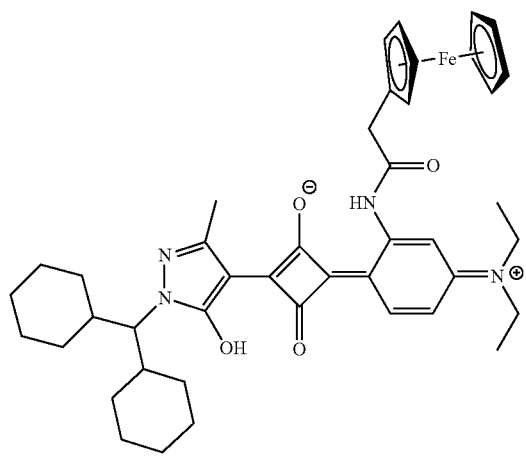
C-66
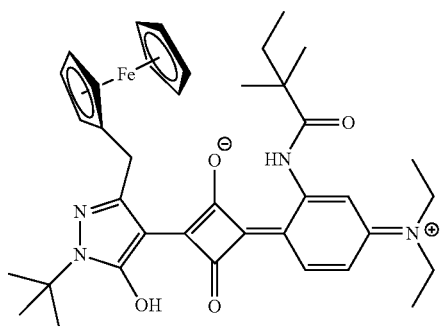
C-67
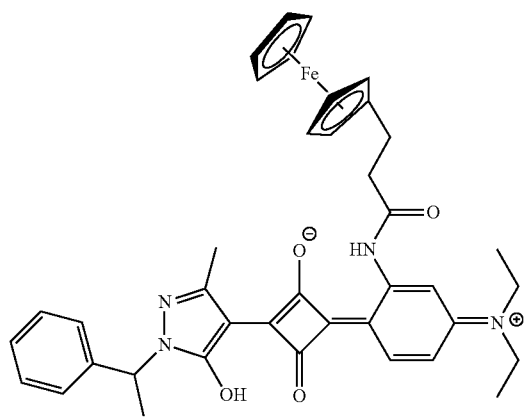
C-68
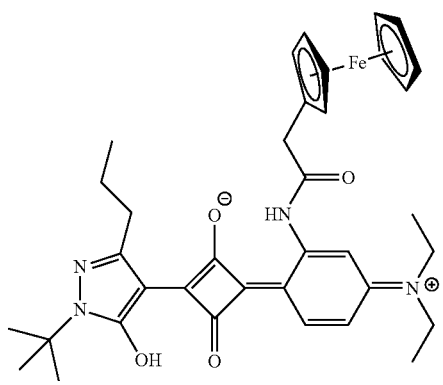
C-69
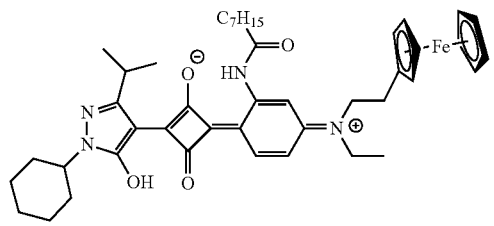
C-70
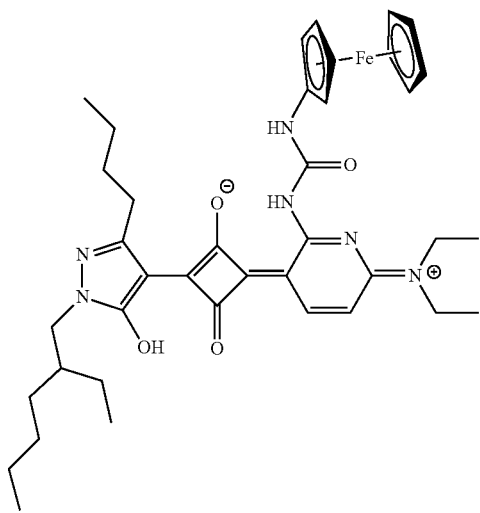

C-71

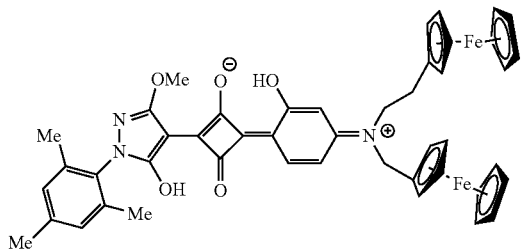

C-72

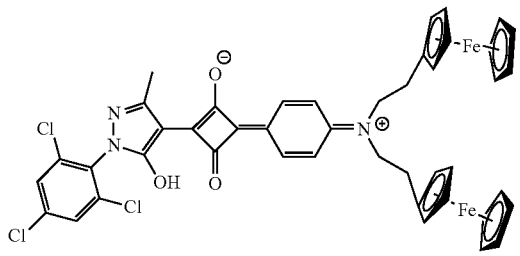

In a case where the coloring agent containing a polarization degree improver is used, the content of the coloring agent containing a polarization degree improver in the filter according to the embodiment of the present invention is set to the content of the coloring agent in the filter according to the embodiment of the present invention at which the absorption maximum wavelength is in a range of 560 to 620 nm or 460 to 520 nm. The content of the coloring agent containing a polarization degree improver may be 0.1 part by mass or more with respect to 100 parts by mass of the resin constituting the filter according to the embodiment of the present invention.

(Antifading Agent)

The filter according to the embodiment of the present invention preferably contains an antifading agent. As the antifading agent used in the present invention, the antioxidants described in paragraphs 0143 to 0165 of WO2015/005398A, the radical scavengers described in paragraphs 0166 to 0199 of WO2015/005398A, and the deterioration preventing agents described in paragraphs 0205 to 0206 of WO2015/005398A can be used.

The compound represented by Formula (IV) can be preferably used as an antifading agent used in the filter according to the embodiment of the present invention.

Formula (IV)

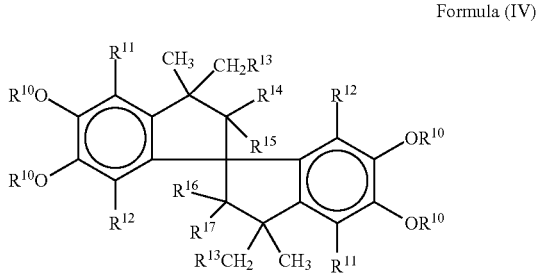

In Formula (IV), $R^{10}$ represents an alkyl group, an alkenyl group, an aryl group, an aralkyl group, a heterocyclic group, or a group represented by $R^{18}CO-$, $R^{19}SO_2-$ or $R^{20}NHCO-$. Here, $R^{18}$, $R^{19}$, and $R^{20}$ each represent an alkyl group, an alkenyl group, an aryl group, or a heterocyclic group. $R^{11}$ and $R^{12}$ each independently represent a hydrogen atom, a halogen atom, an alkyl group, an alkenyl group, an alkoxy group, or an alkenoxy group, and $R^{13}$, $R^{14}$, $R^{15}$, $R^{16}$, and $R^{17}$ each independently represent a hydrogen atom, an alkyl group, an alkenyl group, or an aryl group.

As the alkyl group represented by $R^{10}$ in Formula (IV), for example, methyl, ethyl, propyl, and benzyl; as the alkenyl group, for example, allyl; as the aryl group, for example, phenyl; as the aralkyl group, for example, benzyl; and as the heterocyclic group, for example, tetrahydropyranyl, and pyrimidyl may be exemplified. $R^{18}$, $R^{19}$, and $R^{20}$ each independently represent an alkyl group (for example, methyl, ethyl, n-propyl, n-butyl, or benzyl), an alkenyl group (for example, allyl), an aryl group (for example, phenyl, or methoxyphenyl), or a heterocyclic group (for example, pyridyl, or pyrimidyl).

As the halogen atom represented by $R^{11}$ and $R^{12}$ in Formula (IV), for example, chlorine, and bromine; as the alkyl group, for example, methyl, ethyl, n-butyl, and benzyl; as the alkenyl group, for example, allyl; as the alkoxy group, for example, methoxy, ethoxy, and benzyloxy; and as the alkenoxy group, for example, 2-propenyloxy may be exemplified.

As the alkyl group represented by $R^{13}$, $R^{14}$, $R^{15}$, $R^{16}$, and $R^{17}$ in Formula (IV), for example, methyl, ethyl, n-butyl, and benzyl; as the alkenyl group, for example, 2-propenyl; and as the aryl group, for example, phenyl, methoxyphenyl, and chlorophenyl may be exemplified.

Specific examples of the compound represented by Formula (IV) are shown below.

Formula (IV)

IV-1

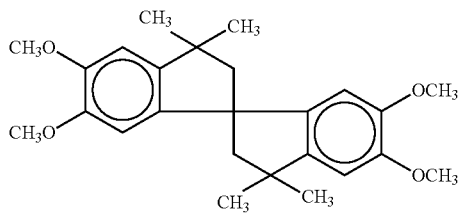

IV-2

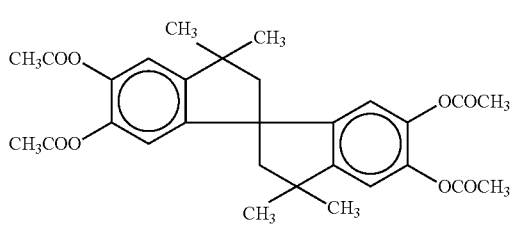

IV-3

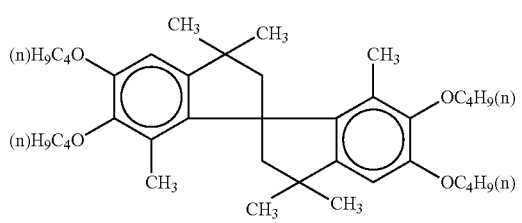

-continued

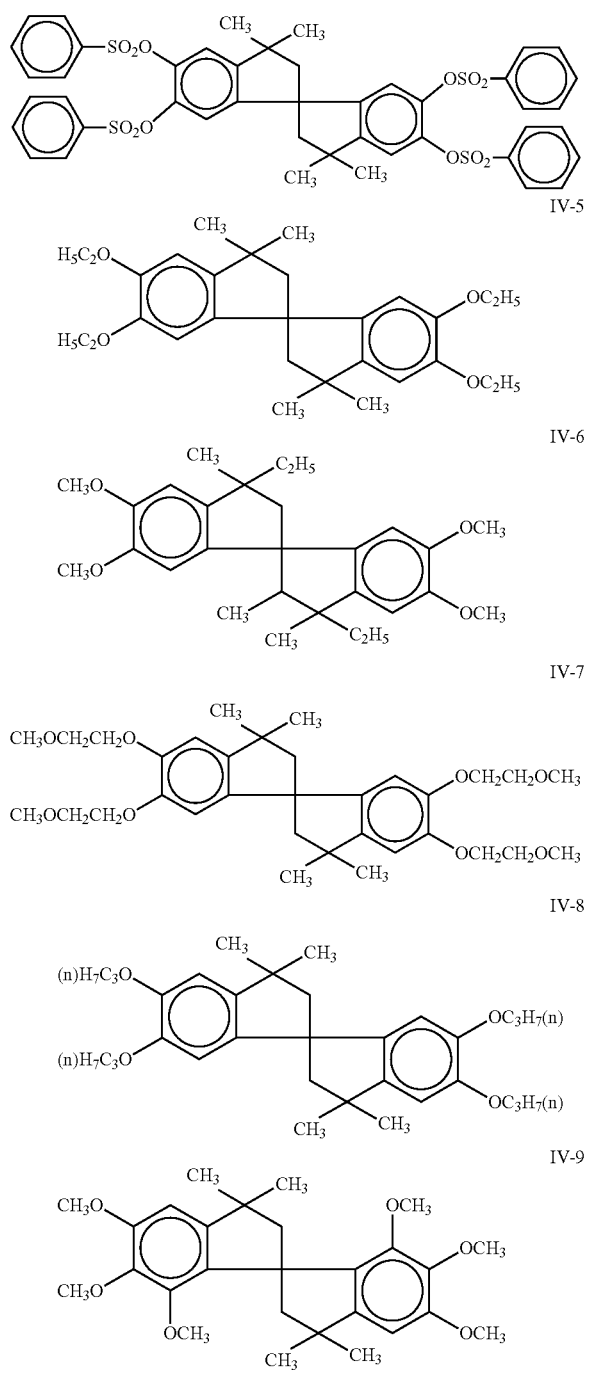

The compound represented by Formula [III] below can also be preferably used as the antifading agent used in the present invention.

Formula [III]

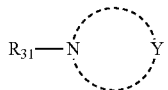

In Formula [III], $R_{31}$ represents an aliphatic group or an aromatic group, and Y represents a group of non-metal atoms necessary for forming a 5- to 7-membered ring with a nitrogen atom.

Next, in Formula [III], $R^{31}$ represents an aliphatic group or an aromatic group, preferably an alkyl group, an aryl group or a heterocyclic group, and most preferably an aryl group. Examples of the heterocyclic ring formed by Y together with the nitrogen atom include a piperidine ring, a piperazine ring, a morpholine ring, a thiomorpholine ring, a thiomorpholine-1,1-dione ring, and a pyrrolidine ring.

Specific examples of the compound represented by Formula [III] are shown below.

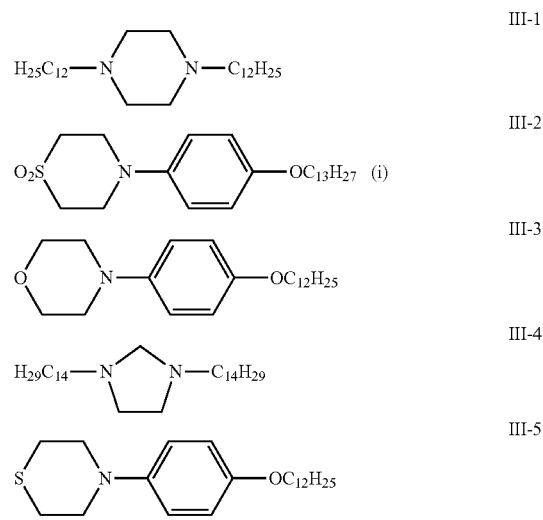

In addition to the above specific examples, specific examples of the compound represented by Formula [III] above include exemplified compounds B-1 to B-5 described on pages 8 to 11 of JP2004-167543A (JP-H02-167543A), and exemplified compounds (1) to (120) described on pages 4 to 7 of JP1988-095439A (JP-S63-095439A).

The content of the antifading agent in the filter according to the embodiment of the present invention is preferably 0% to 5% by mass, more preferably 0% to 3% by mass, and still more preferably 0% to 2% by mass. By controlling the amount of the antifading agent added to be equal to or less than the above upper limit value, the fastness of the coloring agent can be improved without causing side effects such as discoloration of the filter according to the embodiment of the present invention.

(Matting Agent)

It is preferable to add fine particles to the surface of the filter according to the embodiment of the present invention in order to impart slipperiness and prevent blocking. As the fine particles, silica (silicon dioxide, $SiO_2$) whose surface is coated with a hydrophobic group and which is in the form of secondary particles is preferably used. The fine particles include, in addition to or instead of silica, fine particles of titanium dioxide, aluminum oxide, zirconium oxide, calcium carbonate, talc, clay, calcined kaolin, calcined calcium silicate, hydrated calcium silicate, aluminum silicate, magnesium silicate, and calcium phosphate. Examples of commercially available products of the fine particles include the trade name R972 or NX90S (both manufactured by Nippon Aerosil Co., Ltd.).

The fine particles function as a so-called matting agent, and by the addition of the fine particles, fine unevenness is formed on the film surface, and even in a case where the films overlap each other, the films do not adhere to each other due to the unevenness and the slipperiness between the films is secured. In this case, the fine unevenness due to the protrusions of the fine particles protruding from the film surface is particularly highly effective in improving the slipperiness and blocking properties in a case where the number of protrusions having a height of 30 nm or more is $10^4$ pieces/mm² or more per mm².

It is preferable to apply the matting agent fine particles particularly to the surface layer in order to improve the blocking properties and the slipperiness. As a method of applying the fine particles to the surface layer, there are methods such as multilayer casting or coating. The content of the matting agent in the filter according to the embodiment of the present invention is appropriately adjusted according to the purpose.

(Leveling Agent)

A leveling agent (surfactant) can be appropriately mixed with the filter according to the embodiment of the present invention. Examples of the leveling agent include conventionally known compounds, and a fluorine-containing surfactant is particularly preferable. Specific examples thereof include the compounds described in paragraphs 0028 to 0056 of JP2001-330725A.

The content of the leveling agent in the filter according to the embodiment of the present invention is appropriately adjusted according to the purpose.

The filter according to the embodiment of the present invention may contain, in addition to the above components, a low-molecular plasticizer, an oligomer-based plasticizer, a retardation modifier, an ultraviolet absorber, a deterioration preventing agent, a peeling accelerator, an infrared absorber, an antioxidant, a filter, a compatibilizer, and the like.

<Method of Producing Color Correction Filter for White Organic EL Light Source>

The filter according to the embodiment of the present invention can be prepared by a known solution film forming method, a melt extrusion method, or a method of forming a coating layer on a substrate film (release film) by a known method (coating method), and stretching can also be appropriately combined. The filter according to the embodiment of the present invention is preferably prepared by a coating method.

(Solution Film Forming Method)

In the solution film forming method, a solution in which a filter material is dissolved in an organic solvent or water is prepared, a concentration step, a filtration step, and the like are appropriately performed, and then the solution is uniformly cast on a support. Next, the raw dry film is peeled off from the support, both ends of a web are appropriately held by clips or the like, and the solvent is dried in the drying zone. In addition, stretching can be performed separately while or after the film is dried.

(Melt Extrusion Method)

In the melt extrusion method, the material of the filter is melted by heat, a filtration step and the like are appropriately performed, and then the material is uniformly cast on a support. Next, the cooled and solidified film can be peeled off and appropriately stretched. In a case where the main material of the filter according to the embodiment of the present invention is a thermoplastic polymer resin, a thermoplastic polymer resin can be selected as the main material of the substrate film, and the polymer resin in a molten state can be formed into a film by a known co-extrusion method.

At this case, by adjusting the polymer type of the filter and the substrate film and the additives mixed in each layer, or by adjusting the stretching temperature, the stretching speed, the stretching ratio, and the like of the coextruded film, the adhesive force between the filter and the substrate film can be controlled.

Examples of the co-extrusion method include a co-extrusion T-die method, a co-extrusion inflation method, and a co-extrusion lamination method. Among these, the co-extrusion T-die method is preferable. The co-extrusion T-die method includes a feed block method and a multi-manifold method. Among these, the multi-manifold method is particularly preferable from the viewpoint that a variation in thickness can be reduced.

In a case where the co-extrusion T-die method is adopted, the melting temperature of the resin in an extruder having a T-die is preferably a temperature 80° C. or more higher, and more preferably a temperature 100° C. more higher than the glass transition temperature (Tg) of each resin, and is preferably a temperature 180° C. or less higher and more preferably a temperature 150° C. or less lower than the glass transition temperature of each resin. By setting the melting temperature of the resin in the extruder to the lower limit value or greater in the above range, the fluidity of the resin can be sufficiently enhanced, and by setting the melting temperature to the upper limit value or less, the resin can be prevented from being deteriorated.

Usually, the sheet-like molten resin extruded from the opening portion of the die is brought into close contact with the cooling drum. The method of bringing the molten resin into close contact with the cooling drum is not particularly limited, and examples thereof include an air knife method, a vacuum box method, and an electrostatic contact method.

The number of cooling drums is not particularly limited, but is usually 2 or more. In addition, the method of arranging the cooling drum is not particularly limited and examples thereof include a linear arrangement, a Z-shaped arrangement, and an L-shaped arrangement. Further, the method of passing the molten resin extruded from the opening portion of the die through the cooling drum is not particularly limited.

The degree of close contact of the extruded sheet-like resin with the cooling drum changes depending on the temperature of the cooling drum. In a case where the temperature of the cooling drum is raised, the close contact is improved, but in a case where the temperature is raised too much, the sheet-like resin may not be peeled off from the cooling drum and may be wound around the drum. Therefore, the temperature of the cooling drum is preferably $(Tg+30)°$ C. or lower, and more preferably in a range of $(Tg-5)°$ C. to $(Tg-45)°$ C. in a case where Tg is the glass transition temperature of the resin of the layer that is brought into contact with the drum in the resin extruded from the die. Thus, problems such as slippage and scratches can be prevented.

Here, it is preferable to reduce the content of the residual solvent in the film before stretching. Examples of a method of reducing the content include methods of (1) reducing the amount of the residual solvent of the resin as the raw material; and (2) predrying the resin before forming the film before stretching. Predrying is performed, for example, in the form of pellets of resin and using a hot air dryer or the like. The drying temperature is preferably 100° C. or higher, and the drying time is preferably 2 hours or longer. By performing the predrying, it is possible to reduce the residual solvent in the film before stretching and to prevent the extruded sheet-like resin from foaming.

(Coating Method)

In the coating method, a solution of a filter material is applied to a substrate film to form a coating layer. A release agent or the like may be appropriately applied to the surface of the substrate in advance in order to control the adhesiveness to the coating layer. The coating layer can be used by peeling off the substrate film after being laminated with another member through an adhesive layer in a later step. In addition, in a state in which the polymer solution or the coating layer is laminated on the substrate film, the substrate film can be appropriately stretched.

The solvent used for the solution of the filter material can be appropriately selected from the viewpoints that the filter material can be dissolve or dispersed, a uniform surface state can be easily achieved during the coating step and drying step, liquid storability can be secured, an appropriate saturated vapor pressure is provided, and the like.

—Addition of Coloring Agent—

The timing of adding the coloring agent to the filter material is not particularly limited as long as the coloring agent is added at the time of film formation. For example, the coloring agent may be added at the time of synthesizing the matrix resin, or may be mixed with the filter material at the time of preparing the coating liquid for the filter material.

—Substrate Film—

The substrate film used for forming the filter according to the embodiment of the present invention by a coating method or the like preferably has a film thickness of 5 to 100 μm, more preferably 10 to 75 μm, and still more preferably 15 to 55 μm. In a case where the film thickness is 5 μm or more, sufficient mechanical strength can be easily secured, and failures such as curling, wrinkling, and buckling are less likely to occur. Thus, this case is preferable. In addition, in a case where the film thickness is 100 μm or less, in the storage of a multilayer film of the filter according to the embodiment of the present invention and the substrate film, for example, in the form of a long roll, the surface pressure applied to the multilayer film is easily adjusted to be in an appropriate range, and adhesion failure is less likely to occur. Thus, this case is preferable.

The surface energy of the substrate film is not particularly limited, and by adjusting the relationship between the surface energy of the filter material or the coating solution and the surface energy of the surface of the substrate film on which the filter is to be formed, the adhesive force between the filter and the substrate film can be adjusted. In a case where the surface energy difference is reduced, the adhesive force tends to increase, in a case where the surface energy difference is increased, the adhesive force tends to decrease, and thus the surface energy can be set appropriately.

The surface energy of the substrate film can be calculated from the contact angle value between water and methylene iodide using the method of Owens. For measurement of the contact angle, for example, DM901 (contact angle meter, manufactured by Kyowa Interface Science Co., Ltd.) can be used.

The surface energy of the surface of the substrate film on which the filter is to be formed is preferably 41.0 to 48.0 mN/m and more preferably 42.0 to 48.0 mN/m. In a case where the surface energy is 41.0 mN/m or more, the uniformity of the thickness of the filter is enhanced and thus this case is preferable. In a case where the surface energy is 48.0 mN/m or less, the peeling force between the filter and the substrate film is easily controlled to be in an appropriate range and thus this case is preferable.

The surface unevenness of the substrate film is not particularly limited and depending on the relationship between the surface energy of the filter surface, the hardness, and the surface unevenness, and the surface energy and hardness of the surface of the substrate film opposite to the side on which the filter is formed, for example, in order to prevent adhesion failure in a case where the multilayer film of the present invention is stored in the form of a long roll, the surface unevenness of the substrate film can be adjusted. In a case where the surface unevenness is increased, adhesion failure tends to be suppressed, and in a case where the surface unevenness is reduced, the surface unevenness of the filter tends to decrease and the haze of the filter tends to be small. Thus, the surface unevenness can be set appropriately.

For such a substrate film, known materials and films can be appropriately used. Specific examples of materials include a polyester-based polymer, an olefin-based polymer, a cyclo olefin-based polymer, a (meth)acrylic polymer, a cellulose-based polymer, and a polyamide-based polymer. In addition, a surface treatment can be appropriately performed for the purpose of adjusting the surface properties of the substrate film. For example, a corona treatment, a room temperature plasma treatment, a saponification treatment and the like can be performed to lower the surface energy, and a silicone treatment, a fluorine treatment, an olefin treatment and the like can be performed to raise the surface energy.

—Peeling Force Between Color Correction Filter for White Organic El Light Source and Substrate Film—

In a case where the filter according to the embodiment of the present invention is formed by a coating method, the peeling force between the filter and the substrate film can be controlled by adjusting the filter material, the material of the substrate film, the internal strain of the filter, and the like. The peeling force can be measured in, for example, a test of peeling off the substrate film in a direction of 90°, and the peeling force as measured at a speed of 300 mm/min is preferably 0.001 to 5 N/25 mm, more preferably 0.01 to 3 N/25 mm, and still more preferably 0.05 to 1 N/25 mm. In a case where the peeling force is 0.001 N/25 mm or more, it is possible to prevent peeling of the substrate film in steps other than the peeling step, and in a case where the peeling force is 5 N/25 mm or less, it is possible to prevent peeling failure (for example, zipping or cracking of the filter) in the peeling step.

<Film Thickness of Color Correction Filter for White Organic EL Light Source>

The film thickness of the filter according to the embodiment of the present invention is preferably 1 to 18 μm, more preferably 1 to 12 μm, and still more preferably 2 to 8 μm. By adding the coloring agent at a predetermined concentration to the film having such a film thickness, the fluorescence emitted by the coloring agent can be further suppressed. In addition, the effects of the quencher and the antifading agent are easily exhibited.

In the present invention, the film thickness of 1 to 18 μm means that the thickness of the filter is within a range of 1 to 18 μm at any portion. The same applies to the film thicknesses of 1 to 12 μm and 2 to 8 μm. The film thickness can be measured with an electronic micrometer manufactured by Anritsu Corporation.

<Absorbance of Color Correction Filter for White Organic EL Light Source>

The filter according to the embodiment of the present invention preferably has an absorbance at a wavelength of 450 nm of 0.05 or more and 3.0 or less. More preferably, the absorbance is 0.01 or more and 2.0 or less, and more preferably 0.1 or more and 1.0 or less.

The absorbance at a wavelength of 590 nm is preferably 0.1 or more and 3.0 or less. More preferably, the absorbance is 0.2 or more and 2.0 or less, and more preferably 0.3 or more and 1.5 or less.

By incorporating the filter whose absorbance is adjusted to the above range into an organic EL display device, display performance with higher brightness and better color reproducibility can be obtained.

The absorbance of the filter according to the embodiment of the present invention can be adjusted by the type and addition amount of the coloring agent.

<Moisture Content of Color Correction Filter for White Organic EL Light Source>

The moisture content of the filter according to the embodiment of the present invention is preferably 0.5% by mass or less, and more preferably 0.3% by mass or less regardless of the film thickness from the viewpoint of durability in a case where the filter is bonded to a polarizer. In the present invention, the "moisture content" is measured under the conditions of 25° C. and a relative humidity of 80%.

In the specification, the moisture content of the filter can be measured by using a sample having a thick film thickness as necessary. The moisture content can be calculated by humidity-conditioning the sample for 24 hours or longer, then measuring a moisture content (g) by the Karl Fischer method with a water measuring instrument and a sample drying apparatus "CA-03" and "VA-05" (both manufactured by Mitsubishi Chemical Corporation), and dividing the water content (g) by the sample mass (g, including the water content).

<Treatment of Color Correction Filter for White Organic EL Light Source>

It is preferable that the filter according to the embodiment of the present invention is subjected to, for example, a hydrophilic treatment by a known glow discharge treatment, corona discharge treatment, alkali saponification treatment, or the like, and a corona discharge treatment is most preferably used. It is also preferable to apply the method disclosed in JP1994-094915A (JP-H06-094915A) and JP1994-118232A (JP-1106-118232A).

If necessary, the obtained film may be subjected to a heat treatment step, a superheated steam contact step, an organic solvent contact step, or the like. In addition, a surface treatment may be suitably performed.

[Polarizing Plate]

The color correction filter for a white organic EL light source according to the embodiment of the present invention may be used as a protective layer of a polarizing plate. More specifically, the polarizing plate has a polarizer (polarizing layer) and the color correction filter for a white organic EL light source according to the embodiment of the present invention on at least one surface of the polarizer. The polarizer and the filter are preferably bonded through an adhesive layer.

<Polarizer (Polarizing Layer)>

The structure of the polarizing layer is not particularly limited. For example, a polarizing layer obtained by immersing a polyvinyl alcohol film in an iodine solution and stretching the film can be used.

<Adhesive Layer>

The film thickness of the adhesive layer is 1 to 1000 nm, preferably 30 to 800 nm, and more preferably 50 to 500 nm. By setting the film thickness of the adhesive layer to 1 nm or more, the adhesiveness between the color correction filter for the white organic EL light source and the polarizing layer can be secured, and by setting the film thickness to 1000 nm or less, the deformation failure can be reduced.

The adhesive layer preferably contains a water-soluble material. Specific examples thereof include an aqueous solution of polyvinyl alcohol or polyvinyl acetal (for example, polyvinyl butyral), and an ultraviolet (UV) curable adhesive, but an aqueous solution of completely saponified polyvinyl alcohol is most preferable.

<Preparation of Polarizing Plate>

The polarizing plate can be prepared by an ordinary method except for the configuration of the color correction filter for the white organic EL light source, and is prepared by laminating the polarizing layer and the filter to each other such that an angle formed between the absorption axis of the polarizing layer and the direction in which the acoustic wave propagating velocity of the color correction filter for a white organic EL light source are maximized is parallel or orthogonal to each other.

In the specification, a case where two straight lines are in parallel with each other includes not only a case where an angle formed between two straight lines is 0° but also a case where an error is in an optically acceptable level. Specifically, in the case where two straight lines are in parallel with each other, the angle formed between two straight lines is preferably in a range of 0°±10°, the angle formed between two straight lines is more preferably in a range of 0°±5°, and the angle formed between two straight lines is particularly preferably in a range of 0°±1°. Similarly, a case where two straight lines are orthogonal (perpendicular) to each other includes not only a case where an angle formed between two straight lines is 90° but also a case where an error is in an optically acceptable level. Specifically, in the case where two straight lines are orthogonal (perpendicular) to each other, the angle formed between two straight lines is preferably in a range of 90°±10°, the angle formed between two straight lines is more preferably in a range of 90°±5°, and the angle formed between two straight lines is particularly preferably in a range of 90°±1°.

An optically anisotropic layer may be provided on the surface opposite to the surface of the polarizing layer provided with the color correction filter for a white organic EL light source to prevent reflection of external light to constitute a circularly polarizing plate.

As the optically anisotropic layer, a conventionally known optically anisotropic layer can be used. For example, the optically anisotropic films (layers) described in JP2017-223962A and WO2016/158940A can be used. In a case where the optically anisotropic film is a n/4 plate, the angle formed between the absorption axis of the polarizer and the slow axis of the optically anisotropic film is preferably 45° 10°.

[Organic EL Display Device]

Next, an organic EL display device according to an embodiment of the present invention will be described.

The organic EL display device according to the embodiment of the present invention has a white organic EL light source, and includes at least one filter according to the embodiment of the present invention for blocking light of an unnecessary wavelength from the light emitted from the light source. As the white organic EL light source, a layer doped with a plurality of types of fluorescent materials and a layer formed by laminating layers of a plurality of types of fluorescent materials may be used. The organic EL display device according to the embodiment of the present invention is not particularly limited with respect to the other components as long as the display device has the above configuration. The organic EL display device according to the embodiment of the present invention preferably adopts a color filter method.

Examples

Hereinafter, the present invention will be described more specifically with reference to examples. The materials, amount of use, ratio, details of the treatment, procedures of the treatment, and the like shown in the following examples can be appropriately changed without departing from the spirit of the present invention. Therefore, it is to be understood that the scope of the present invention is not limited to the specific examples shown below.

[Preparation of Color Correction Filter for White Organic EL Light Source]

The materials used for the color correction filter for a white organic EL light source are shown below.

<Matrix Resin>

(Resin 1):

A commercially available polystyrene resin (SGP-10, manufactured by PS Japan Corporation, Tg: 100° C., fd: 0.86) was heated at 110° C. and the temperature was returned to room temperature (23° C.) before use.

(Resin 2)

Commercially available polymethyl methacrylate (DIANAL BR 80, manufactured by Mitsubishi Rayon Co., Ltd., Tg: 110° C., fd: 0.70).

<Coloring Agent>

Coloring agent compounds A to F and a coloring agent (3-69) having the following structures were used.

A

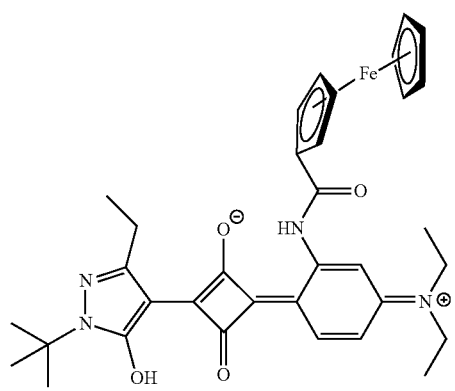

B

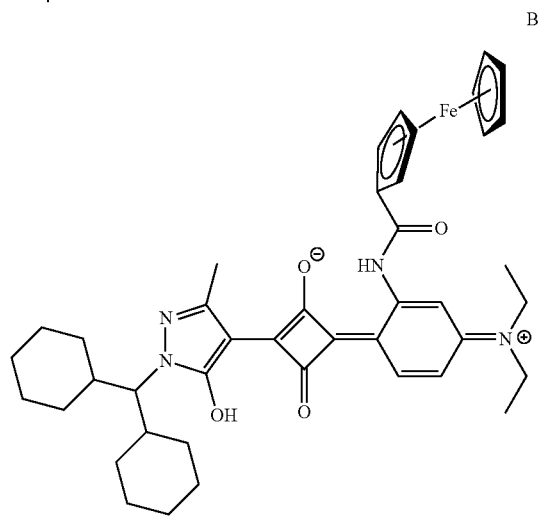

-continued

C

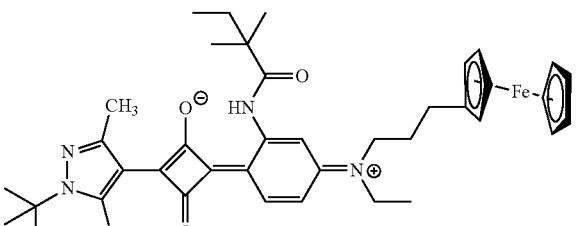

D

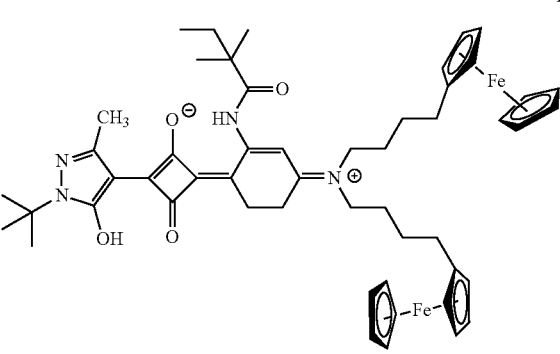

E

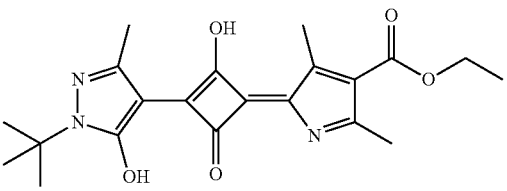

F

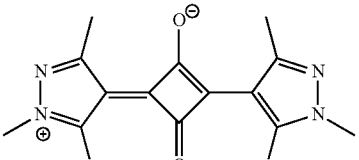

Coloring agent (3-69)

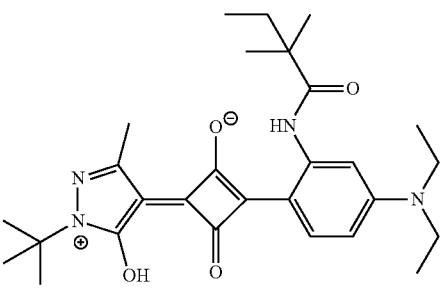

<Additives>

(Matting Agent 1)

Silicon dioxide fine particles, NX90S (manufactured by Nippon Aerosil Co., Ltd., particle size: 20 nm, Mohs hardness: about 7)

(Leveling Agent 1)

A surfactant having the following structure was used. In the following structural formula, t-Bu represents a tert-butyl group.

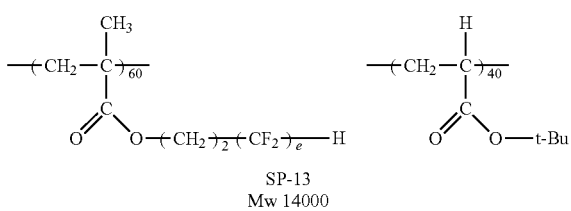

SP-13
Mw 14000

(Polarization Degree Improver 1)
Ferrocene (manufactured by Tokyo Chemical Industry Co., Ltd.)
(Polarization Degree Improver 2)
Electron accepting type quencher B having the following structure

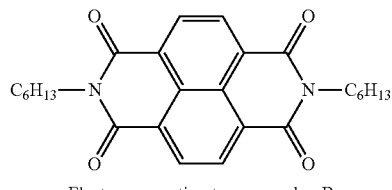

Electron accepting type quencher B
lp;1p (Antifading Agent 1)
IV-8 above
<Substrate Film>
(Substrate 1)
A commercially available polyethylene terephthalate film, LUMIRROR® S105 (film thickness: 38 μm, manufactured by Toray Industries, Inc.) was used as a substrate 1.
<Preparation of Color Correction Filter 101 for White Organic EL Light Source with Substrate>
(Preparation of Resin Solution)
Each component was mixed in the composition shown below to prepare a liquid for forming a color correction filter layer for a white organic EL light source (composition) Ba-1.

| Composition of Liquid For Forming Color Correction Filter Layer for White Organic EL Light Source Ba-1 |
| --- |
| Resin 1 . . . 100 parts by mass |
| Coloring agent A . . . 0.348 parts by mass |
| Leveling agent 1 . . . 0.083 parts by mass |
| Matting agent 1 . . . 0.002 parts by mass |
| Ethyl acetate (solvent) . . . 574 parts by mass |

Subsequently, the obtained solution was filtered using filter paper (#63, manufactured by Toyo Roshi Kasha, Ltd.) having an absolute filtration accuracy of 10 μm, and further filtered using a metal sintered filter (FH025, manufactured by Pall Corporation) having an absolute filtration accuracy of 2.5 μm.
(Preparation of Color Correction Filter for White Organic EL Light Source with Substrate)
The above-mentioned forming liquid Ba-1 after the filtration treatment was applied onto the substrate 1 by using a bar coater so that the film thickness after drying was 5.0 μm, and dried at 100° C. to prepare a color correction filter 101 for a white organic EL light source with the substrate.

<Preparation of Color Correction Filters 102 to 111 and 201 to 206 for White Organic EL Light Source with Substrate>

Color correction filters 102 to 111 for a white organic EL light source with a substrate of the present invention and color correction filters 201 to 206 for a white organic EL light source with a substrate of Comparative Examples were obtained in the same manner as in the preparation of the color correction filter 101 for a white organic EL light source with the substrate except that the materials shown in the table below were used.

[Evaluation of Color Correction Filter for White Organic EL Light Source-1]

The moisture content of the color correction filters for a white organic EL light source with the substrate of the present invention and Comparative Examples was measured by the following method.

(Moisture Content)

The color correction filter for a white organic EL light source of the present invention was peeled off from the color correction filter for a white organic EL light source with the substrate, and the equilibrium moisture content of the color correction filter for a white organic EL light source was calculated by the following method.

The moisture content (% by mass) can be calculated by humidity-conditioning a sample for 24 hours or longer in an environment at a temperature of 25° C. and a humidity of 80%, then measuring a water content (g) by the Karl Fischer method with a moisture measuring instrument and a sample drying apparatus "CA-03" and "VA-05" (both manufactured by Mitsubishi Chemical Corporation).

(Light Resistance)

—Absorption Maximum Value of Color Correction Filter for White Organic EL Light Source—

The absorbance of the color correction filter for a white organic EL light source with the substrate in a wavelength range of 400 nm to 800 nm was measured every 1 nm using a UV3150 spectrophotometer manufactured by Shimadzu Corporation. A difference in absorbance between the absorbance of the color correction filter for a white organic EL light source with the substrate at each wavelength and the absorbance of the color correction filter for a white organic EL light source with the substrate, containing no coloring agent, (the matrix resin was the same) was calculated and the maximum value of this difference in absorbance was defined as the absorption maximum value.

—Light Resistance Evaluation—

The color correction filter for a white organic EL light source with the substrate was irradiated with light for 60 hours using a SUPER XENON WEATHER METER SX75 manufactured by Suga Test Instruments Co., Ltd. in an environment at a temperature of 60° C. and a relative humidity of 50%, and the absorption maximum value before and after the irradiation was measured to calculate light resistance by the following expression.

[Light resistance (%)]=([absorption maximum value after light irradiation for 200 hours]/[absorption maximum value before light irradiation])×100

The results are shown in the table below.

TABLE 1

| | Matrix resin | Coloring agent Type | Coloring agent Absorption maximum wavelength (nm) | Coloring agent Formulated amount [a] | Color correction filter Thickness (μm) | Color correction filter Moisture content (% by mass) | Light resistance (%) |
|---|---|---|---|---|---|---|---|
| Example 101 | Polystyrene | A | 594 | 0.348 | 5 | 0.1 | 76 |
| Example 102 | Polystyrene | B | 593 | 0.443 | 5 | 0.1 | 30 |
| Example 110 | Polystyrene | F | 498 | 0.130 | 5 | 0.1 | 86 |
| Comparative Example 201 | Polyester [b] | A | 594 | 0.348 | 5 | 1.0 | 60 |
| Comparative Example 202 | Polyester [b] | B | 593 | 0.443 | 5 | 1.0 | 63 |
| Comparative Example 206 | Polyester [b] | F | 498 | 0.130 | 5 | 1.0 | 69 |

[a] Parts by mass with respect to 100 parts of matrix resin
[b] VYLON 200 manufactured by TOYOBO CO., LTD.

As shown in Table 1, in a case where the moisture content of the color correction filter for a white organic EL light source was 1.0% by mass, the result that the light resistance was inferior was obtained (Comparative Examples 201, 202, and 206). It is found that the light resistance of the color correction filter for a white organic EL light source can be improved by reducing the moisture content to the range specified in the present invention (Examples 101, 102 and 110).

[Preparation of Organic EL Display Device]

The polarizing plate on the front side (viewer side) of a commercially available organic EL display device of a color filter method using a white organic EL light source (55EG9100 manufactured by LG Electronics) was peeled off. Through an SK 2057 pressure sensitive adhesive sheet (manufactured by Soken Chemical Co., Ltd.), the side opposite to the substrate film side of the color correction filter for a white organic EL light source with the substrate and the rear side of the peeled polarizing plate were laminated. Then, the substrate film was peeled off to obtain a polarizing plate with a color correction filter for a white organic EL light source. This polarizing plate with a color correction filter for a white organic EL light source was attached back to the organic EL display device through the SK2057 pressure sensitive adhesive sheet. Thus, an organic EL display device was prepared.

[Evaluation of Organic EL Display Device]
<Evaluation of Color Reproduction Range>

White, red, green, and blue were displayed on the entire screen of the prepared organic EL display device, and the brightness of white display and the chromaticity of each of red, green, and blue were measured by a spectroradiometer (SR-UL2 manufactured by Topcon Technohouse Corporation). The area of a portion in which a triangle formed by connecting the measured red, green, and blue chromaticity points on the xy chromaticity diagram of the CIE color system overlapped with a triangle formed by connecting the three primary color points of the BT. 2020 standard was obtained and the obtained area was divided by the area of the triangle formed by connecting the three primary color points of the BT. 2020 standard to calculate a coverage rate for the BT. 2020 standard. The results are shown in the table below.

The three primary color points of the BT. 2020 standard are as follows.
Red: x=0.708, y=0.292
Green: x=0.170, y=0.797
Blue: x=0.131, y=0.046

TABLE 2

| | Matrix resin | Coloring agent Type | Coloring agent Absorption maximum wavelength (nm) | Coloring agent Formulated amount [a] | Polarization degree improver Type | Polarization degree improver Formulated amount [a] | Antifading agent Type | Antifading agent Formulated amount [a] | Color correction filter Thickness (μm) | Color correction filter Moisture content (% by mass) | Color reproduction (BT. 2020 coverage rate) |
|---|---|---|---|---|---|---|---|---|---|---|---|
| Example 101 | Polystyrene | A | 594 | 0.348 | | | | | 5 | 0.1 | 76.3 |
| Example 102 | Polystyrene | B | 593 | 0.443 | | | | | 5 | 0.1 | 76.3 |
| Example 103 | Polystyrene | C | 593 | 0.389 | | | | | 5 | 0.1 | 76.3 |
| Example 104 | Polystyrene | D | 594 | 0.510 | | | | | 5 | 0.1 | 76.3 |
| Example 105 | Polystyrene | (3-69) | 591 | 0.275 | Ferrocene | 4.14 | IV-8 | 5.67 | 5 | 0.1 | 76.2 |
| Example 106 | Polystyrene | A | 594 | 0.174 | | | | | 10 | 0.1 | 76.3 |
| Example 107 | Polystyrene | A | 594 | 0.097 | | | | | 18 | 0.1 | 76.3 |
| Example 111 | Polystyrene | A | 594 | 0.348 | | | | | 5 | 0.1 | 76.6 |
| | | F | 498 | 0.130 | | | | | | | |
| Comparative Example 203 | Polystyrene | | | | | | | | 5 | 0.1 | 71.6 |
| Comparative Example 204 | Polystyrene | E | 533 | 0.478 | | | | | 5 | 0.1 | 65.0 |

[a] Parts by mass with respect to 100 parts of matrix resin

As shown in Table 2 above, it can be seen that the color reproducibility of the organic EL image display device is improved by using the color correction filter for a white organic EL light source of the present invention.

[Evaluation of Color Correction Filter for White Organic EL Light Source-2]

<Evaluation of Fluorescence Emission Suppression (Depolarization Suppression)>

(Preparation of Polarizing Plate)

—Surface Treatment of Color Correction Filter for White Organic EL Light Source—

The surface opposite to the substrate film in each of the color correction filters 101, 102, 105, 108, 109, and 205 for a white organic EL light source with the substrate was subjected to a corona treatment and the surface-treated color correction filters 101, 102, 105, 108, 109, and 205 for a white organic EL light source with the substrate were prepared.

—Preparation of Polarizer (Polarizing Layer)—

According to Example 1 of JP2001-141926A, a different in circumferential speed was given between two pairs of nip rolls and the film was stretched in the longitudinal direction to prepare a polarizing layer containing a polyvinyl alcohol resin and having a thickness of 12 μm.

—Preparation of Front-Side Polarizing Plate Protective Film (Outer Polarizing Plate Protective Film)—

(Preparation of Acrylic Resin)

In a reactor having an internal volume of 30 L equipped with a stirrer, a temperature sensor, a cooling pipe and a nitrogen introduction pipe, 8000 g of methyl methacrylate (MMA), 2000 g of methyl 2-(hydroxymethyl)acrylate (MHMA), and 10000 g of toluene as a polymerization solvent were placed, and the mixture was heated to 107° C. while nitrogen was being introduced thereto. At the beginning of reflux caused by the temperature rise. 10 g of t-amylperoxy isononanonate was added as a polymerization initiator, and at the same time, a solution containing 20 g of t-amylperoxy isononanoate and 100 g of toluene was added dropwise over 2 hours. In this manner, the mixture was subjected to solution polymerization under reflux at about 105° C. to 110° C., and further aged over 4 hours. The polymerization reaction rate was 95%, and the content (weight ratio) of MHMA in the obtained polymer was 20%.

Next, 10 g of a stearyl phosphate/distearyl phosphate mixture (Phoslex A-18, manufactured by Sakai Chemical Industry Co., Ltd.) was added to the obtained polymerization solution as a cyclization catalyst, and the polymer solution was subjected to cyclization condensation under reflux at about 80° C. to 100° C. for 5 hours.

Next, the polymer solution obtained in the above cyclization condensation was introduced to a bent type twin-screw extruder ((p=29.75 mm, L/D=30) of a barrel temperature of 260° C., a rotation speed of 100 rpm, a decompression degree of 13 to 400 hPa (10 to 300 mmHg), one rear bent, and four fore bents, at a treatment speed of 2.0 kg/time in terms of resin amount, and the polymer solution was subjected to cyclization condensation reaction and devolatilization in the extruder. Next, after the devolatilization was completed, the resin in the hot melt state left in the extruder was discharged from the distal end of the extruder and pelletized by a pelletizer to obtain a (meth)acrylic resin A. The acrylic resin A has a lactone ring structure. This resin had a weight-average molecular weight of 110000 and a glass transition temperature of 125° C.

(Preparation of Outer Polarizing Plate Protective Film)

100 parts by mass of the (meth)acrylic resin A and 10 parts by mass of the rubber elastic body C-1 were supplied to a twin-screw extruder and melt-extruded into a sheet at about 280° C. to prepare a long outer polarizing plate protective film having a thickness of 40 μm. As the rubber elastic body C-1, KANE ACE M-210 (manufactured by Kaneka Corporation) was used.

(Lamination)

A polarizing layer and the surface-treated color correction filter for a white organic EL light source with the substrate were laminated by a roll-to-roll process using a 3% by mass aqueous solution of polyvinyl alcohol (PVA-117H, manufactured by Kuraray Co., Ltd.) such that the surface of the filter subjected to the corona treatment was arranged on the polarizing layer and the absorption axis of the polarizing layer and the longitudinal direction of the surface-treated color correction filter for a white organic EL light source with the substrate were parallel to each other.

Next, an adhesive M having the following composition was applied to the outer polarizing plate protective film using a micro gravure coater (gravure roll: #300, rotation speed: 140%/line speed) to a thickness of 5 μm, and an outer polarizing plate protective film with the adhesive was prepared. Next, the outer polarizing plate protective film with the adhesive and the polarizing layer were laminated such that the surface of the outer polarizing plate protective film with the adhesive onto which the adhesive was applied, and the surface of the polarizing layer without the correction filter for a white organic EL light source with the substrate were bonded, and the laminate was irradiated with ultraviolet rays from the side of the color correction filter for a light source with the substrate to prepare a polarizing plate. The line speed was 20 m/min, and the integrated amount of ultraviolet rays was 300 mJ/cm². Here, the polarizer and the polarizing plate protective film were arranged such that the transmission axis of the polarizer and the transport direction of the outer polarizing plate protective film were orthogonal to each other.

| -Composition of Adhesive M- |
|---|
| 2-hydroxyethyl acrylate . . . 100 parts by mass |
| Tolylene diisocyanate . . . 10 parts by mass |
| Photopolymerization initiator (IRGACURE 907, manufactured by BASF SE) . . . 3 parts by mass |

After drying the polarizing plate at 70° C., polyethylene terephthalate, which is the substrate film of the color correction filter for a white organic EL light source with the substrate, was continuously peeled off using a device similar to a peeling device of a separator having a peeling roller, and a commercially available acrylate-based pressure sensitive adhesive was applied to the peeled surface to prepare a polarizing plate.

The degree of polarization of the obtained polarizing plate (5 cm×5 cm) was measured. The polarizing plate was attached through a pressure sensitive adhesive such that the color correction filters 101, 102, 105, 108, 109, and 205 for a white organic EL light source were arranged on the glass side. Each sample was set in an automatic polarizing film measuring device VAP-7070 manufactured by JASCO Corporation with the glass side facing the light source, and the orthogonal transmittance and parallel transmittance in a wavelength range of 380 nm to 700 nm were measured. The degree of polarization is calculated by calculating the polarization degree spectrum from the measured values of the orthogonal transmittance and the parallel transmittance by the following expression, and further calculating a weighting average of the light source (auxiliary illuminant C) and CIE visibility (Y). The results are shown in the table below.

Degree of polarization (%)=[(parallel transmittance−orthogonal transmittance)/(orthogonal transmittance+parallel transmittance)]$^{1/2}$×100

Relational Expression [C] exhibited a high degree of polarization compared to the color correction filter 205 for a white organic EL light source of Comparative Example.

Although the present invention has been described with reference to the embodiments, it is our intention that the

TABLE 3

|  | Matrix resin | | Coloring agent | | | Polarization degree improver | |
|---|---|---|---|---|---|---|---|
|  | | | | Absorption maximum | | | |
|  | Type | fd value | Type | wavelength (nm) | Formulated amount [a] | Type | Formulated amount [a] |
| Example 101 | Polystyrene | 0.86 | A | 594 | 0.348 | | |
| Example 102 | Polystyrene | 0.86 | B | 593 | 0.443 | | |
| Example 105 | Polystyrene | 0.86 | (3-69) | 591 | 0.775 | Ferrocene | 4.14 |
| Example 108 | Polystyrene | 0.86 | (3-69) | 591 | 0.775 | Electron accepting type quencher B | 3.11 |
| Example 109 | Polystyrene | 0.86 | (3-69) | 591 | 0.275 | | |
| Comparative Example 205 | Polymethyl methacrylate [b] | 0.70 | (3-69) | 591 | 0.775 | | |

|  | Polarization degree improver | | Antifading agent | | Color correction filter | | |
|---|---|---|---|---|---|---|---|
|  | | | | | | Moisture content | Degree of |
|  | $E_{Ld} - E_{Lq}$ | $E_{Hq} - E_{Hd}$ | Type | Formulated amount [a] | Thickness (μm) | (% by mass) | polarization (%) |
| Example 101 | | −0.52 | | | 5 | 0.1 | 99.99 |
| Example 102 | | −0.55 | | | 5 | 0.1 | 99.99 |
| Example 105 | | 0.00 | IV-8 | 5.67 | 5 | 0.1 | 99.95 |
| Example 108 | −0.74 | | IV-8 | 5.67 | 5 | 0.1 | 99.95 |
| Example 109 | | | | | 5 | 0.1 | 99.82 |
| Comparative Example 205 | | | | | 5 | 1.6 | 99.40 |

[a] Parts by mass with respect to 100 parts of matrix resin
[b] DIANAL BR 80 manufactured by Mitsubishi Rayon Co., Ltd.

From the results in Table 3, in the color correction filters for a white organic EL light source of Examples 105 and 108 in which the electron donating type quencher satisfying Relational Expression [A-1] or the electron accepting type quencher satisfying Relational Expression [B-1] was added, a higher degree of polarization was realized compared to the color correction filter 109 for a white organic EL light source not containing a polarization degree improver. This is because the depolarization was suppressed as a result of suppressing the fluorescence emission of the coloring agent.

Further, in a case where the color correction filters for a white organic EL light source of Examples 101 and 102 in which the polarization degree improver is bonded to the coloring agent are used, it is found that the degree of polarization is further increased, and the fluorescence emission of the coloring agent is further suppressed.

In addition, all of the color correction filters 101, 102, 105, 108 and 109 for a white organic EL light source of the present invention using the resin whose fd value satisfied present invention not be limited by any of the details of the description, unless otherwise specified, but rather be construed broadly within its spirit and scope as set out in the accompanying claims.

What is claimed is:
1. A color correction filter for a white organic electroluminescent light source, the color correction filter comprising:
   a resin; and
   0.1 parts by mass or more of a squaraine-based coloring agent represented by Formula (1) and having an absorption maximum wavelength in a range of 560 to 620 nm or 460 to 520 nm with respect to 100 parts by mass of the resin,
   wherein the coloring agent is in a form of a coloring agent containing a polarization degree improver having a coloring agent portion and a polarization degree improver portion;

wherein the polarization degree improver portion is selected from an electron donating type quencher portion or an electron accepting type quencher portion;

wherein an energy level of a HOMO of the coloring agent portion and an energy level of a HOMO of the electron donating type quencher portion satisfy Relational Expression [A-1] below, $E_{Hq} - E_{Hd} \leq 0.40$ eV,        Relational Expression [A-1]:

where $E_{Hd}$ and $E_{Hq}$ respectively represent the following values, $E_{Hd}$: energy level of HOMO of coloring agent portion, and $E_{Hq}$: energy level of HOMO of electron donating type quencher portion;

wherein an energy level of a LUMO of the coloring agent portion and an energy level of a LUMO of the electron accepting type quencher portion satisfy Relational Expression [B-1] below, $E_{Ld} - E_{Lq} \leq 0$ eV,        Relational Expression [B-1]:

where $E_{Ld}$ and $E_{Lq}$ respectively represent the following values, $E_{Ld}$: energy level of LUMO of coloring agent portion, and $E_{Lq}$: energy level of LUMO of electron accepting type quencher portion; and wherein the filter has a moisture content of 0.5% by mass or less, Formula (1)

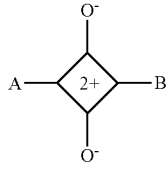

in Formula (1), A and B each independently represent an aryl group which may have a substituent, a heterocyclic group which may have a substituent, or —CH=G, and G represents a heterocyclic group which may have a substituent.

2. The color correction filter for a white organic electroluminescent light source according to claim 1, wherein the resin satisfies Relational Expression [C] below, $0.80 \leq fd \leq 0.95$        Relational Expression [C]:

where the fd value is defined by Relational Expression I below, $fd = \delta d/(\delta d + \delta p + \delta h)$,        Relational Expression I:

in Relational Expression I, δd, δp, and δh respectively indicate a term corresponding to a London dispersion force, a term corresponding to a dipole-dipole force, and a term corresponding to a hydrogen bonding force with respect to a solubility parameter δt calculated by a Hoy method.

3. The color correction filter for a white organic electroluminescent light source according to claim 1, wherein the resin contains a polystyrene resin.

4. The color correction filter for a white organic electroluminescent light source according to claim 1, wherein the resin contains a cyclic polyolefin resin.

5. An organic electroluminescent display device comprising:

the color correction filter for a white organic electroluminescent light source according to claim 1.

* * * * *